(12) United States Patent
Kim et al.

(10) Patent No.: US 10,903,404 B2
(45) Date of Patent: Jan. 26, 2021

(54) SEMICONDUCTOR DEVICE

(71) Applicant: LG INNOTEK CO., LTD., Seoul (KR)

(72) Inventors: Seung Hwan Kim, Seoul (KR); Won Ho Kim, Seoul (KR); Chong Cook Kim, Seoul (KR); Deok Won Seo, Seoul (KR); Yeo Jae Yoon, Seoul (KR); Kwang Ki Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 18 days.

(21) Appl. No.: 16/473,593

(22) PCT Filed: Dec. 26, 2017

(86) PCT No.: PCT/KR2017/015438
§ 371 (c)(1),
(2) Date: Jun. 25, 2019

(87) PCT Pub. No.: WO2018/124677
PCT Pub. Date: Jul. 5, 2018

(65) Prior Publication Data
US 2020/0144464 A1    May 7, 2020

(30) Foreign Application Priority Data

Dec. 26, 2016   (KR) .......................... 10-2016-0179531
Dec. 26, 2016   (KR) .......................... 10-2016-0179532
(Continued)

(51) Int. Cl.
*H01L 33/58* (2010.01)
*H01L 33/10* (2010.01)
(Continued)

(52) U.S. Cl.
CPC .............. *H01L 33/58* (2013.01); *H01L 33/10* (2013.01); *H01L 33/32* (2013.01); *H01L 33/387* (2013.01); *H01L 33/46* (2013.01)

(58) Field of Classification Search
CPC ......... H01L 33/58; H01L 33/10; H01L 33/46; H01L 33/387; H01L 27/15; G08C 23/04
See application file for complete search history.

(56) References Cited

U.S. PATENT DOCUMENTS

| 2005/0128557 A1 | 6/2005 | Kim et al. |
| 2006/0140236 A1 | 6/2006 | Takayama |

(Continued)

FOREIGN PATENT DOCUMENTS

| JP | 10-228005 A | 8/1998 |
| JP | 2005-43722 A | 2/2005 |

(Continued)

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

An embodiment discloses a semiconductor device comprising: a semiconductor structure comprising a first conductive semiconductor layer, a second conductive semiconductor layer, and an active layer disposed between the first conductive semiconductor layer and the second conductive semiconductor layer; a first electrode disposed on the first conductive semiconductor layer; a 2-1 electrode disposed on the second conductive semiconductor layer; and a 2-2 electrode disposed on the second conductive semiconductor layer and spaced apart from the 2-1 electrode, wherein the thickness of a part of the second conductive semiconductor layer between the 2-1 electrode and the 2-2 electrode is smaller than the thickness of the second conductive semiconductor layer vertically overlapping with the 2-1 electrode and the 2-2 electrode; the 2-2 electrode is opposite to the 2-1 electrode and comprises a first region that is closest to the 2-1 electrode; the 2-1 electrode is opposite to the 2-2 electrode and comprises a second region that is closest to the 2-2 electrode; and the relationship between the width (W1)

(Continued)

of the first region and the width (W2) of the second region is W1≥W2.

20 Claims, 29 Drawing Sheets

(30) Foreign Application Priority Data

Jan. 5, 2017 (KR) ........................ 10-2017-0001903
Jan. 5, 2017 (KR) ........................ 10-2017-0001905

(51) Int. Cl.
$H01L\ 33/32$ (2010.01)
$H01L\ 33/38$ (2010.01)
$H01L\ 33/46$ (2010.01)
$H01L\ 33/06$ (2010.01)
$H01L\ 33/20$ (2010.01)
$H01L\ 27/15$ (2006.01)
$G08C\ 23/04$ (2006.01)

(56) References Cited

U.S. PATENT DOCUMENTS

2010/0327257 A1* 12/2010 Yamamoto ................ H01S 5/12
 257/13
2015/0295126 A1* 10/2015 Suga ........................ H01L 33/14
 356/479
2016/0216446 A1 7/2016 Kang et al.

FOREIGN PATENT DOCUMENTS

JP         2006-186090 A    7/2006
KR    10-2005-0060305 A    6/2005
KR    10-2016-0092855 A    8/2016

* cited by examiner

[FIG. 1]
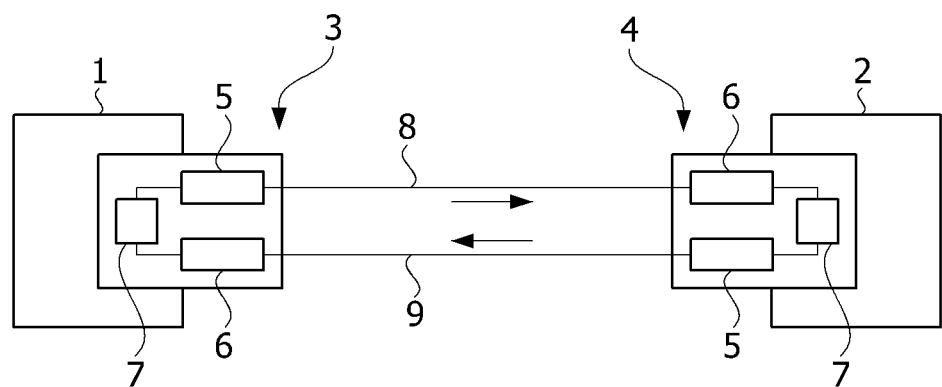
[FIG. 2]
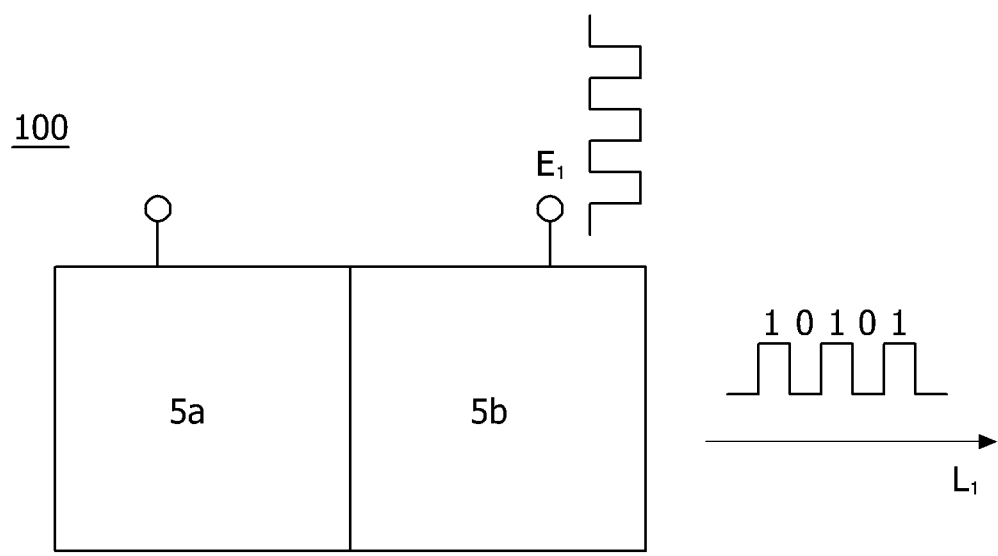

[FIG. 3]
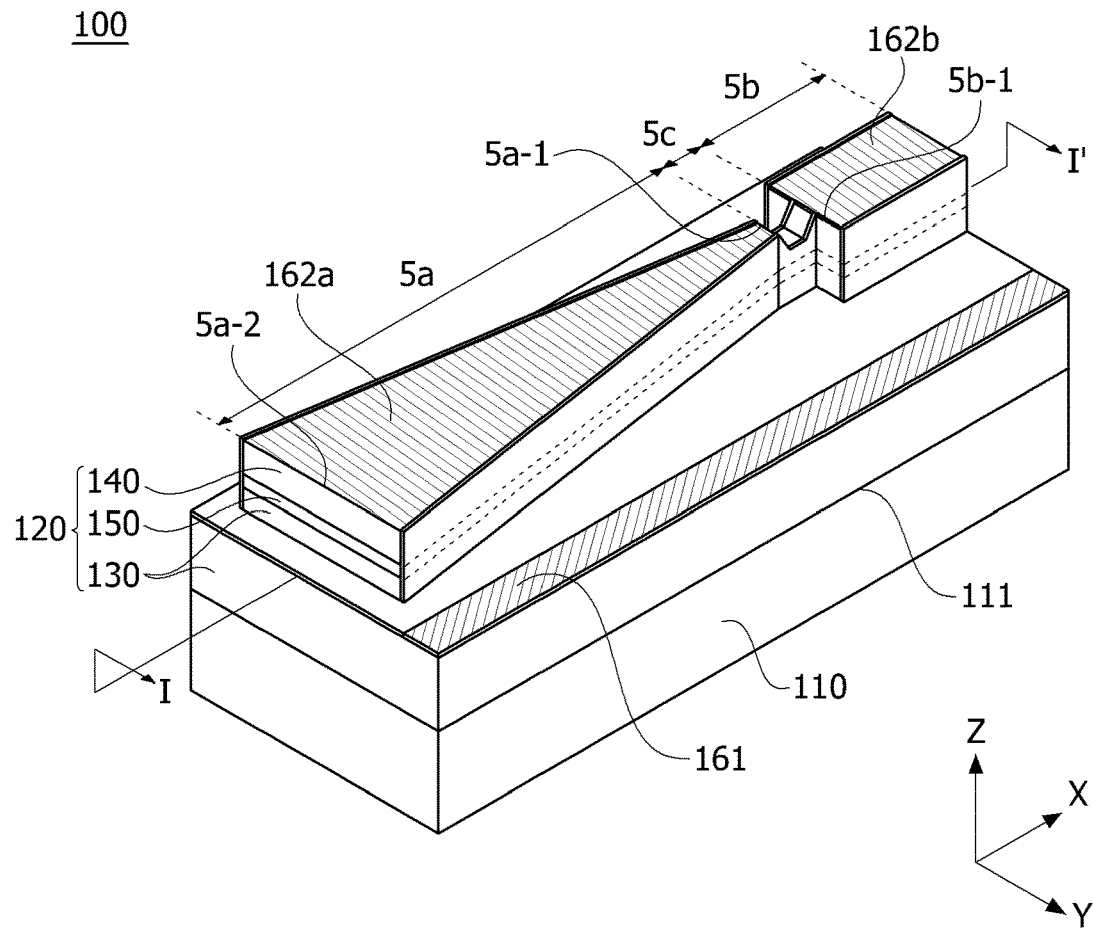
[FIG. 4]
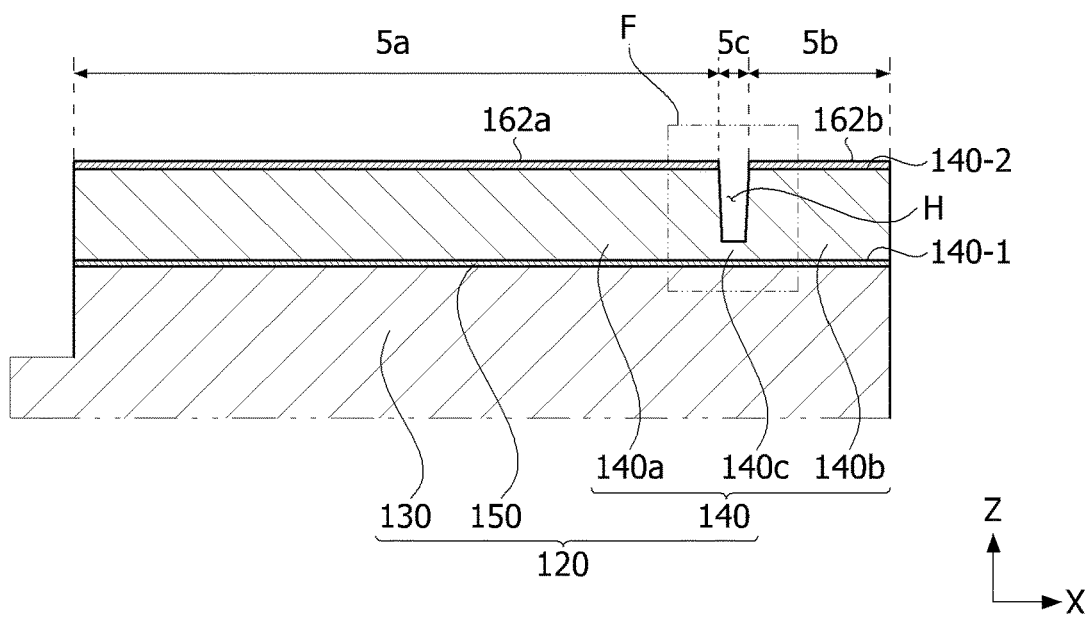

[FIG. 5]
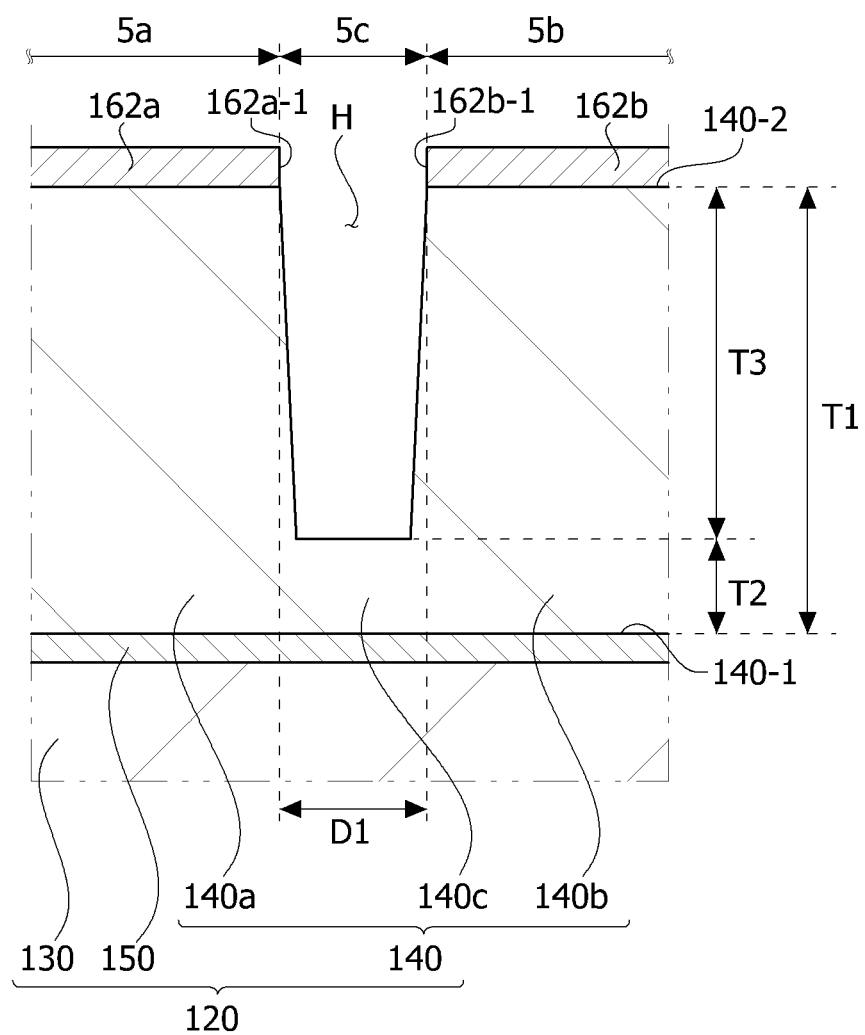

[FIG. 6A]
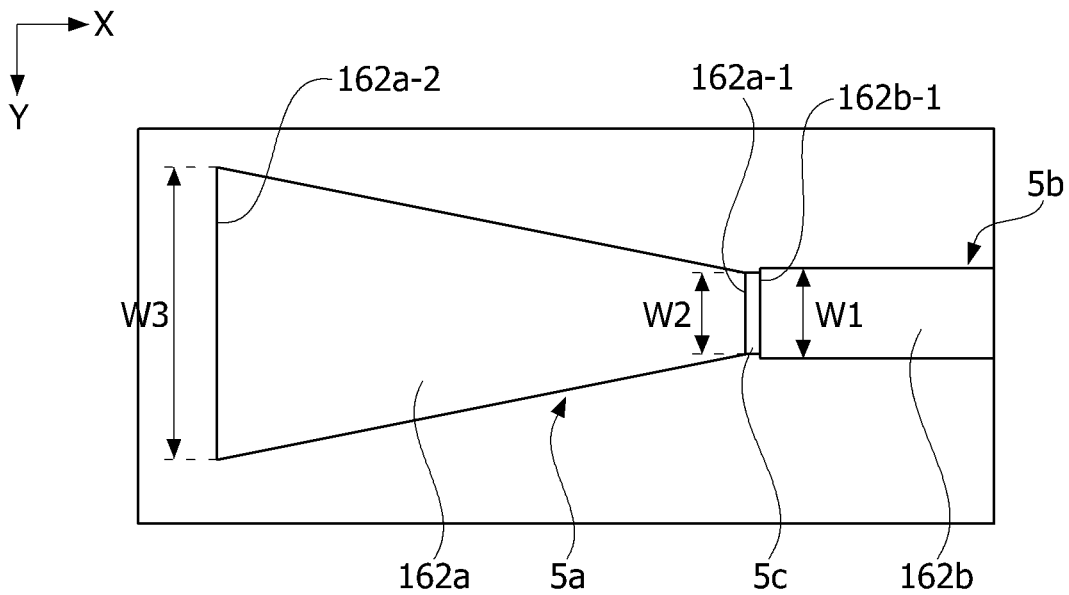
[FIG. 6B]
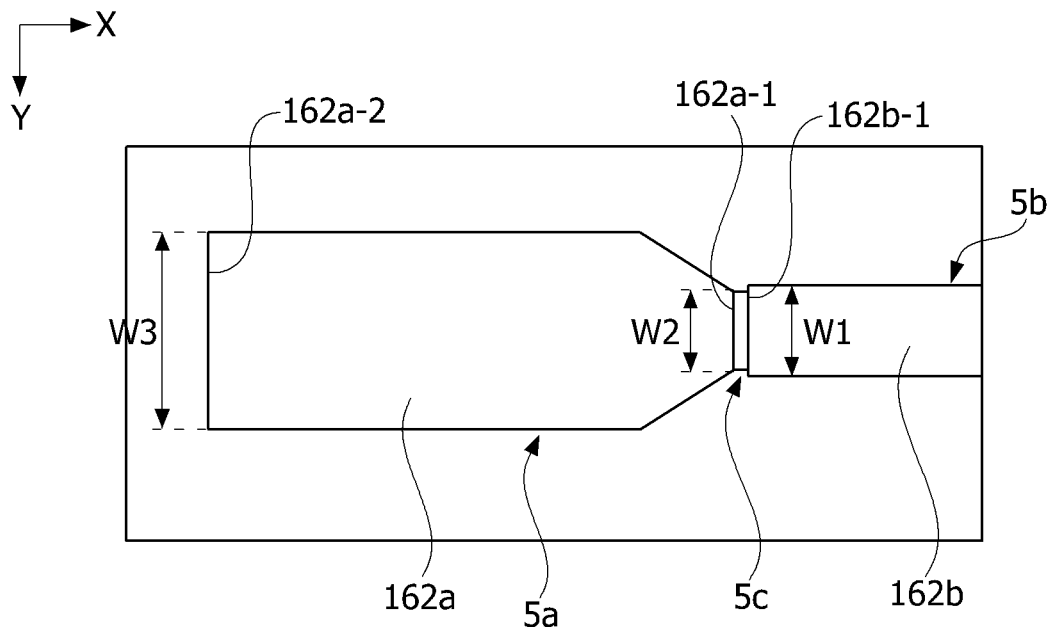

[FIG. 6C]
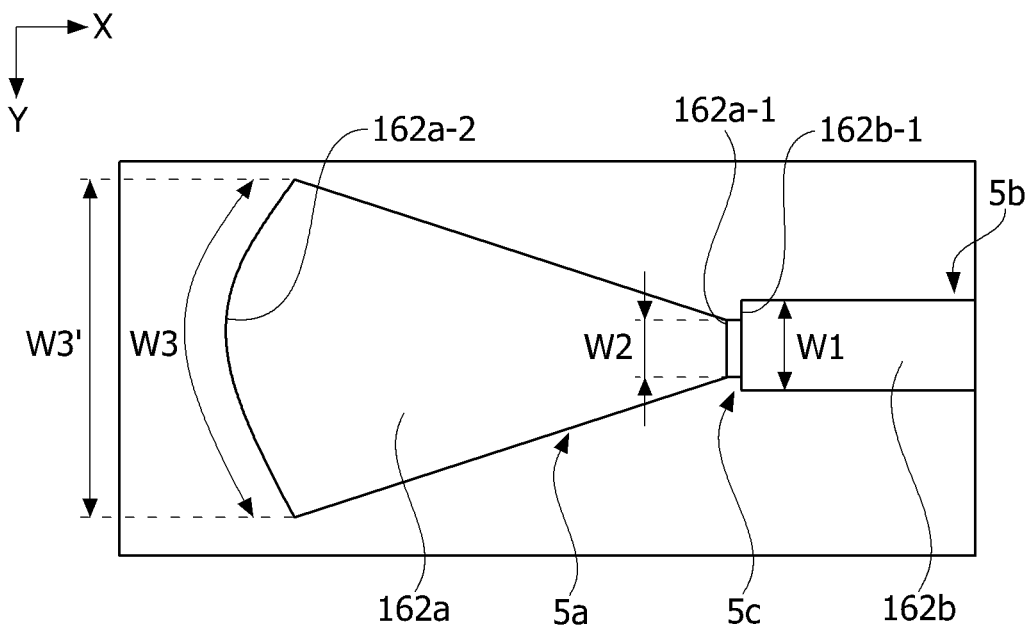

[FIG. 7]
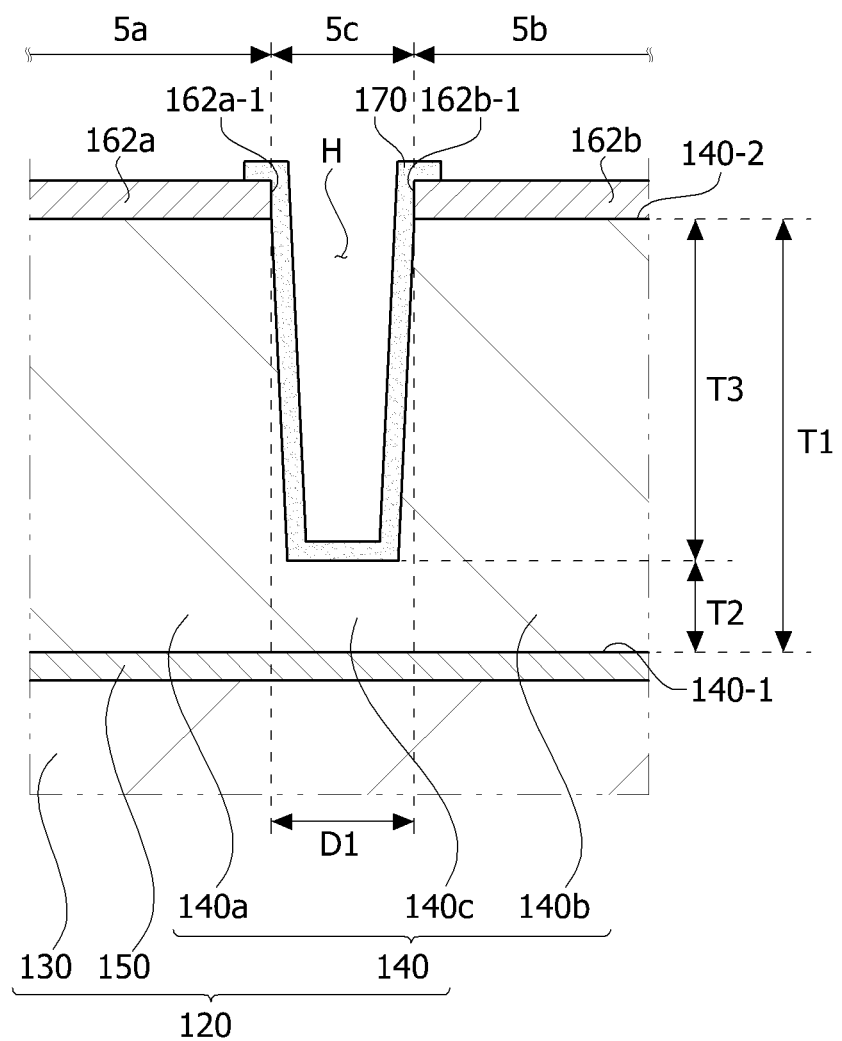

[FIG. 8]
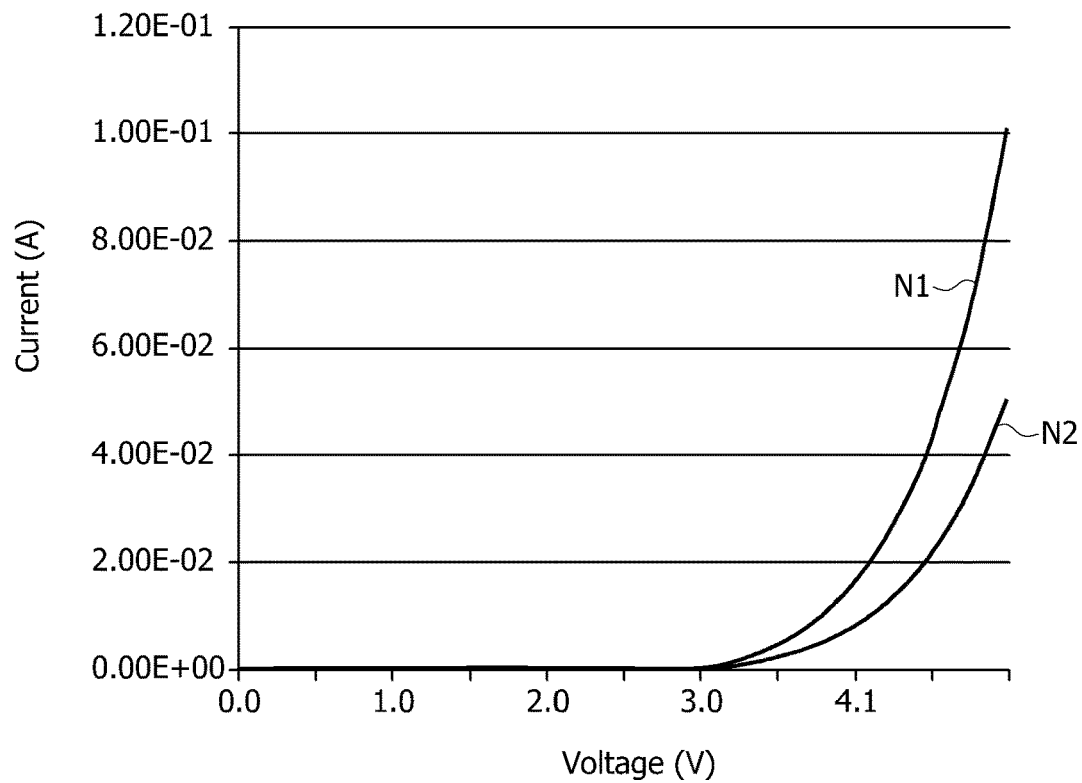
[FIG. 9]
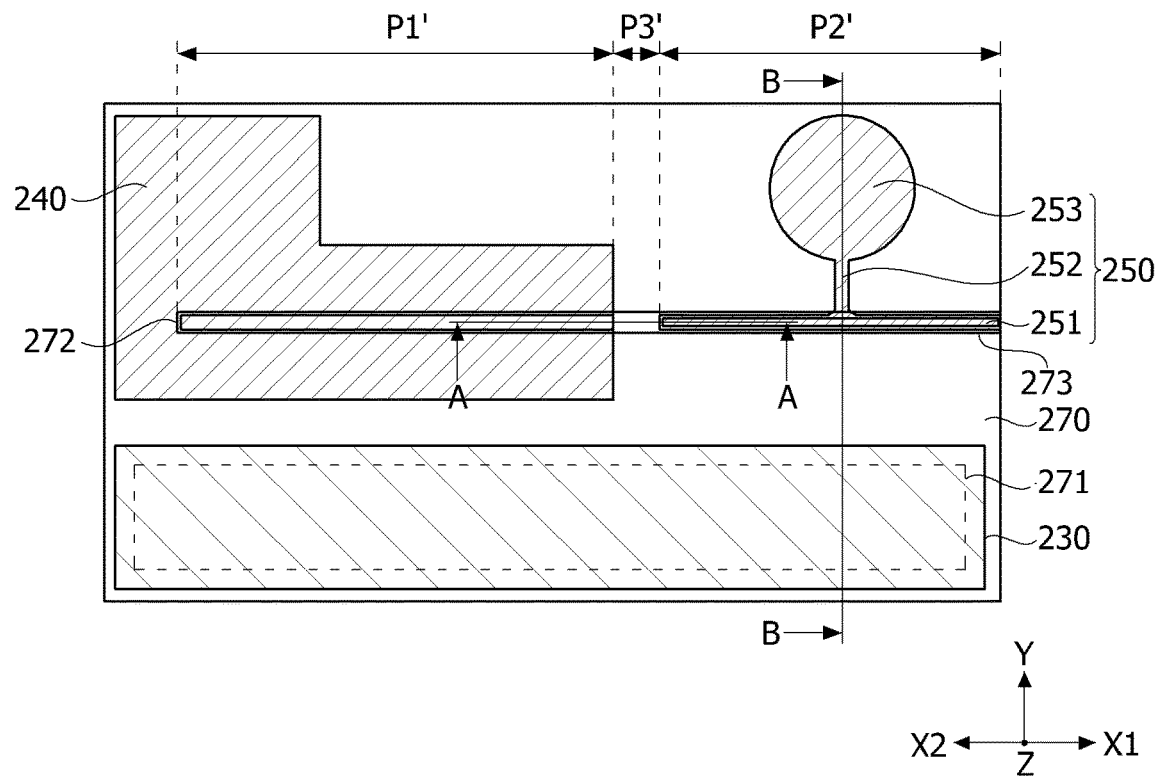

[FIG. 10]
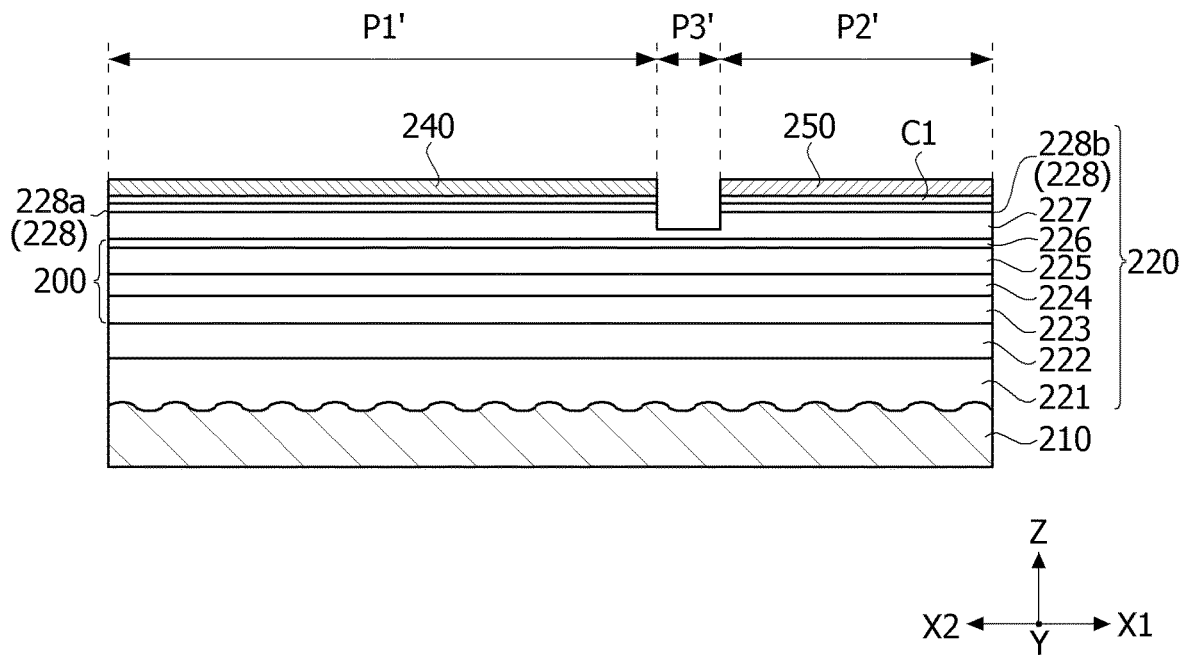
[FIG. 11]
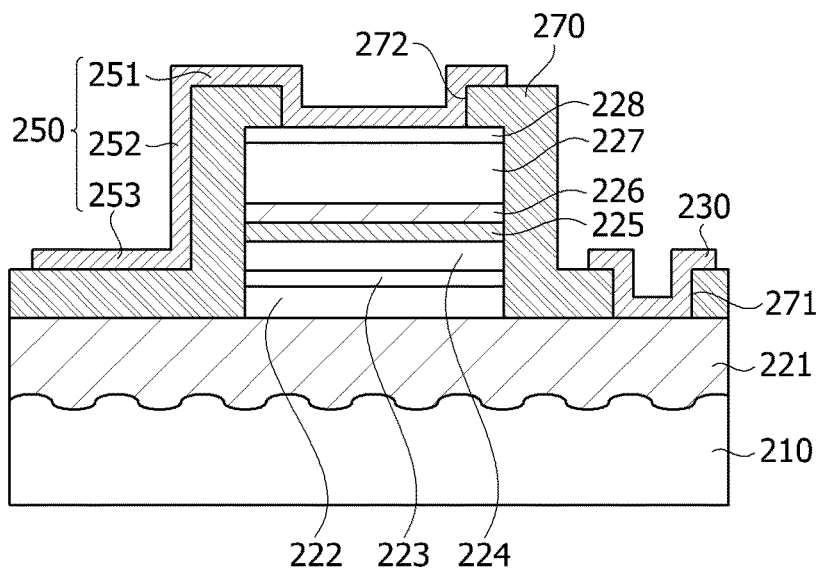

[FIG. 12]
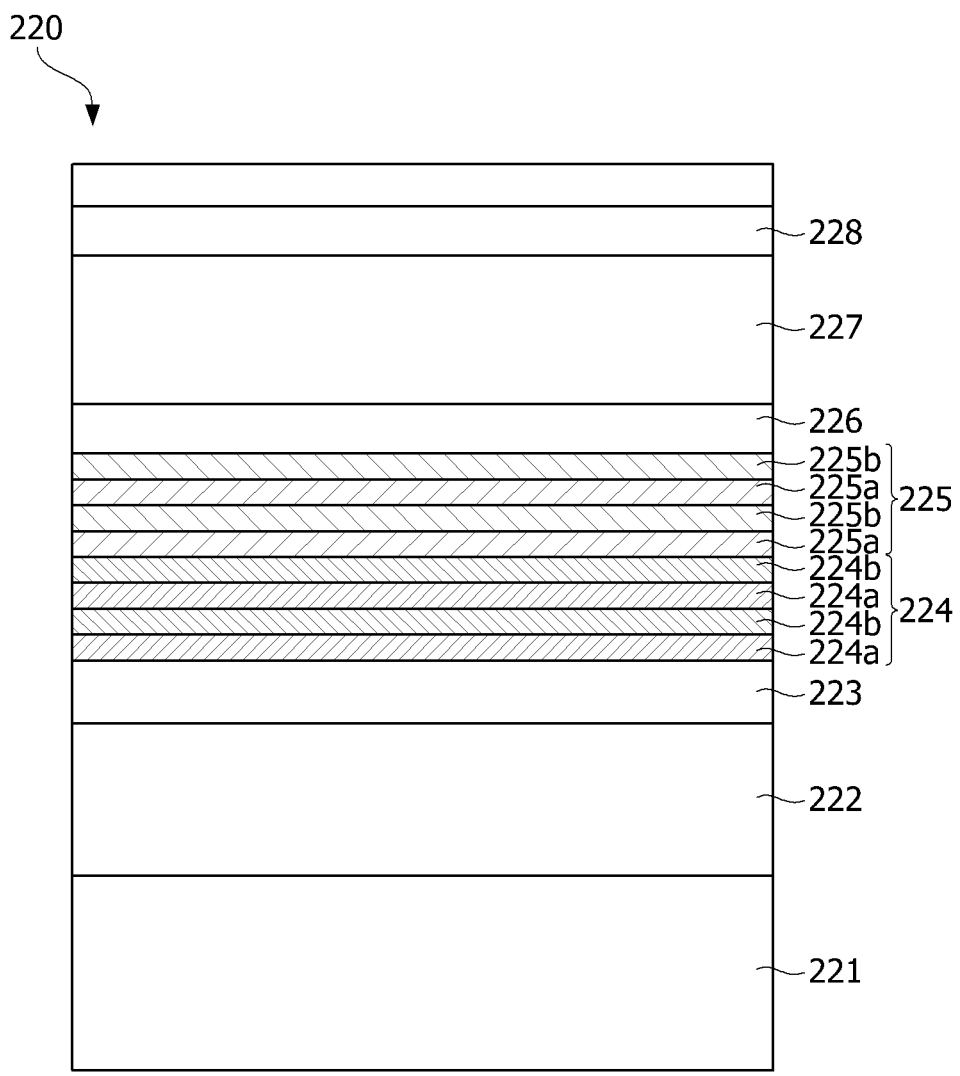

[FIG. 13]
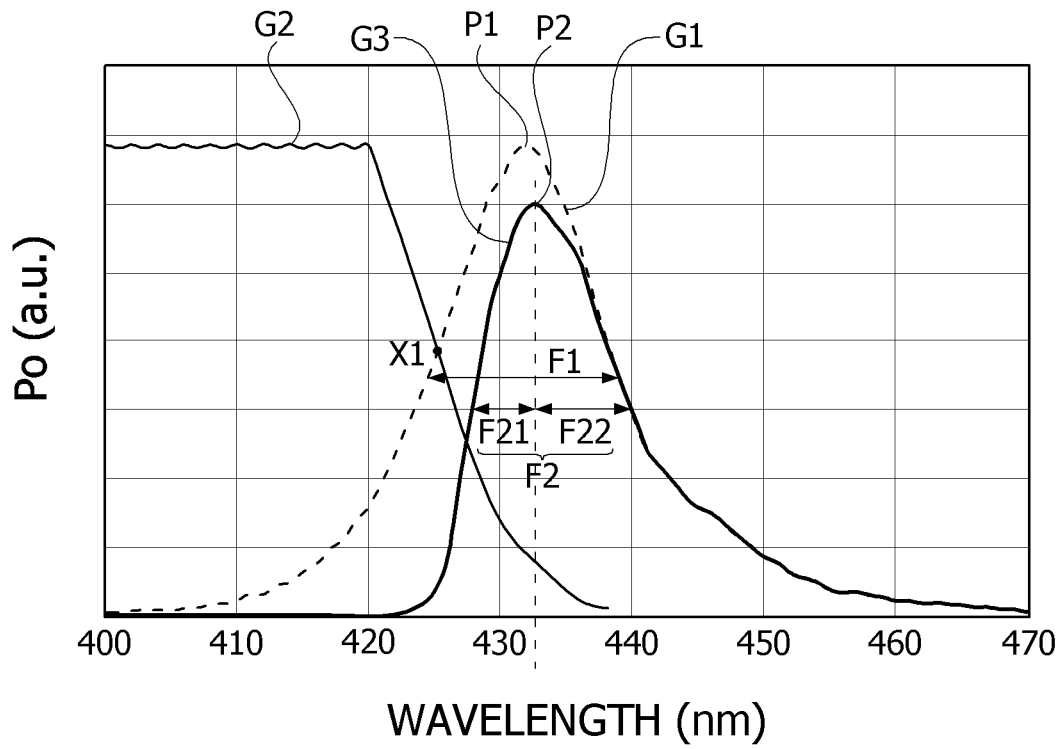
[FIG. 14]
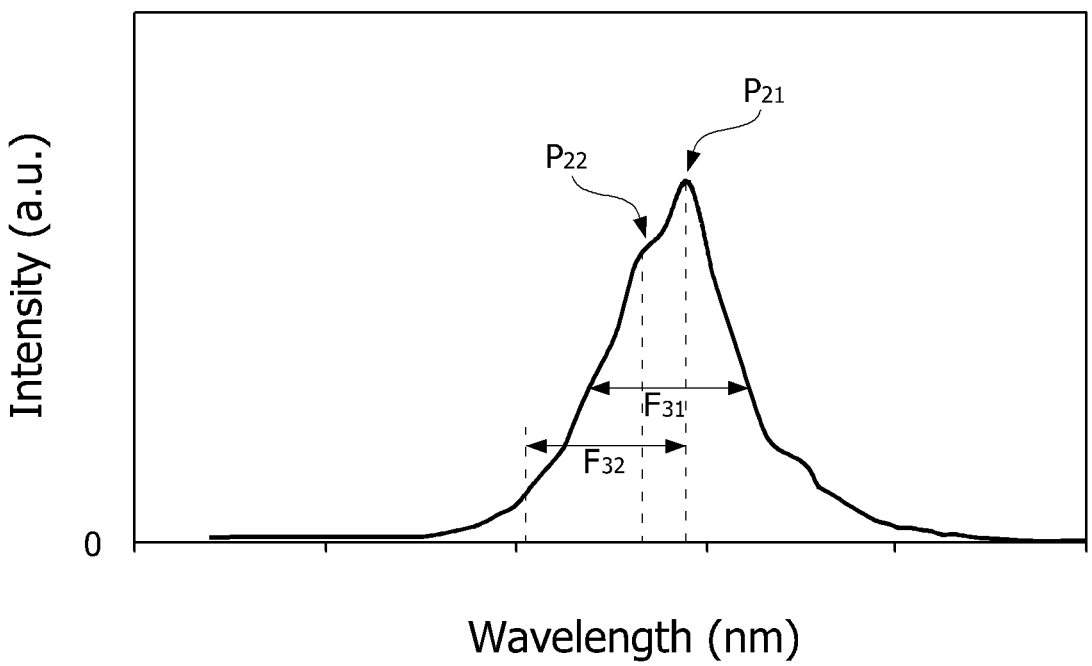

[FIG. 15]
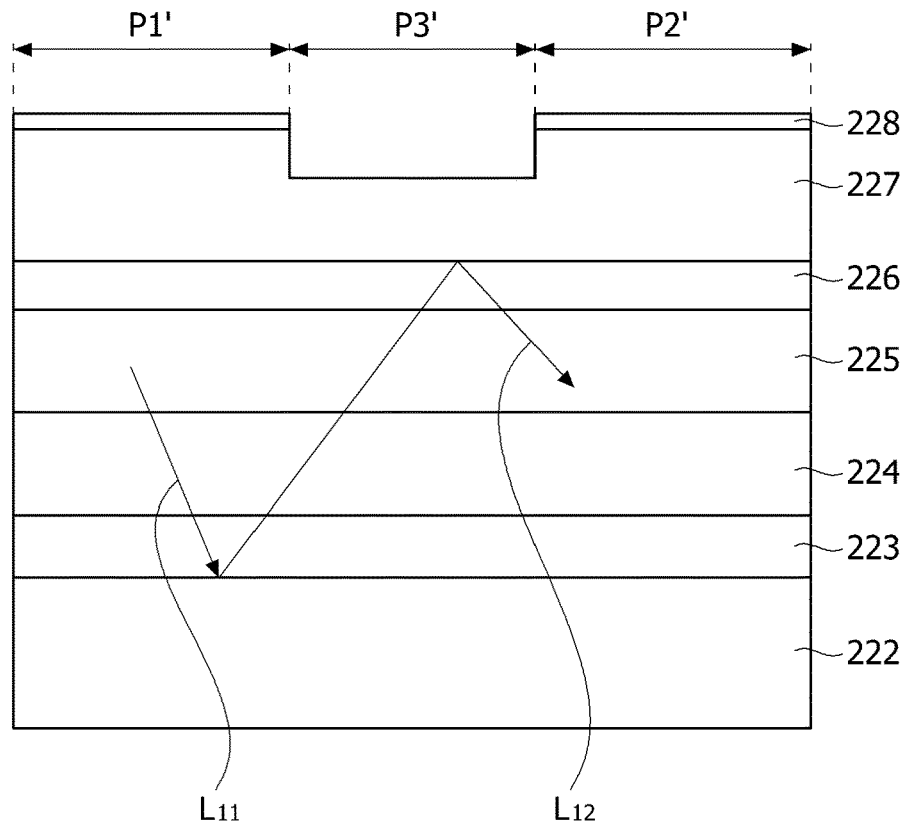
[FIG. 16]
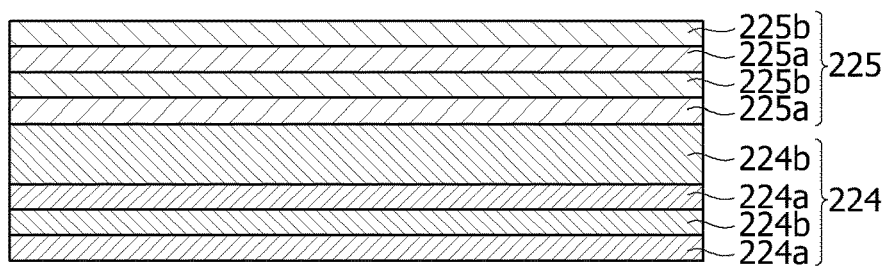
[FIG. 17A]
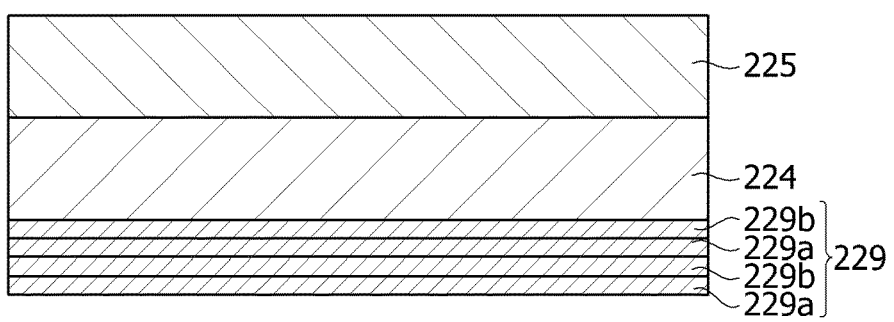

[FIG. 17B]
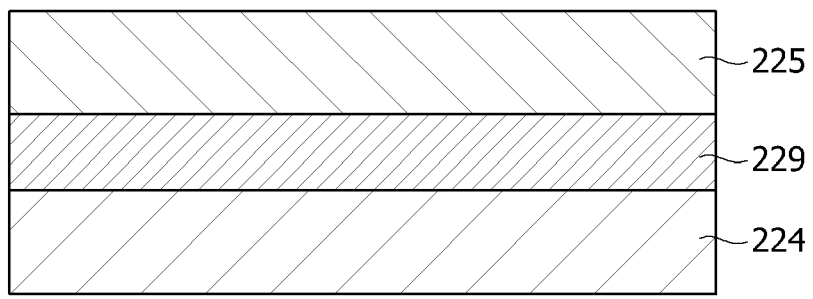
[FIG. 17C]
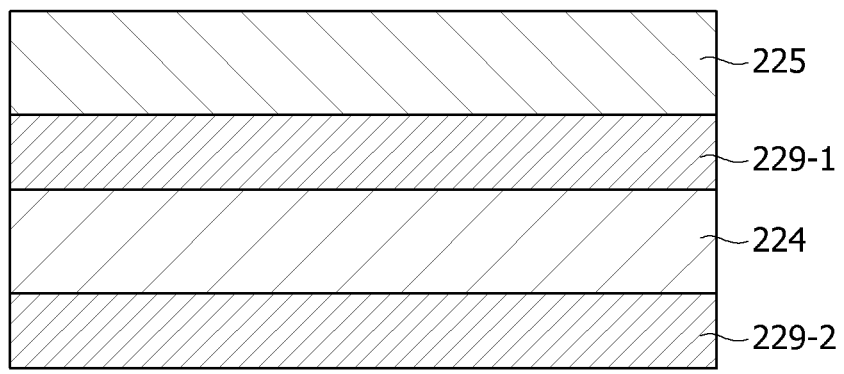

[FIG. 18]
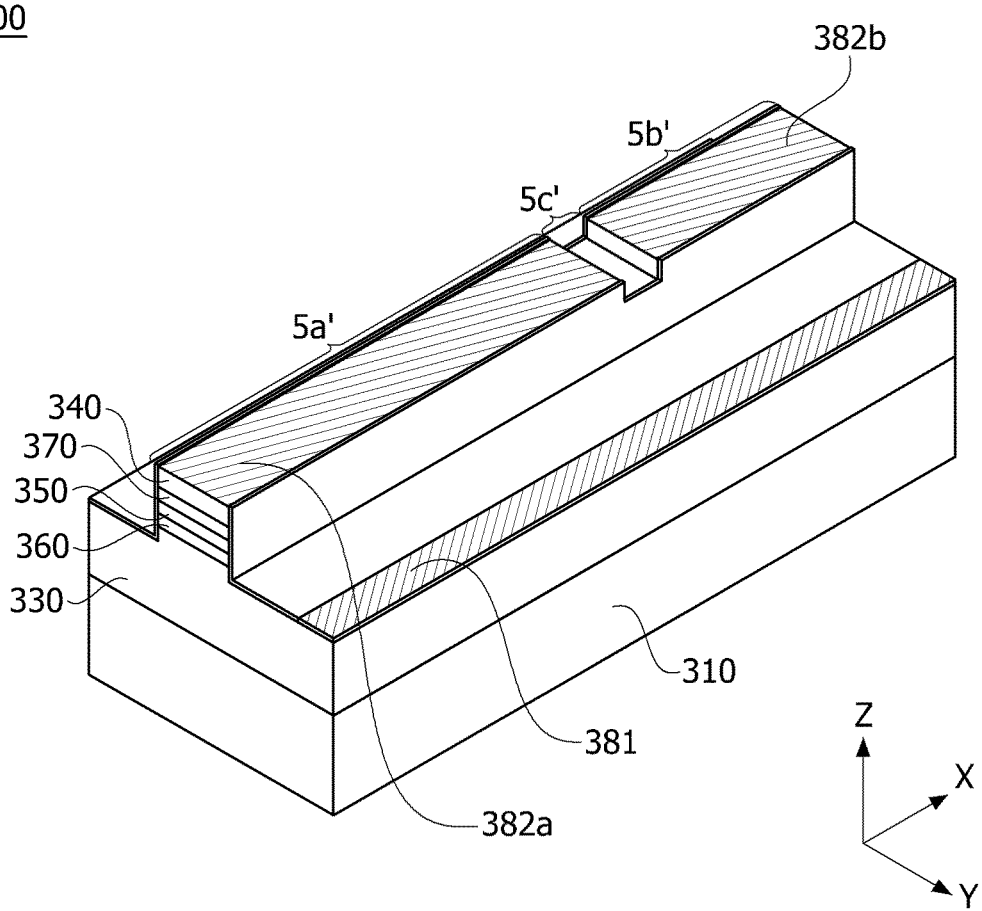
[FIG. 19]
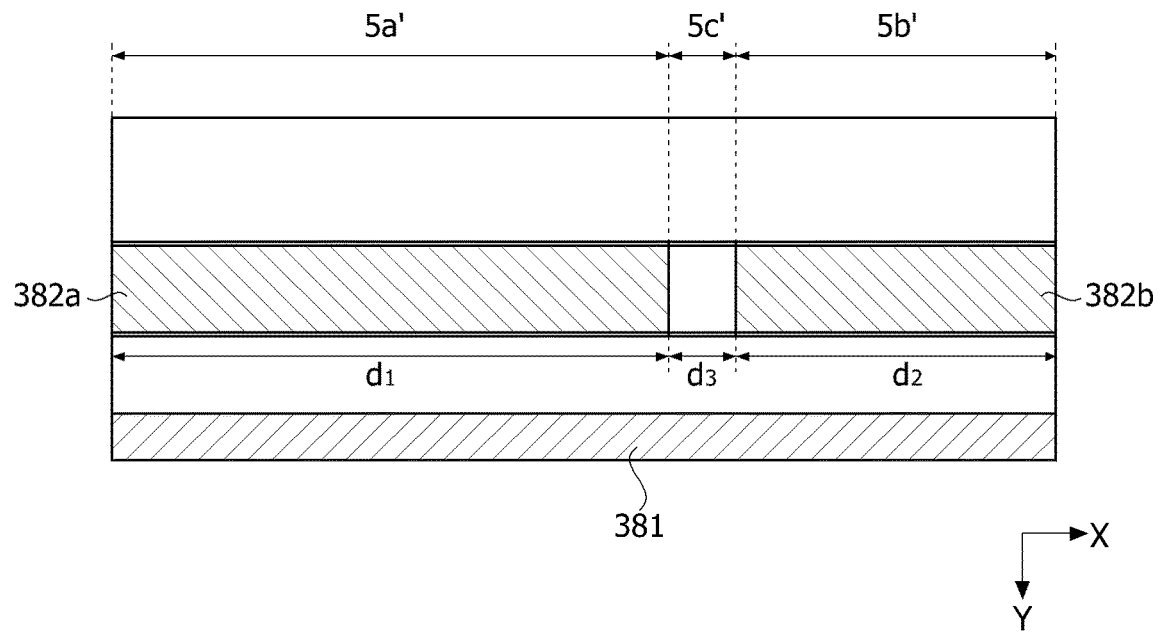

[FIG. 20]
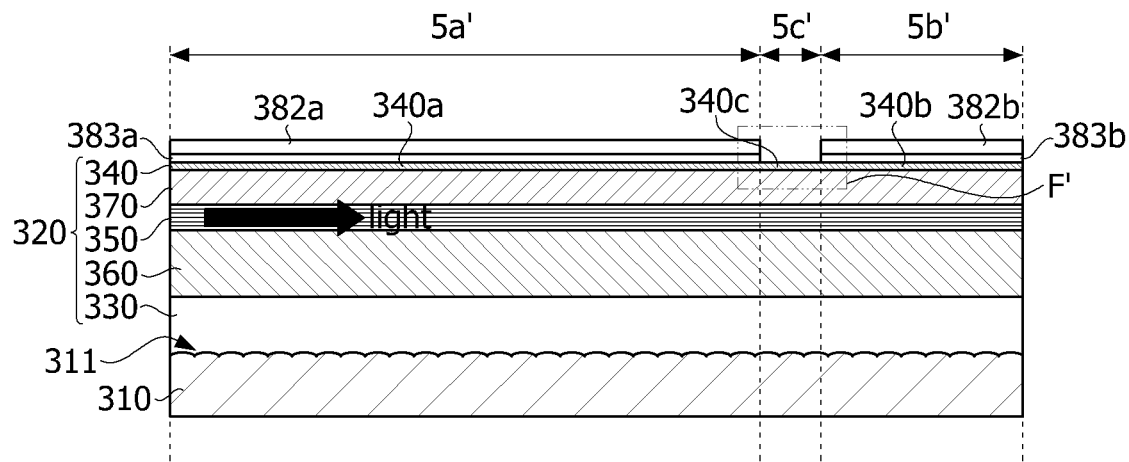
[FIG. 21]
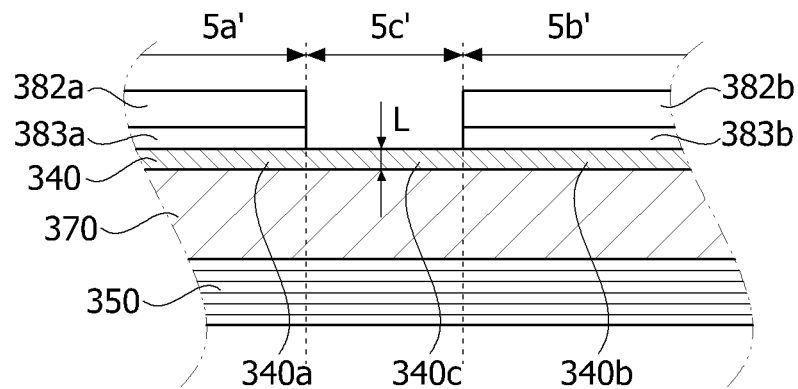

[FIG. 22]
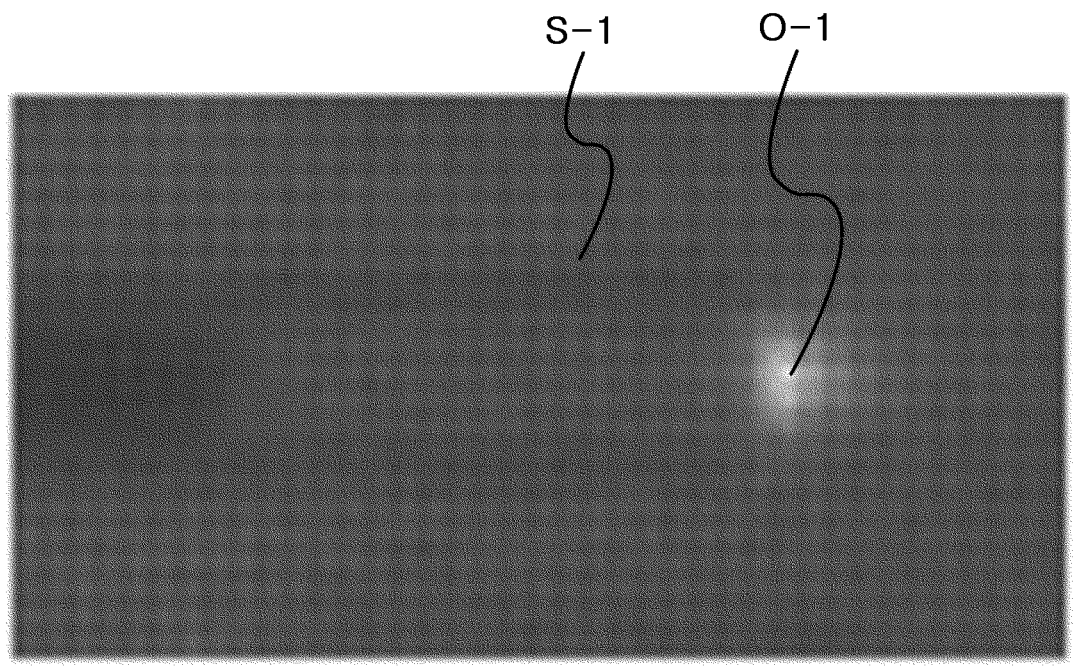
(a)
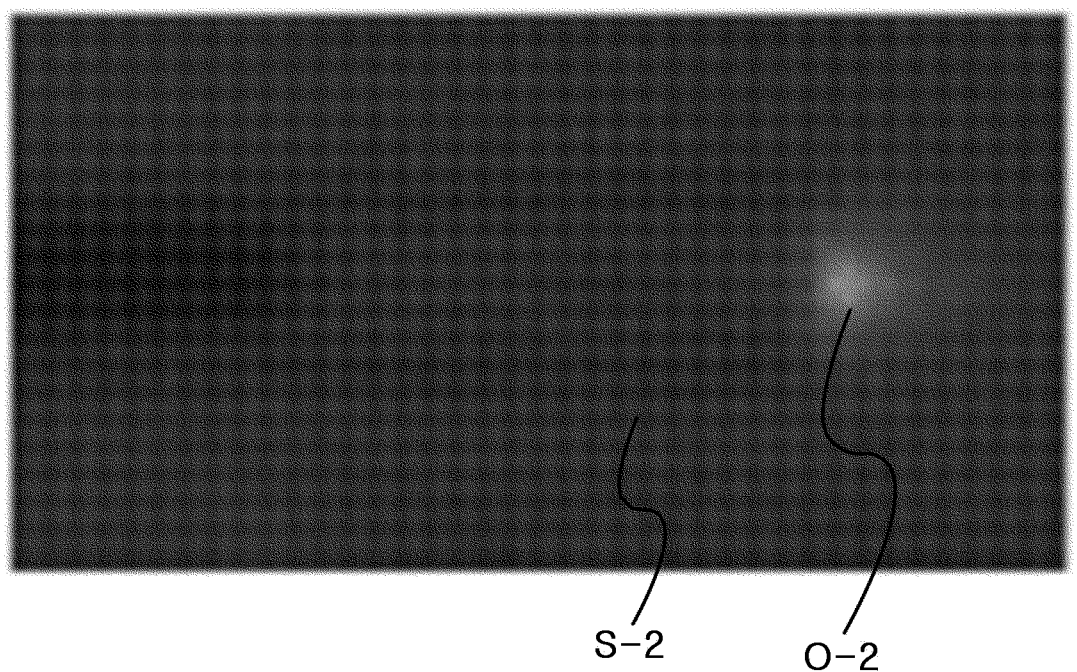
(b)

[FIG. 23]
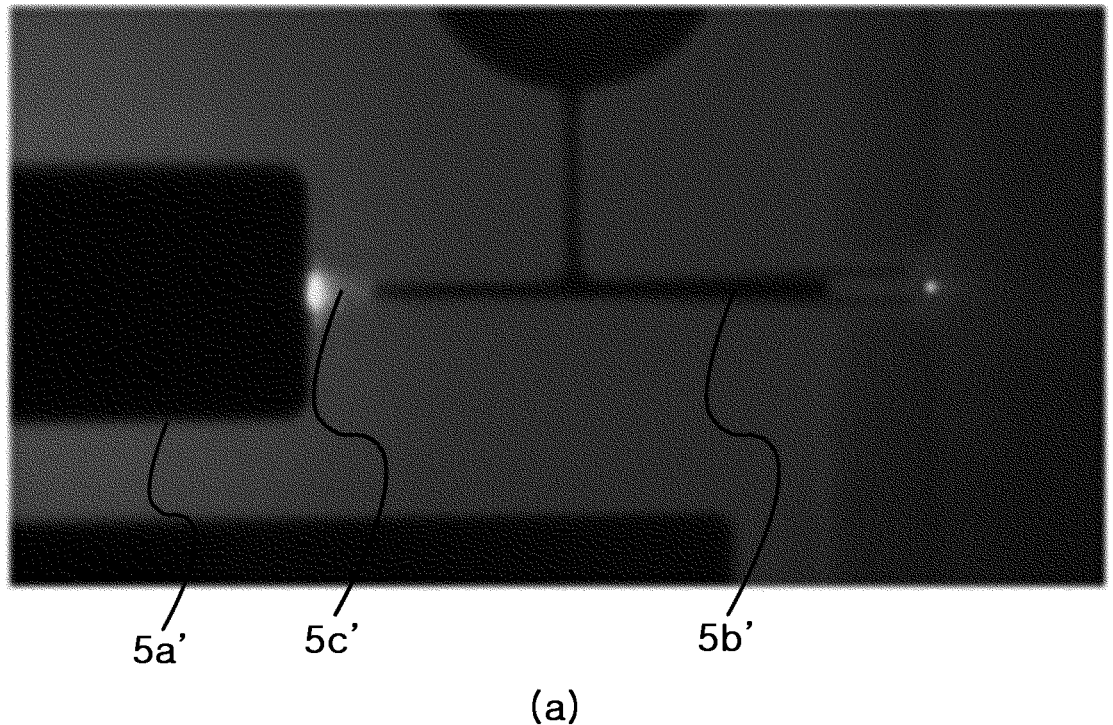
(a)
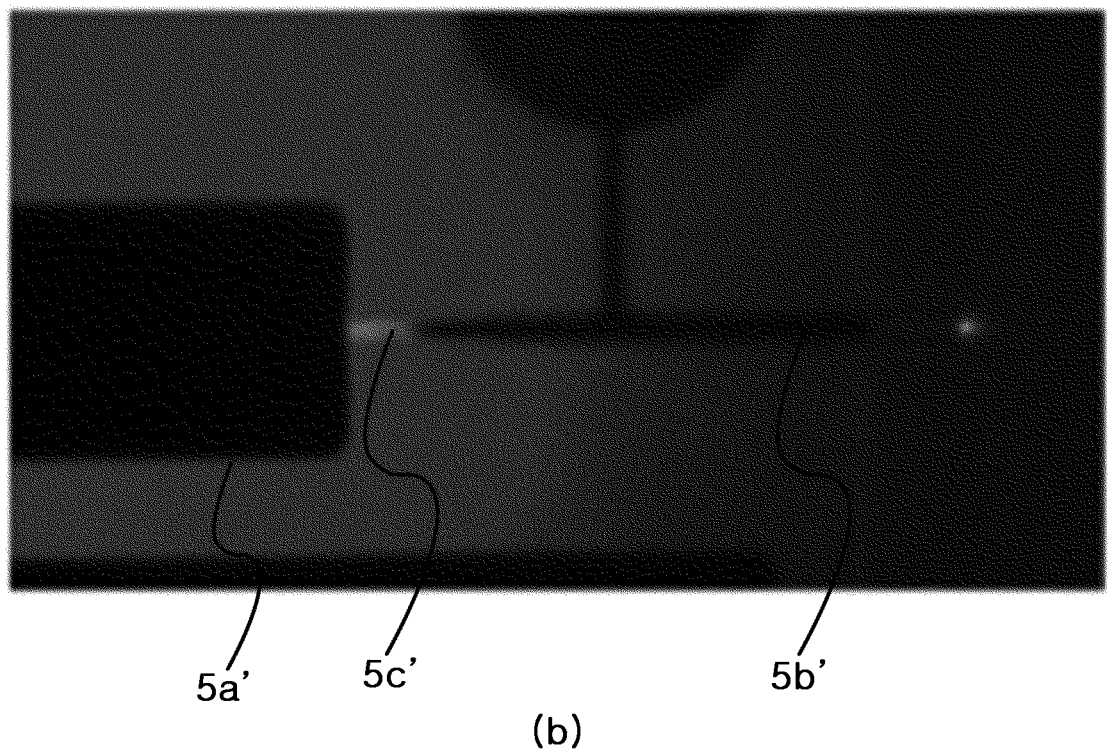
(b)

[FIG. 24A]
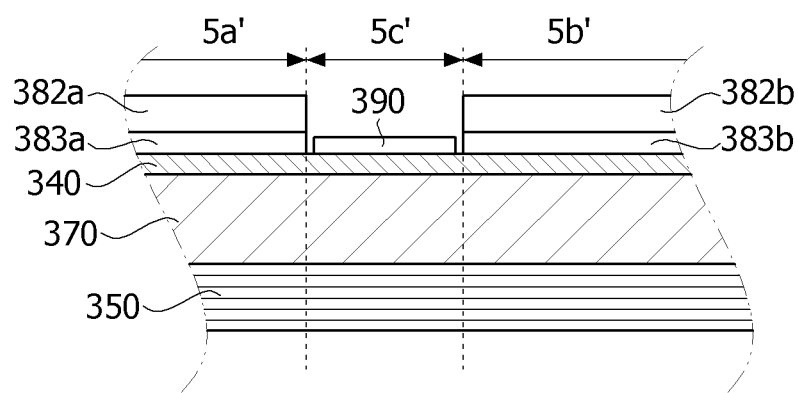
[FIG. 24B]
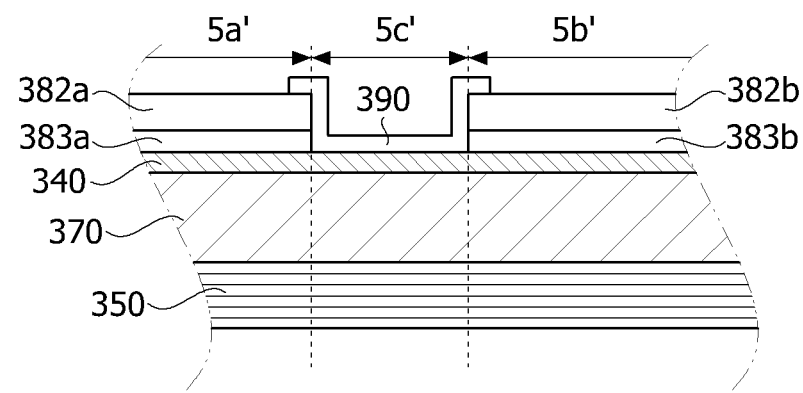

[FIG. 24C]
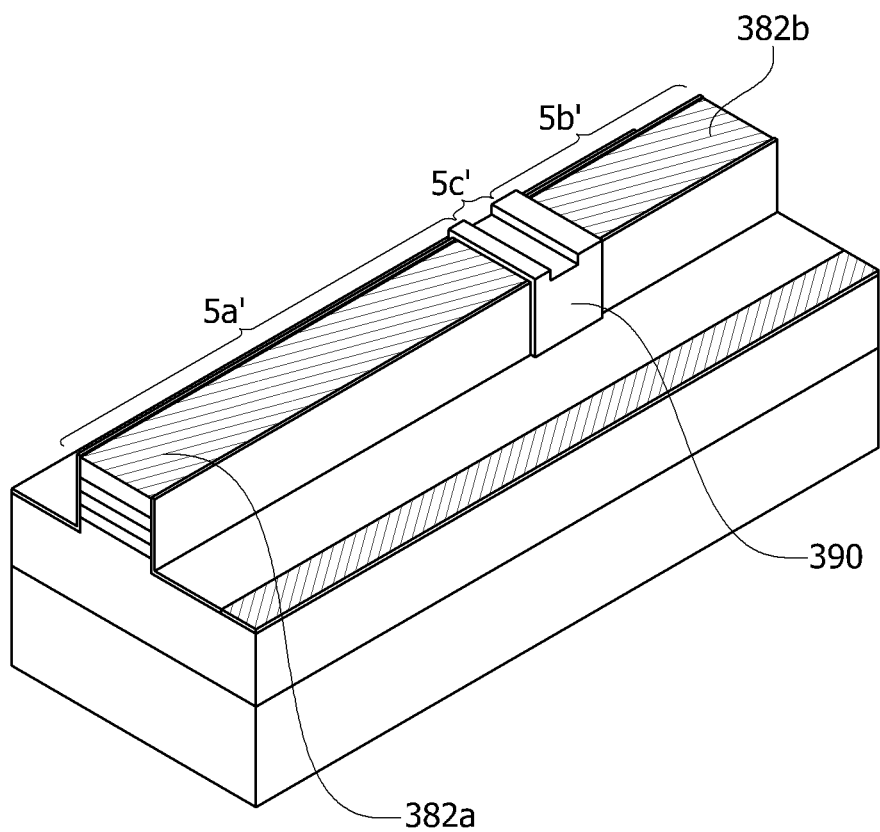

[FIG. 25]
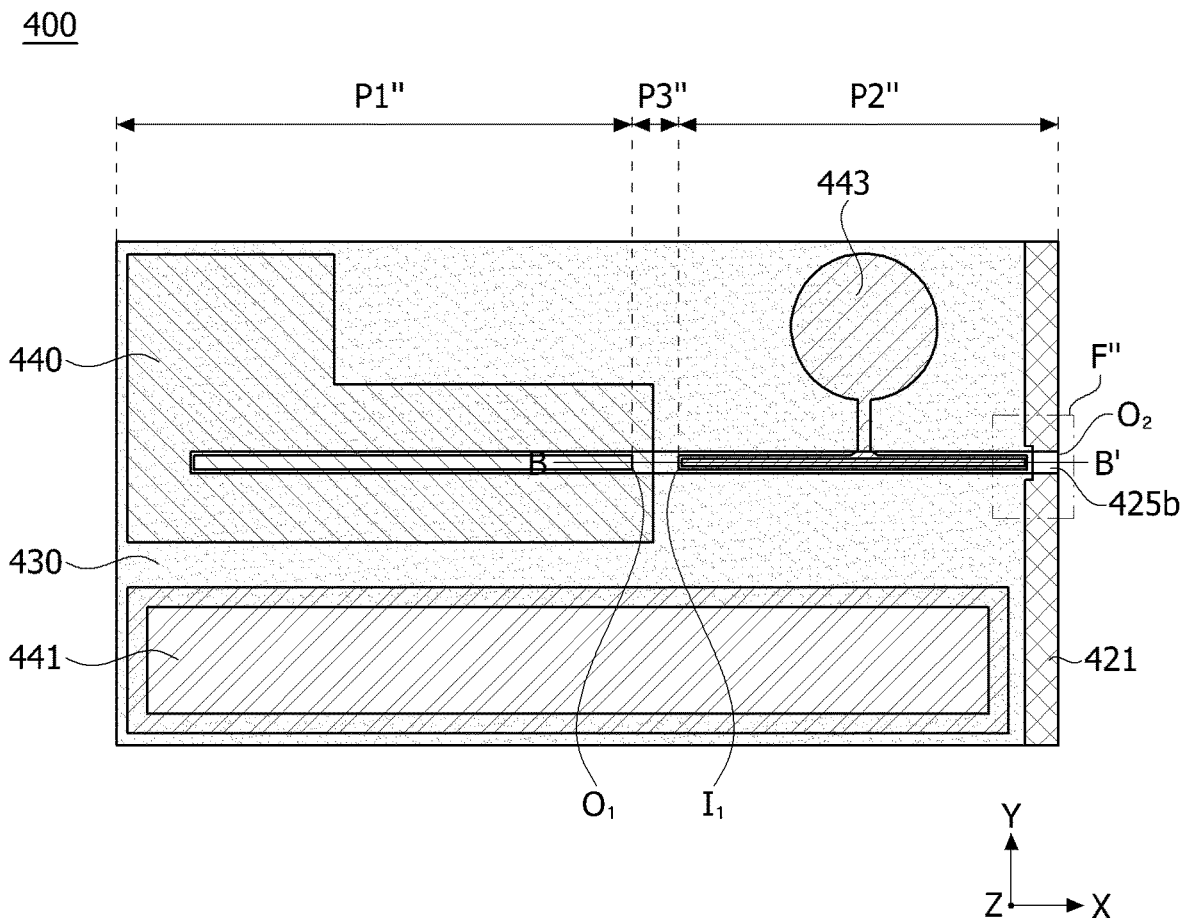

[FIG. 26]
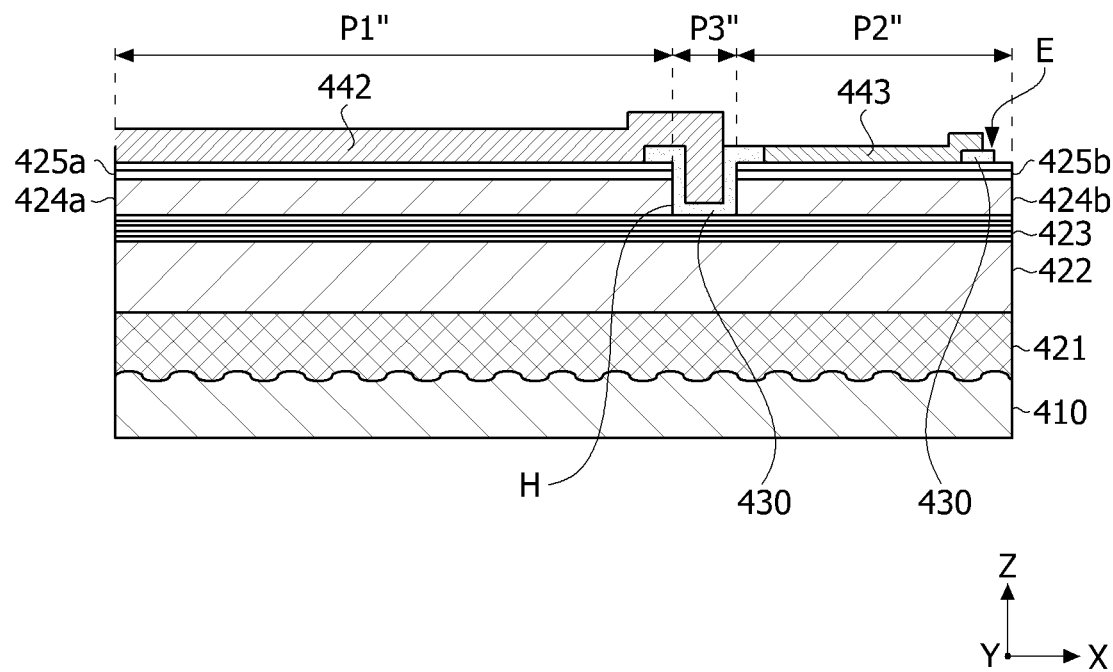

[FIG. 27]
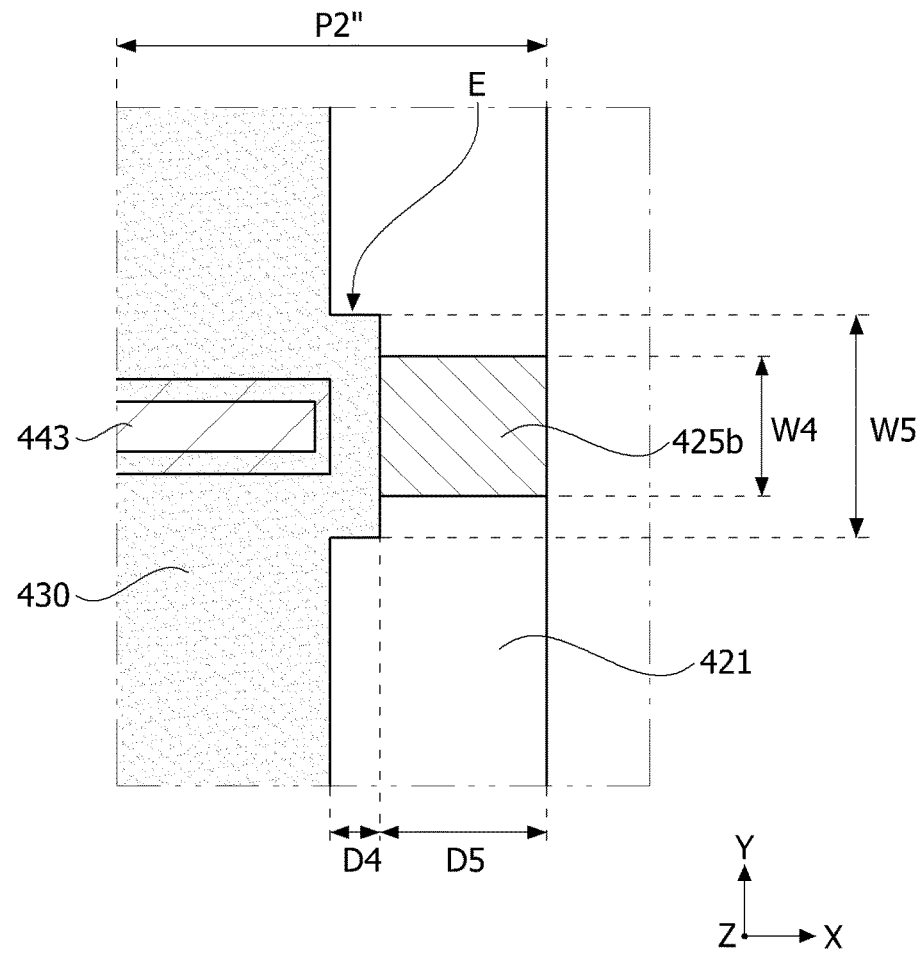
[FIG. 28]
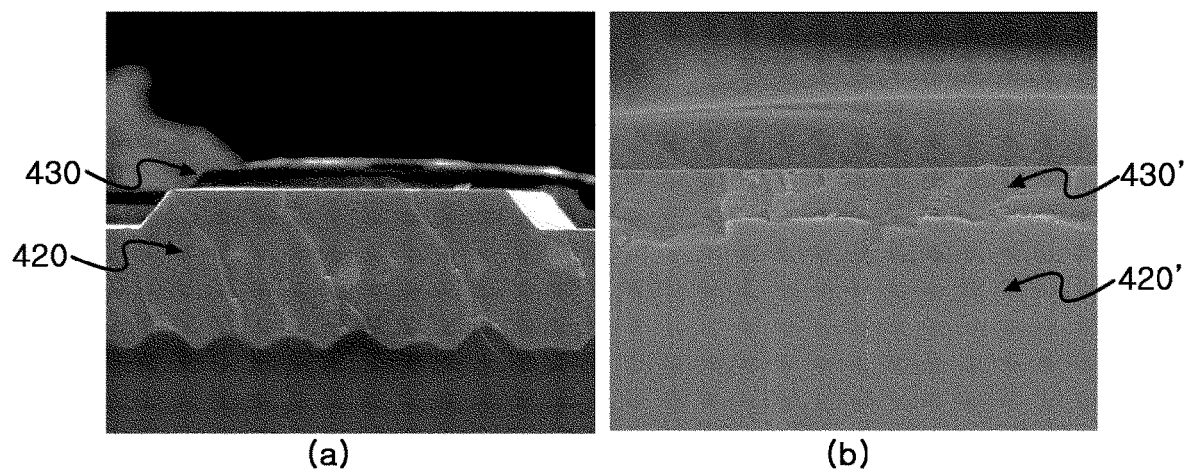
(a)  (b)

[FIG. 29]
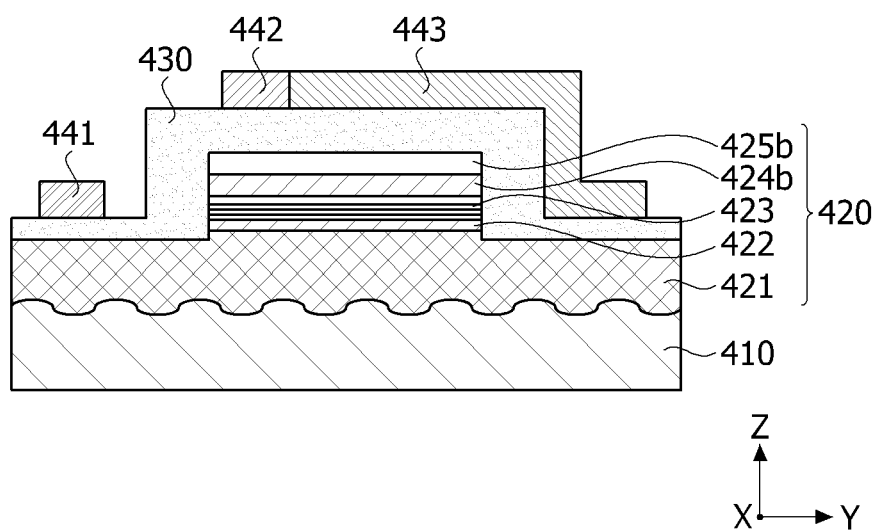
[FIG. 30A]
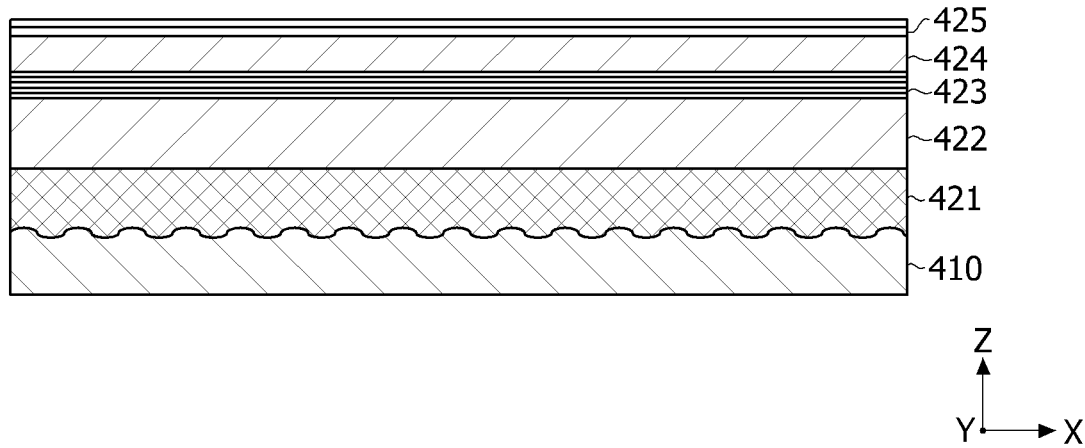

[FIG. 30B]
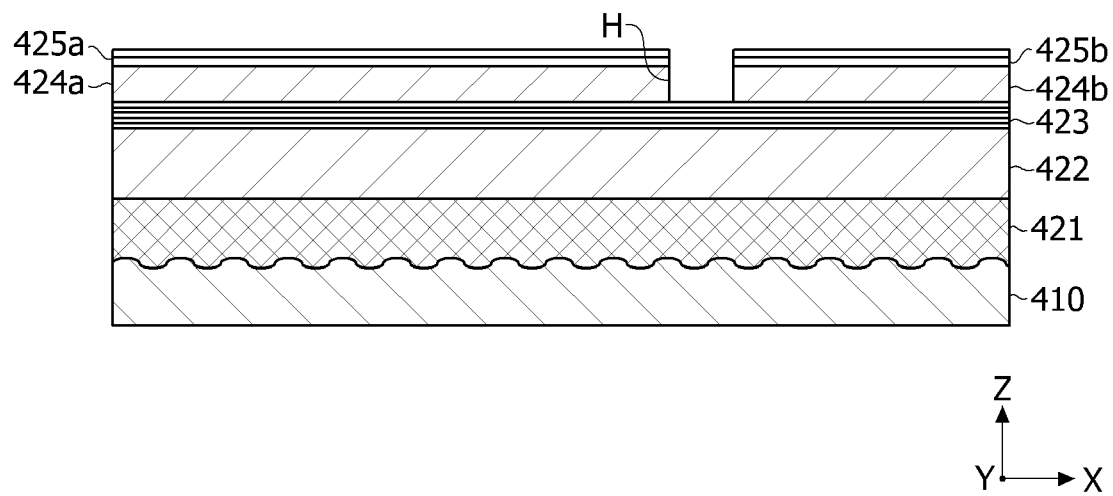
[FIG. 30C]
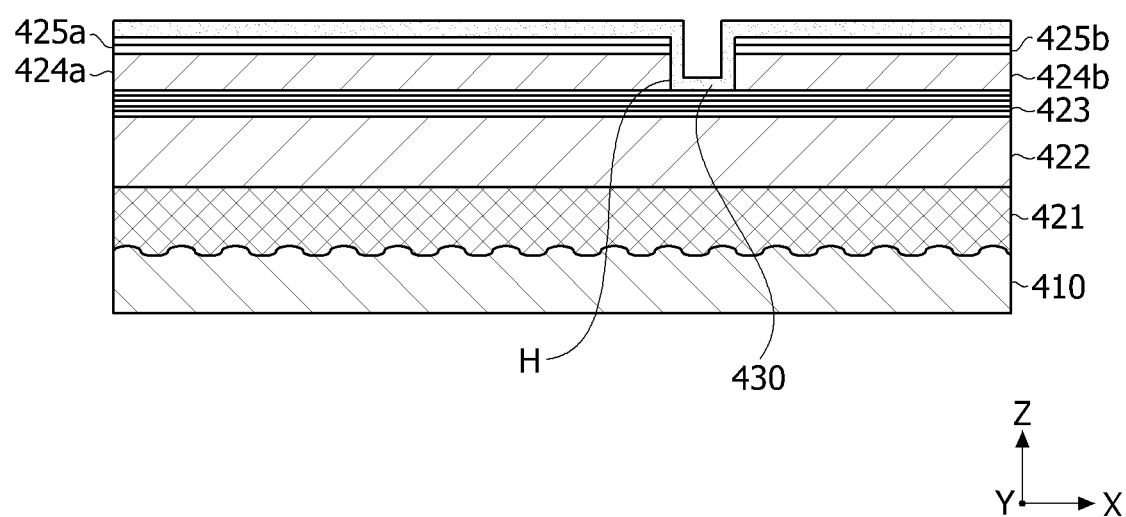

[FIG. 30D]
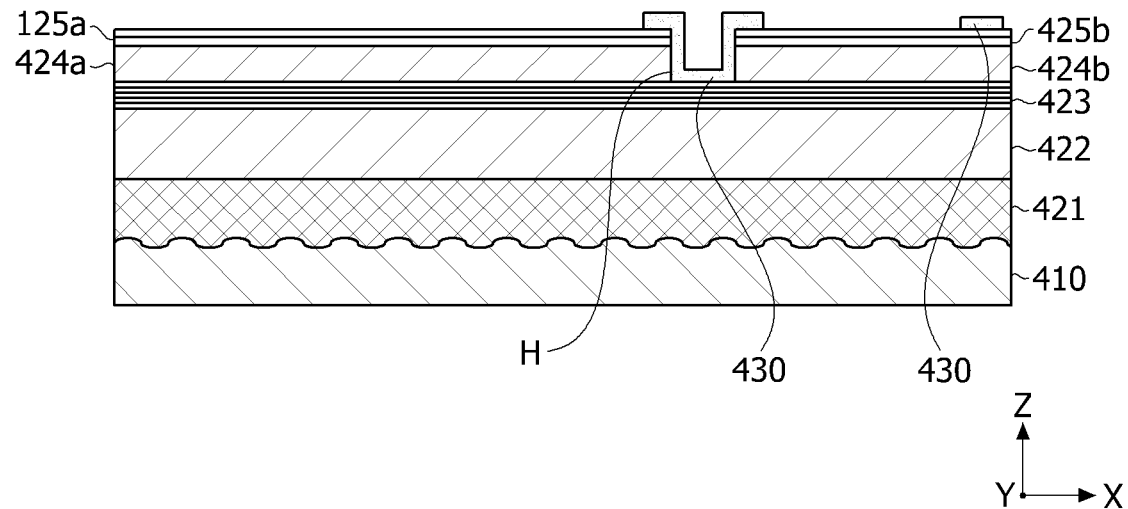
[FIG. 30E]
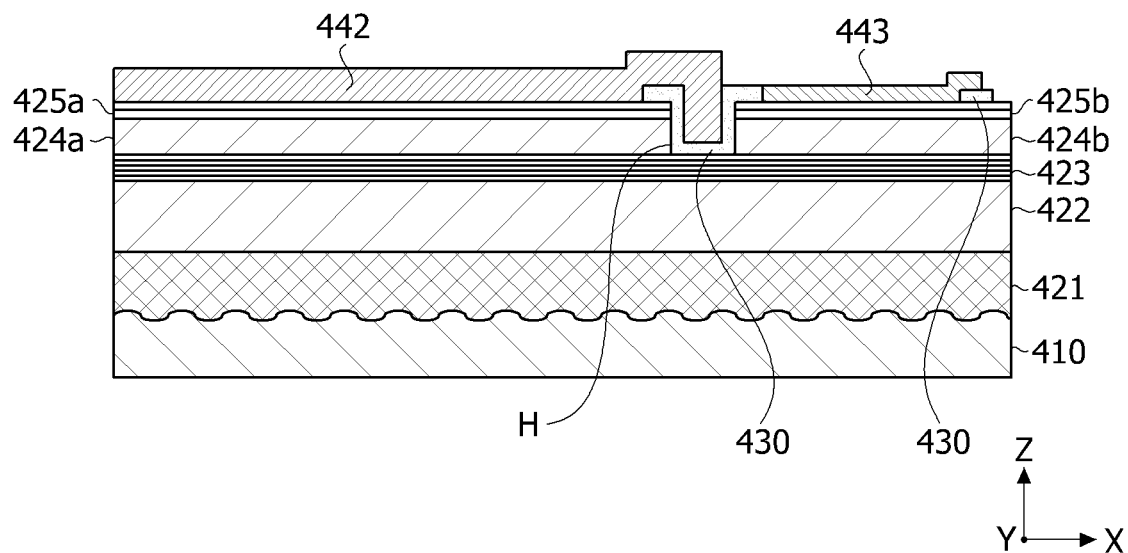

[FIG. 31A]
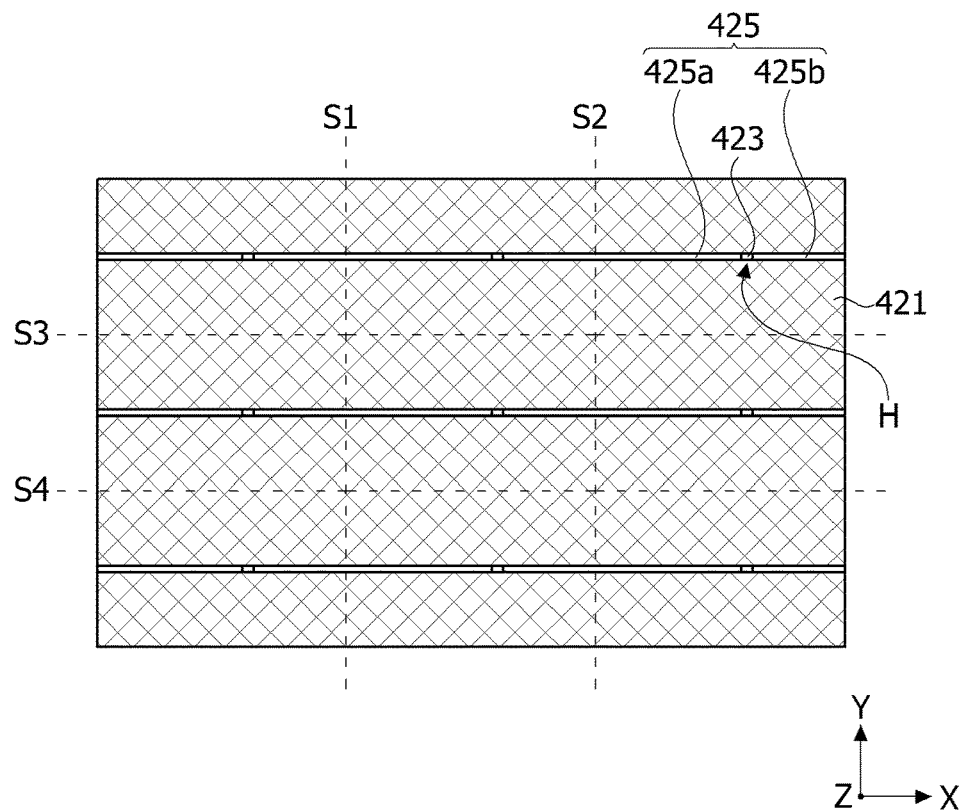
[FIG. 31B]
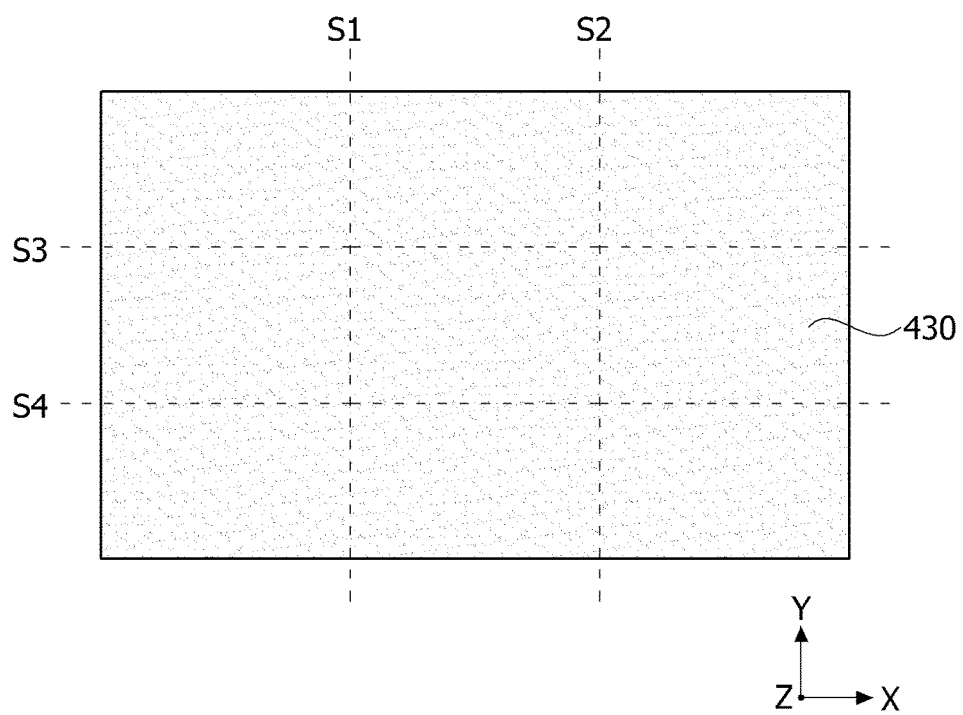

[FIG. 31C]
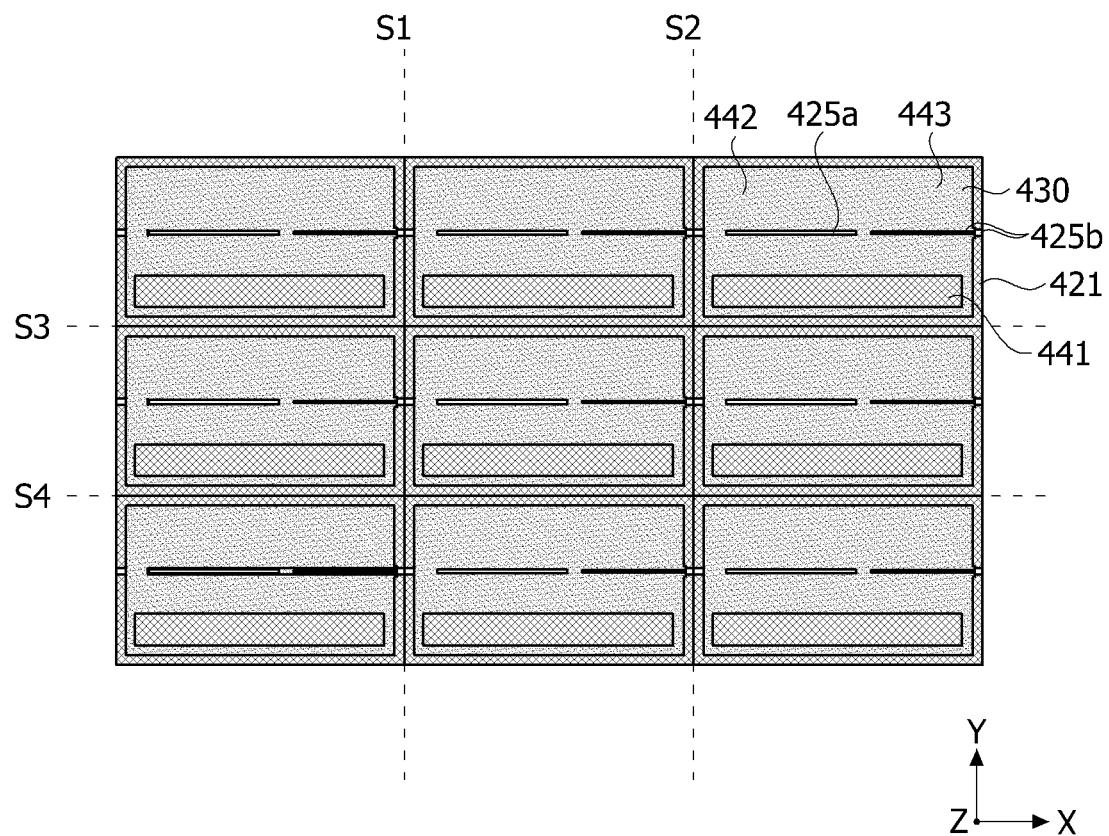

[FIG. 31D]
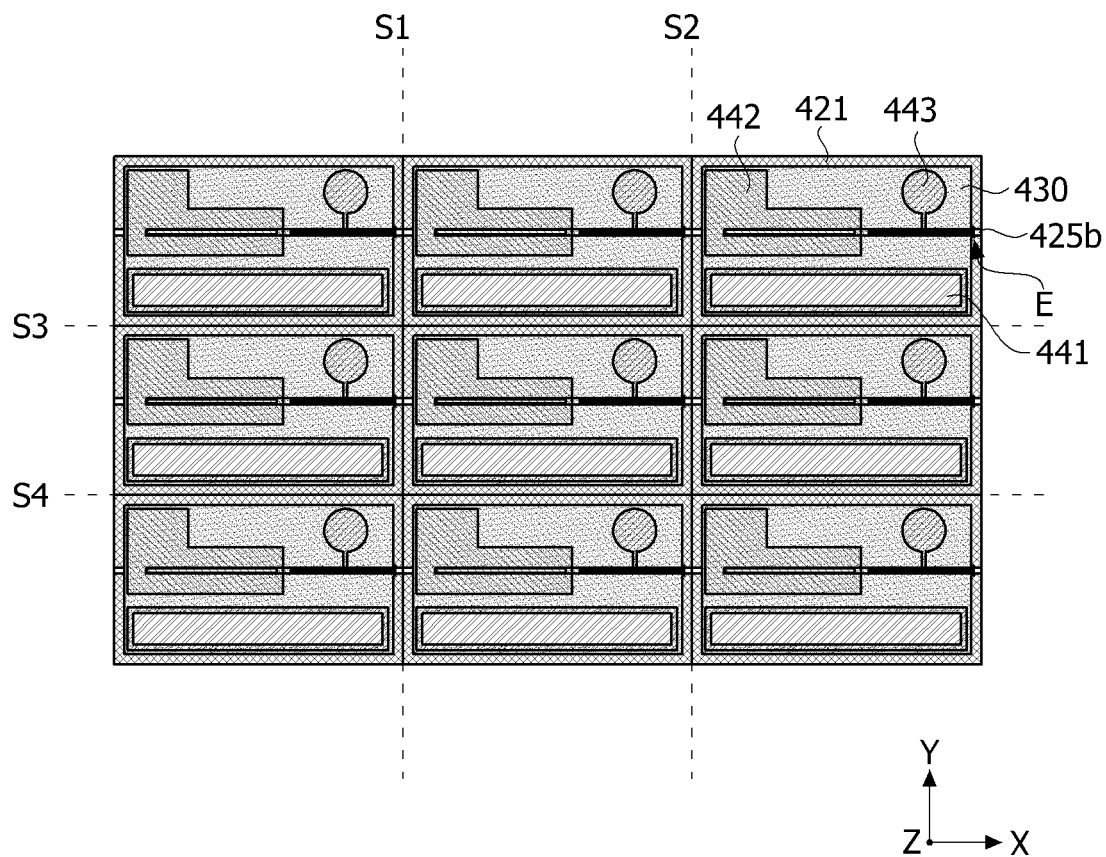

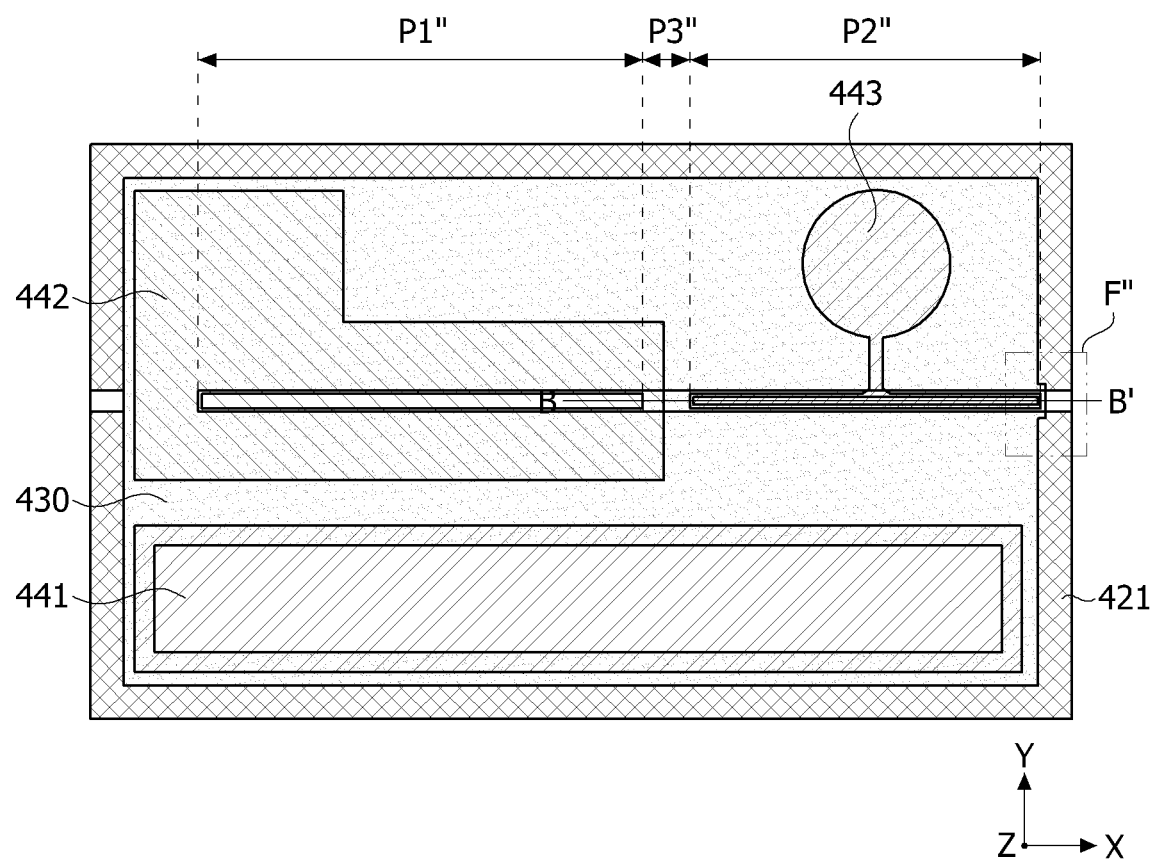
[FIG. 32]

[FIG. 33]
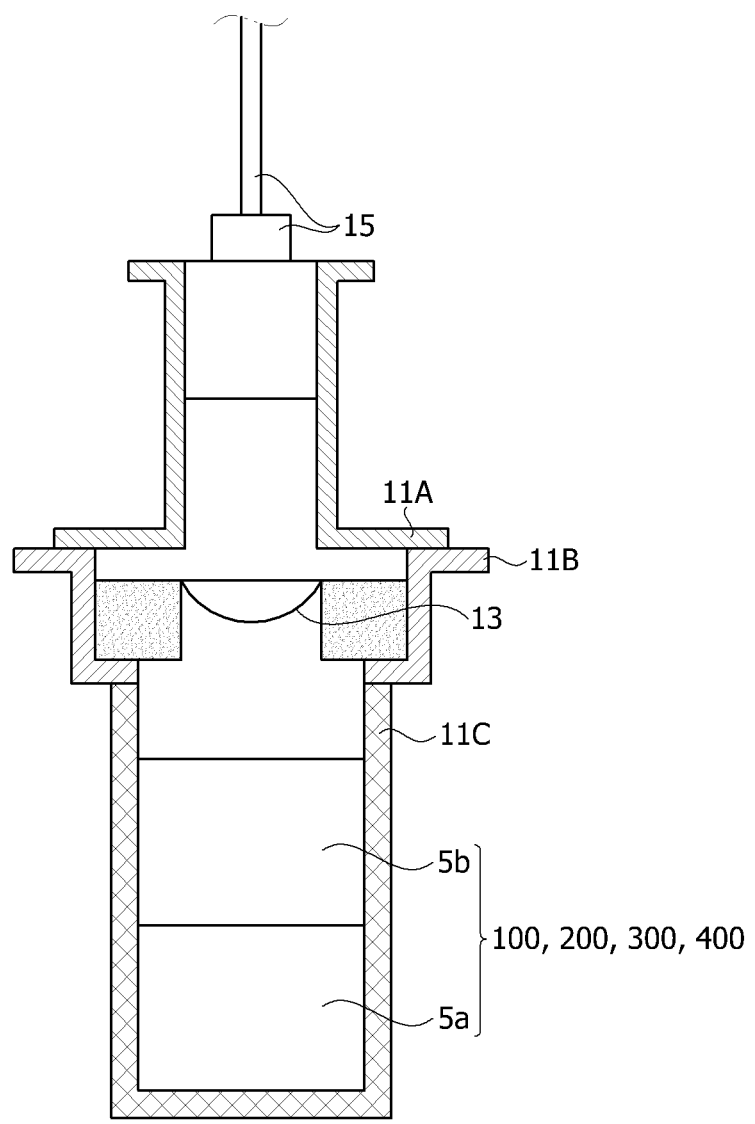

SEMICONDUCTOR DEVICE

CROSS REFERENCE TO RELATED APPLICATIONS

This application is the National Phase of PCT International Application No. PCT/KR2017/015438, filed on Dec. 26, 2017, which claims priority under 35 U.S.C. 119(a) to Patent Application No. 10-2016-0179531, filed in the Republic of Korea on Dec. 26, 2016, Patent Application No. 10-2016-0179532, filed in the Republic of Korea on Dec. 26, 2016, Patent Application No. 10-2017-0001903, filed in the Republic of Korea on Jan. 5, 2017 and Patent Application No. 10-2017-0001905, filed in the Republic of Korea on Jan. 5, 2017, all of which are hereby expressly incorporated by reference into the present application.

TECHNICAL FIELD

Embodiments relate to a semiconductor device.

BACKGROUND ART

A semiconductor device including a compound, such as GaN and AlGaN, has many advantages, such as wide and adjustable band-gap energy, and thus may be diversely used for light-emitting devices, light-receiving devices, various diodes, and the like.

In particular, a light-emitting device, such as a light-emitting diode or a laser diode, using a III-V group or II-VI group compound semiconductor material can realize various colors, such as red, green, and blue, or emit ultraviolet light, due to the development of thin-film growth technology and device materials. The light-emitting device can also emit efficient white light by using a fluorescent material or combining colors and has the advantages of low power consumption, semi-permanent lifetime, high response speed, safety, and environmental friendliness as compared to existing light sources such as fluorescent lamps and incandescent lamps.

Moreover, due to the development of device materials, when a light-receiving device, such as a photodetector or a solar cell, is fabricated with an III-V group or II-VI group compound semiconductor material, the light-receiving device generates a photocurrent by absorbing light in various wavelength regions. Therefore, it is possible to use light in various wavelength regions from the gamma-ray region to the radio-wave region. Also, the light-receiving device has the advantages of fast response time, stability, environmental friendliness, and ease of adjustment of element materials and may be easily used to power control or microwave circuits or communication modules.

Therefore, the applications of semiconductor devices are being expanded to transmission modules of optical communication means, light-emitting diode backlights which replace cold cathode fluorescence lamps (CCFLs) constituting the backlights of liquid crystal display (LCD) devices, white light-emitting diode illumination devices which may replace fluorescent lamps or incandescent lamps, vehicle headlights, traffic lights, sensors for sensing gas or fire, and the like. Also, the applications of semiconductor devices may be expanded to high-frequency application circuits, power control devices, and communication modules.

A typical example of a semiconductor device using optical communication means includes an electro-absorption modulator (EAM) using a short wavelength of a laser diode. However, the laser diode is difficult to manufacture, and it is difficult to align a light modulator with the laser diode by a narrow beam. Therefore, there is a problem that optical power is decreased.

DISCLOSURE

Technical Problem

Embodiments are directed to providing a semiconductor device with improved optical power.

Embodiments are directed to providing a semiconductor device with an improved alignment between a light-emitting part and a light modulating part.

Embodiments are directed to providing a semiconductor device in which a light-emitting diode and a light modulator are integrally manufactured.

Embodiments are directed to providing a semiconductor device capable of reducing full width at half maximum (FWHM) of light emitted from a light-emitting diode.

Embodiments are directed to providing a semiconductor device with an improved extinction ratio.

Embodiments are directed to providing a semiconductor device capable of preventing a light leakage phenomenon.

Embodiments are directed to providing a semiconductor device having a flat light emitting surface.

Embodiments are directed to providing a semiconductor device in which light is concentrated and emitted.

Problems to be solved in the embodiments are not limited to the above-described problems, and objects and effects which can be determined from the solutions and the embodiments of the problems described below are also included.

Technical Solution

One aspect of the present invention provides a semiconductor device including; a semiconductor structure having a first conductive semiconductor layer, a second conductive semiconductor layer, and an active layer disposed between the first conductive semiconductor layer and the second conductive semiconductor layer; a first electrode disposed on the first conductive semiconductor layer; a second-first electrode disposed on the second conductive semiconductor layer; and a second-second electrode disposed on the second conductive semiconductor layer to be spaced apart from the second-first electrode, wherein a thickness of a portion of the second conductive semiconductor layer, which is between the second-first electrode and the second-second electrode, is smaller than a thickness of a portion of the second conductive semiconductor layer, which vertically overlaps the second-first electrode and the second-second electrode, the second-second electrode includes a first region which is facing the second-first electrode and closest to the second-first electrode, the second-first electrode includes a second region which is facing the second-second electrode and closest to the second-second electrode, and a width W1 of the first region and a width W2 of the second region have a relationship of W1≥W2.

Another aspect of the present invention provides a semiconductor device including: a first conductive semiconductor layer; a first clad layer disposed on the first conductive semiconductor layer; a waveguide layer disposed on the first clad layer; a second clad layer disposed on the waveguide layer; and a second conductive semiconductor layer disposed on the second clad layer, wherein the waveguide layer includes an active layer having a plurality of well layers and a plurality of barrier layers, and an absorbing layer disposed between the first clad layer and the active layer, and the absorbing layer absorbs light of some wavelengths of a first light generated in the active layer.

An absorption wavelength band of the absorbing layer may be smaller than a wavelength of an emission peak of the first light.

An intersecting point X1 between an absorption spectrum of the absorbing layer and an emission spectrum of the first light may satisfy the following relational expression, wavelength of emission peak−full width at half maximum (FWHM)≤X1<wavelength of emission peak,       [Relational Expression 1]

wherein the emission peak is the emission peak of the first light and the FWHM is the FWHM of the first light.

An indium composition of the absorbing layer may be 80% to 95% of an indium composition of the well layer.

A thickness of the absorbing layer may be 95% to 105% of a thickness of the well layer.

The absorbing layer may include a first layer and a second layer which are repeatedly laminated, and an indium composition of the first layer may be 80% to 95% of an indium composition of the well layer.

A thickness of the second layer closest to the active layer among the plurality of second layers may be greater than a thickness of the remaining second layers.

The thickness of the second layer closest to the active layer may be in a range of 60 Å to 200 Å.

The second layer may include a dopant.

A doping concentration of the second layer is in a range of $1\times10^{17}/cm^3$ to $1\times10^{19}/cm^3$.

The waveguide layer may include a superlattice layer disposed between the absorbing layer and the first clad layer, the superlattice layer may include a plurality of first lattice layers and a plurality of second lattice layers, and the first lattice layer may include indium.

A difference in indium composition between the first layer and the first lattice layer may be greater than a difference in indium composition between the well layer and the first layer.

The semiconductor device may include a first electrode disposed on the first conductive semiconductor layer, a second-first electrode disposed on the second conductive semiconductor layer, and a second-second electrode disposed on the second conductive semiconductor layer, wherein the second-first electrode and the second-second electrode may be disposed to be spaced apart from each other on the second conductive semiconductor layer.

The active layer may absorb the first light when a reverse bias voltage is applied.

Still another aspect of the present invention provides a semiconductor device including: a semiconductor structure having a first conductive semiconductor layer, a second conductive semiconductor layer, and an active layer disposed between the first conductive semiconductor layer and the second conductive semiconductor layer; a first electrode disposed on the first conductive semiconductor layer; a second electrode disposed on the second conductive semiconductor layer; and a third electrode disposed on the second conductive semiconductor layer to be spaced apart from the second electrode in a first direction, wherein a ratio of the shortest separation distance between the second electrode and the third electrode in the first direction and a length of the second electrode in the first direction is in a range of 1:2 to 1:40, and the first direction is a direction perpendicular to a thickness direction of the semiconductor structure.

The second conductive semiconductor layer may include a first region, a third region, and a second region in the order of the first direction.

The third region may electrically connect the second electrode to the third electrode.

The semiconductor device may include a light-emitting part, a light modulating part spaced apart from the light-emitting part, and a connection part between the light-emitting part and the light modulating part, wherein the light-emitting part may include the first region, the light modulating part may include the second region, and the connection part may include the third region.

The separation distance between the second electrode and the third electrode may be in a range of 5 μm to 20 μm.

The semiconductor device may further include a first clad layer disposed between the first conductive semiconductor layer and the active layer and a second clad layer disposed between the second conductive semiconductor layer and the active layer.

The first clad layer and the second clad layer may have a greater Al composition than the active layer.

The first clad layer and the second clad layer may have a smaller refractive index than the active layer.

The first clad layer and the second clad layer may have a greater band gap than the active layer.

A thickness of the third region of the second conductive semiconductor layer may be smaller than a thickness of the first region of the second conductive semiconductor layer and a thickness of the second region of the second conductive semiconductor layer.

A second-first pad disposed on the second electrode may be further included.

A second-second pad disposed on the third electrode may be further included.

Some currents in the second electrode may flow toward the third electrode through the third region.

A reflective layer disposed on the third region may be further included.

Yet another aspect of the present invention provides an optical module including a substrate and a semiconductor device including: a semiconductor structure having a first conductive semiconductor layer, a second conductive semiconductor layer, and an active layer disposed between the first conductive semiconductor layer and the second conductive semiconductor layer; a first electrode disposed on the first conductive semiconductor layer; a second electrode disposed on the second conductive semiconductor layer; and a third electrode disposed on the second conductive semiconductor layer to be spaced apart from the second electrode in a first direction, wherein a ratio of the shortest separation distance between the second electrode and the third electrode in the first direction and a length of the second electrode in the first direction is in a range of 1:2 to 1:40, and the first direction is a direction perpendicular to a thickness direction of the semiconductor structure.

Still yet another aspect of the present invention provides an optical communication system including: a transmission module having the above-described semiconductor device; a receiving module configured to receive a signal transmitted from an optical module; and an optical fiber connecting the transmission module to the receiving module, wherein the optical fiber includes a plastic material.

Still yet another aspect of the present invention provides a semiconductor device including: a semiconductor structure having a first conductive semiconductor layer, an active layer disposed on the first conductive semiconductor layer, a second conductive semiconductor layer disposed on the active layer, and a light-emitting region and a modulating region disposed in a first direction; and an insulating layer disposed on the semiconductor structure, wherein the active layer extends to one side of the second conductive semiconductor layer, and the insulating layer includes a protrusion part disposed to be spaced apart from one side of the second conductive semiconductor layer and protruding in the first direction.

The semiconductor structure may include an exposed upper surface.

An edge of the first conductive semiconductor layer may be exposed in the first direction.

A length of an exposed upper surface of the second conductive semiconductor layer may be in a range of 30 μm to 50 μm The semiconductor device may include a first electrode disposed on the first conductive semiconductor layer, and a second electrode and a third electrode disposed on the second conductive semiconductor layer, wherein the second electrode may be disposed on the light-emitting region, and the third electrode may be disposed on the modulating region.

The first electrode, the second electrode, and the third electrode may pass through the insulating layer.

The insulating layer may be disposed between the semiconductor structure, and the first electrode, the second electrode, and the third electrode.

The light-emitting region may include a first emission part disposed on one side in the first direction, and the modulating region may include a first incident part adjacent to the first emission part of the light-emitting region and disposed on one side in the first direction, and a second emission part disposed on the other side in the first direction.

A distance between the first emission part and the first incident part may be smaller than a distance between the first emission part of the light-emitting region and the second emission part of the modulating region.

A width of the protrusion part may be in a range of 16 μm to 24 μm.

The semiconductor structure may further include an insulating region disposed between the light-emitting region and the modulating region in the first direction.

A length ratio of a length of the protrusion part to a length in which the insulating layer is spaced apart from one side of the second conductive semiconductor layer may be in a range of 1:5/4 to 1:25/7.

Light generated in the light-emitting region may pass through the modulating region.

The light may be emitted through the outermost side surface of the semiconductor structure in the first direction.

The semiconductor device may further include a first clad layer disposed between the first conductive semiconductor layer and the active layer and a second clad layer disposed between the second conductive semiconductor layer and the active layer.

Advantageous Effects

According to embodiments, optical power of a semiconductor device can be improved.

According to embodiments, an alignment between a light-emitting part and a light modulating part of a semiconductor device can be improved.

According to embodiments, full width at half maximum (FWHM) of light emitted from a light-emitting diode can be reduced.

In addition, a light transmission length and noise can be improved.

According to embodiments, an extinction ratio of the semiconductor device can be improved.

According to embodiments, a light leakage phenomenon of a semiconductor device can be prevented.

According to embodiments, a light emitting surface of a semiconductor device can be made flat.

According to embodiments, light of a semiconductor device can be concentrated and emitted.

Various useful advantages and effects of the present invention are not limited to those mentioned above and will be easily understood from the detailed description of embodiments of the present invention.

DESCRIPTION OF DRAWINGS

FIG. 1 is a conceptual diagram of an optical communication system according to the present invention.

FIG. 2 is a conceptual diagram illustrating a process of modulating an optical signal by a semiconductor device according to the present invention.

FIG. 3 is a perspective view of a semiconductor device according to an embodiment of the present invention.

FIG. 4 is a cross-sectional view taken along line I-I' of FIG. 3.

FIG. 5 is an enlarged view of portion F in FIG. 4.

FIGS. 6A to 6C are plan views according to various modified examples of the semiconductor device according to the embodiment of the present invention, FIG. 7 is an enlarged view of a region, which is corresponding to the portion F in FIG. 4, in according to another embodiment semiconductor device.

FIG. 8 is a graph illustrating current values according to the voltages of the semiconductor device according to the embodiment of the present invention and a semiconductor device according to Comparative Example of the present invention.

FIG. 9 is a plan view of a semiconductor device according to another embodiment of the present invention.

FIG. 10 is a cross-sectional view taken along line A-A of FIG. 9.

FIG. 11 is a cross-sectional view taken along line B-B of FIG. 9.

FIG. 12 is a view illustrating a semiconductor structure of FIG. 10.

FIG. 13 is a graph illustrating changes of an optical spectrum due to an absorbing layer.

FIG. 14 shows a result of measuring a photoluminescence (PL) spectrum of the semiconductor structure of FIG. 9.

FIG. 15 is a view illustrating a process in which light is guided.

FIG. 16 is a view illustrating a modified example of the absorbing layer.

FIGS. 17A to 17C are views illustrating various arrangements of the absorbing layer and a superlattice layer.

FIG. 18 is a perspective view of a semiconductor device according to still another embodiment of the present invention.

FIG. 19 is a top view of the semiconductor device according to still another embodiment of the present invention.

FIG. 20 is a cross-sectional view of the semiconductor device according to still another embodiment of the present invention.

FIG. 21 is an enlarged view of portion F' in FIG. 20.

FIGS. 22A and 22B are photographs taken by observing the difference in extinction ratio depending on the presence or absence of a connection part.

FIGS. 23A and 23B are photographs taken by observing a light leakage phenomenon depending on the presence or absence of the connection part.

FIGS. 24A and 24B illustrate a modified example of FIG. 21.

FIG. 24C is a perspective view of FIG. 24B.

FIG. 25 is a top view of a semiconductor device according to yet another embodiment of the present invention.

FIG. 26 is a cross-sectional view taken along line B-B' of FIG. 25.

FIG. 27 is an enlarged view of portion F''' in FIG. 25.

FIGS. 28A and 28B illustrate photographs for describing an effect of the semiconductor device of yet another embodiment.

FIG. 29 is a side view of the semiconductor device according to yet another embodiment.

FIGS. 30A to 30E are views illustrating a method of manufacturing the semiconductor device according to yet another embodiment of the present invention.

FIGS. 31A to 31D are top views illustrating a method of manufacturing the semiconductor device according to yet another embodiment of the present invention.

FIG. 32 is a top view of the semiconductor device according to yet another embodiment of the present invention.

FIG. 33 is a conceptual diagram of an optical transmission module according to the embodiments of the present invention.

MODES OF THE INVENTION

Embodiments of the present invention may be modified into other forms, or several embodiments may be combined with each other, and the scope of the present invention is not limited to each of the embodiments described below.

Although an item described in a specific embodiment is not described in other embodiment, unless otherwise described in the other embodiment or as long as there is no contradictory description therein, the item may be understood as being related to the other embodiment.

For example, when a feature for a configuration A is described in a specific embodiment and a feature for a configuration B is described in other embodiment, even when an embodiment in which the configuration A and the configuration B are combined is not explicitly described, unless otherwise described in the other embodiment or as long as there is no contradictory explanation therein, it should be understood that the combined embodiment will fall within the scope of the present invention.

In the description of the embodiments, when an element is described as being formed "on" or "under" another element, the terms "on" or "under" includes the meaning of the two elements bringing in direct contact with each other (directly) and the meaning of one or more other elements being disposed and formed between the two elements (indirectly). In addition, when the term "on" or "under" is used, it may refer to a downward direction as well as an upward direction with respect to an element.

A semiconductor device may include various kinds of electronic devices such as a light-emitting device, a light-receiving device, a light modulator, and the like, and the light-emitting device, the light-receiving device, and the light modulator may each include a first conductive semiconductor layer, an active layer, and a second conductive semiconductor layer.

A semiconductor device according to present embodiments may be a light-emitting device and a light modulator.

The light-emitting device emits light by recombination of electrons and holes, and the wavelength of the light is determined by an energy band gap inherent to a material. Accordingly, the emitted light may be different depending on the composition of the material.

The light modulator may be an electro-absorption modulator (EAM). However, the present invention is not limited thereto. The EAM may be driven at a low voltage and may enable downscaling of devices. In the light modulator, a degree of light absorption may be changed according to an applied voltage. That is, the light modulator may output modulated light by emitting (on-state) incident light to the outside or absorbing (off-state) the incident light according to a change in applied voltage.

Hereinafter, embodiments of the present invention will be described in detail with reference to the accompanying drawings so that those of ordinary skill in the art to which the present invention pertains may readily implement the embodiments.

FIG. 1 is a conceptual diagram of an optical communication system according to the present invention.

Referring to FIG. 1, the optical communication system according to the present invention includes a first optical transceiver 3 configured to communicate with a first host 1, a second optical transceiver 4 configured to communicate with a second host 2, and channels connected between the first optical transceiver 3 and the second optical transceiver 4.

The first host 1 and the second host 2 are not particularly limited as long as they are electronic devices capable of communicating. As an example, the first host 1 may be a server, and the second host 2 may be a personal computer.

Each of the first optical transceiver 3 and the second optical transceiver 4 may be a bidirectional communication module including an optical transmission module 5 and an optical receiving module 6, but the embodiments of the present invention are not necessarily limited thereto. As an example, the first optical transceiver 3 may be an optical transmission module, and the second optical transceiver 4 may be an optical receiving module. Hereinafter, the description will be made on the basis of a bidirectional communication method.

The optical transmission module 5 of the first optical transceiver 3 may be connected to the optical receiving module 6 of the second optical transceiver 4 by a first optical fiber 8. The optical transmission module 5 may convert an electrical signal of the host into an optical signal. A controller 7 may modulate the optical signal in response to the electrical signal of the host. As an example, the controller 7 may include a driver integrated circuit (IC).

The optical receiving module 6 of the first optical transceiver 3 may be connected to the optical transmission module 5 of the second optical transceiver 4 by a second optical fiber 9. The optical receiving module 6 may convert an optical signal into an electric signal. The controller 7 may amplify the converted electrical signal using a transimpedance amplifier (TIA) or may extract packet information from the electrical signal and transmit the packet information to the host.

Meanwhile, the optical transmission module 5 may include a semiconductor device 100 according to the present invention.

FIG. 2 is a conceptual diagram illustrating a process of modulating an optical signal by the semiconductor device according to the present invention.

Referring to FIG. 2, the semiconductor device 100 according to the present invention may include a light-emitting part 5a and a light modulating part 5b. The semiconductor device 100 may be a component of the optical transmission module 5 illustrated in FIG. 1. However, all semiconductor devices according to various embodiments described with reference to FIGS. 3 to 32 below may be applied to the semiconductor device 100. Further, light-emitting parts and light modulating parts of the semiconductor devices according to various embodiments described with reference to FIGS. 3 to 32 below may be applied to the light-emitting part 5a and the light modulating part 5b, respectively.

The semiconductor device 100 may modulate an optical signal L1 using an electrical signal E1. That is, light emitted from the light-emitting part 5a may be modulated by the light modulating part 5b. Here, a state in which the electrical signal E1 is provided may be referred to as a "state 1," while a state in which the electrical signal E1 is not provided may be referred to as a "state 0." The electrical signal E1 may be a reverse bias voltage.

The semiconductor device 100 may emit the optical signal L1 (on-state) in the "state 1", and the semiconductor device 100 may not emit the optical signal L1 (off-state) in the "state 0". Thus, the semiconductor device 100 may output a pulsed optical signal in which the optical signal L1 is periodically emitted or not emitted.

Meanwhile, the semiconductor device 100 according to the present invention may have a bent energy band gap structure when no electric field is formed, and a relatively flat energy band gap structure when a reverse voltage is provided.

More specifically, in the semiconductor device 100 according to the present invention, an active layer may absorb light when no electric field is formed. That is, the semiconductor device 100 according to the present invention includes a nitride-based semiconductor, thereby forming an asymmetric energy band gap of the active layer. This is because there is a strong piezoelectric field inside a light absorbing layer. The piezoelectric field may be generated due to various causes. As an example, the piezoelectric field may be generated due to a strain caused by a lattice mismatch.

However, when a reverse bias voltage is applied to the active layer, the active layer may transmit light. This is due to the fact that an energy band becomes relatively flat and the band gap becomes great when the reverse bias voltage is applied.

As described above, the light is emitted from the light-emitting part 5a, and the light modulating part 5b modulates the emitted light according to the change of the voltage, so that the semiconductor device 100 according to the present invention may output the optical signal.

<A Semiconductor Device According to a First Embodiment>

FIG. 3 is a perspective view of a semiconductor device according to the embodiment of the present invention. FIG. 4 is a cross-sectional view taken along line I-I' of FIG. 3. FIG. 5 is an enlarged view of portion F in FIG. 4.

Referring to FIGS. 3 to 5, a semiconductor device 100 according to the embodiment of the present invention may include a light-emitting part 5a, a light modulating part 5b, and a spacer region 5c disposed between the light-emitting part 5a and the light modulating part 5b. The semiconductor device 100 also includes a substrate 110, a semiconductor structure 120, a first electrode 161, and second electrodes 162a and 162b.

In the semiconductor device 100 according to the present invention, the light-emitting part 5a and the light modulating part 5b may be disposed together on the substrate 110. That is, the light-emitting part 5a may be disposed on one side of the substrate 110, and the light modulating part 5b may be disposed on the other side of the substrate 110. The light-emitting part 5a and the light modulating part 5b may be separated from each other by the spacer region 5c in a first direction (an X-axis direction) in which light travels.

The spacer region 5c may be disposed between the light-emitting part 5a and the light modulating part 5b. A portion of a second conductive semiconductor layer 140 corresponding to the spacer region 5c may be etched to electrically isolate the light-emitting part 5a from the light modulating part 5b. Thus, the light-emitting part 5a and the light modulating part 5b may be driven individually due to the spacer region 5c. For example, the light-emitting part 5a may be driven by a constant direct current to emit the light, and the light modulating part 5b may be driven by an alternating current to modulate the light.

The light emitted from a light-emitting layer (an active layer) of the light-emitting part 5a may travel in the first direction (the X-axis direction) corresponding to a major axis due to the difference in refractive index between an upper portion, a lower portion, and side portions of the light-emitting layer. In the light-emitting part 5a, the light may be emitted and moved in the X-axis direction. An absorbing layer (the active layer) of the light modulating part 5b may absorb or transmit the light incident from the light-emitting part 5a in the first direction (the X-axis direction). Further, the light modulating part 5b may modulate an optical signal to be emitted through an output end. Here, the output end may refer to an end of the light modulating part 5b, which is positioned on an opposite side of the light-emitting part 5a.

As described above, in the semiconductor device 100 according to the present invention, the light-emitting part 5a and the light modulating part 5b may be integrated together on the substrate 110 in a horizontal type. In addition, the light-emitting part 5a and the light modulating part 5b may be separated by the spacer region 5c. Here, the light-emitting part 5a, the spacer region 5c, and the light modulating part 5b may be continuously formed in the first direction (the X-axis direction). That is, the light-emitting part 5a, the spacer region 5c, and the light modulating part 5b may be manufactured simultaneously.

A light emission part 5a-1 (an end of the light-emitting part, which faces the light modulating part) of the light-emitting part 5a and an input end 5b-1 (an end of the light modulating part, which faces the light-emitting part) of the light modulating part 5b may be aligned so as to face each other in the first direction (the X-axis direction). That is, in the semiconductor device 100 according to the present invention, an alignment error between the light-emitting part 5a and the light modulating part 5b may be prevented, and thus light loss may be reduced.

The substrate 110 may be a transparent, conductive, or insulating substrate. For example, the substrate 110 may include at least one of sapphire (Al2O3), SiC, Si, GaAs, GaN, ZnO, GaP, InP, Ge, and Ga2O3.

The substrate 110 includes a first surface 111 on which the semiconductor structure 120 is disposed. Here, the light-emitting part 5a may be disposed on one side of the first surface 111, and the light modulating part 5b may be disposed on the other side of the first surface 111.

The semiconductor structure 120 may be disposed on the substrate 110. The semiconductor structure 120 may include a first conductive semiconductor layer 130, a second conductive semiconductor layer 140, and an active layer 150 disposed between the first conductive semiconductor layer 130 and the second conductive semiconductor layer 140.

The first conductive semiconductor layer 130 may be disposed on the substrate 110. The first conductive semiconductor layer 130 may be implemented with at least one of Group III-V and Group II-VI compound semiconductors. The first conductive semiconductor layer 130 may be formed of a semiconductor material having a composition formula of, for example, InxAlyGa1-x-yN ($0 \leq x \leq 1$, $0 \leq y \leq 1$, $0 \leq x+y \leq 1$). For example, the first conductive semiconductor layer 130 may include at least one of GaN, AlN, AlGaN, InGaN, InN, InAlGaN, and AlInN. The first conductive semiconductor layer 130 may be an n-type semiconductor layer doped with an n-type dopant such as Si, Ge, Sn, Se, or Te.

The active layer 150 may be disposed on the first conductive semiconductor layer 130. The active layer 150 is a layer at which electrons (or holes) injected through the first conductive semiconductor layer 130 and holes (or electrons) injected through the second conductive semiconductor layer 140 meet.

The active layer 150 may have a material whose band gap is bent by including spontaneous polarization. The active layer 150 may be implemented with, for example, at least one of Group III-V and Group II-VI compound semiconductors. When the active layer 150 is implemented as a multi-well structure, the active layer 150 may include a plurality of well layers and a plurality of barrier layers, which are alternately disposed, but the present invention is not limited thereto. The active layer 150 may be formed of a semiconductor material having a composition formula of, for example, InxAlyGa1-x-yN ($0 \leq x \leq 1$, $0 \leq y \leq 1$, $0 \leq x+y \leq 1$). The active layer 150 may include at least one of pairs of InGaN/GaN, GaN/AlGaN, AlGaN/AlGaN, InGaN/AlGaN, and InGaN/InGaN.

Meanwhile, the active layer 150 disposed in the light-emitting part 5a may act as a light-emitting layer. That is, as electrons and holes are recombined, the active layer 150 of the light-emitting part 5a may generate the light by a band gap difference according to a material of which the active layer 150 is formed.

Further, the active layer 150 disposed in the light modulating part 5b may act as a light absorbing layer. That is, as electrons and holes are recombined, the active layer 150 of the light modulating part 5b may absorb or transmit the light by a band gap difference according to a material of which the active layer 150 is formed.

When the active layer 150 of the light modulating part 5b absorbs the light, the intensity of light output through the output end may be weak. When the active layer 150 of the light modulating part 5b transmits the light, the intensity of light output through the output end may be sufficient. The active layer 150 of the light modulating part 5b may perform the role of absorbing or transmitting the light so that the optical signal input from the active layer 150 of the light-emitting part 5a may be modulated at the output end.

As described above, in the semiconductor device 100 according to the present invention, the active layer 150 may be a waveguide layer. That is, the light is generated in the active layer 150 of the light-emitting part 5a, and the light is modulated in the active layer 150 of the light modulating part 5b. The light may move in the first direction (the X-axis direction) along the active layer 150 of the light modulating part 5b from the active layer 150 of the light-emitting part 5a.

The active layer 150 may have a smaller area than the first conductive semiconductor layer 130 when viewed from the top. Generally, as an area of the active layer 150 increases, capacitance may increase. Also, as a capacitance value decreases, a high-speed operation may be implemented in the semiconductor device 100. Particularly, it is advantageous to have a low capacitance value for the high-speed operation of the light modulating part 5b. Accordingly, the active layer 150 may be disposed only on a partial region of the first conductive semiconductor layer 130.

The second conductive semiconductor layer 140 may be disposed on the active layer 150. The second conductive semiconductor layer 140 may have an area corresponding to the active layer 150.

The second conductive semiconductor layer 140 may be implemented with at least one of Group III-V and Group II-VI compound semiconductors. The second conductive semiconductor layer 140 may be formed of a semiconductor material having a composition formula of, for example, InxAlyGa1-x-yN ($0 \leq x \leq 1$, $0 \leq y \leq 1$, $0 \leq x+y \leq 1$). For example, the second conductive semiconductor layer 140 may include at least one of GaN, AlN, AlGaN, InGaN, InN, InAlGaN, and AlInN. The second conductive semiconductor layer 140 may be a p-type semiconductor layer doped with a p-type dopant such as Mg, Zn, Ca, Sr, or Ba.

Meanwhile, the semiconductor structure 120 may be formed by sequentially forming the first conductive semiconductor layer 130, the active layer 150, and the second conductive semiconductor layer 140, and then etching a partial region of the first conductive semiconductor layer 130, the active layer 150, and the second conductive semiconductor layer 140. That is, the first conductive semiconductor layer 130, the active layer 150, and the second conductive semiconductor layer 140 are disposed to have the same area, and then etching may be performed from the second conductive semiconductor layer 140 to a partial region of the first conductive semiconductor layer 130. Thus, after the etching is performed, the partial region of the first conductive semiconductor layer 130 may be exposed.

In this manner, as shown in FIGS. 3 and 4, an upper portion (an upper portion of the first conductive semiconductor layer 130, and the active layer 150 and the second conductive semiconductor layer 140) of the semiconductor structure 120 may have a shape protruding from the partial region of the first conductive semiconductor layer 130. Accordingly, the area of the active layer 150 is relatively smaller than an area of the first conductive semiconductor layer 130, and thus the high-speed operation of the semiconductor device 100 may be implemented due to the reduced capacitance.

The active layer 150 and the first conductive semiconductor layer 130 are illustrated in FIGS. 3 and 4 to be disposed such that a major axis length (in the X-axis direction) and a minor axis length (in a Y-axis direction) of the active layer 150 are shorter than a major axis length and a minor axis length of the first conductive semiconductor layer 130, respectively. However, the present invention is not limited thereto. In addition, a method of manufacturing the semiconductor structure 120 of the present invention is not limited to those described above.

Meanwhile, referring to FIG. 3, the light-emitting part 5a may include a first-first surface 5a-1 facing the light modulating part 5b, and a first-second surface 5a-2 facing the first-first surface 5a-1. Further, the light modulating part 5b may include a second-first surface 5b-1 facing the light-emitting part 5a. Here, the length of the first-first surface 5a-1 may be equal to or smaller than the length of the second-first surface 5b-1. In addition, the length of the first-second surface 5a-2 may be longer than the length of the first-first surface 5a-1 and the length of the second-first surface 5b-1. This will be described later.

The second conductive semiconductor layer 140 may include a second-conductive-type first semiconductor layer 140a corresponding to the light-emitting part 5a, a second conductive type second semiconductor layer 140b corresponding to the light modulating part 5b, and a second conductive type third semiconductor layer 140c corresponding to the spacer region 5c. The second conductive semiconductor layer 140 may include a first surface 140-1 in contact with the active layer 150, and a second surface 140-2 facing the first surface 140-1.

A groove H having a certain depth from the second surface 140-2 of the second conductive semiconductor layer 140 may be formed in the spacer region 5c. That is, the spacer region 5c may be a region in which the groove H of a certain depth is formed by etching. The spacer region 5c may refer to a region between one side end and the other side end of the etched groove H.

In the semiconductor device 100 according to the present invention, the light-emitting part 5a and the light modulating part 5b may be integrally formed on the substrate 110. That is, since the waveguide layer (the active layer 150) of the light-emitting part 5a and the waveguide layer (the active layer 150) of the light modulating part 5b are continuously formed, a structure for minimizing the interference between the light-emitting part 5a and the light modulating part 5b may be required. Thus, a portion of the second conductive semiconductor layer 140 may be etched to separate the light-emitting part 5a from the light modulating part 5b. That is, in the semiconductor device 100 according to the present invention, a portion of the second conductive semiconductor layer 140 between the light-emitting part 5a and the light modulating part 5b may be etched to form the spacer region 5c.

In particular, referring to FIG. 5, the second conductive type third semiconductor layer 140c may be formed to have a thickness smaller than thicknesses of the second conductive type first and second semiconductor layers 140a and 140b. That is, the second conductive type third semiconductor layer 140c may be collectively referred to as a portion of the second conductive semiconductor layer 140 that is etched and has a relatively small thickness. Thus, the minimum thickness of the etched second conductive type third semiconductor layer 140c may be smaller than the thicknesses of the unetched second conductive type first and second semiconductor layers 140a and 140b.

Since the second conductive type third semiconductor layer 140c is formed to be thinner than the second conductive type first and second semiconductor layers 140a and 140b, electrical resistance in the second conductive type third semiconductor layer 140c may increase. That is, a current flowing in the second conductive type third semiconductor layer 140c may be minimized, and the second conductive type first and second semiconductor layers 140a and 140b may be electrically insulated from each other. Thus, the flow of the current in the first direction may be suppressed by the spacer region 5c, and electrical interference between the light-emitting part 5a and the light modulating part 5b may be minimized.

Connection surfaces of the second conductive type third semiconductor layer 140c and the second conductive type first and second semiconductor layers 140a and 140b are illustrated in FIG. 5 to have an inclined surface. This is due to the fact that when the second conductive semiconductor layer 140 of the spacer region 5c is etched, a center portion may be more actively etched. However, the present invention is not limited thereto, and the second conductive type third semiconductor layer 140c may have various shapes after the etching is performed.

In the second conductive semiconductor layer 140, a minimum thickness T2 may be 0.1 to 0.5 times a maximum thickness T1. Here, the maximum thickness T1 of the second conductive semiconductor layer 140 may be the thickness (the maximum thickness) of the second-conductive-type first semiconductor layer 140a or the second conductive type second semiconductor layer 140b. That is, the maximum thickness T1 of the second conductive semiconductor layer 140 may be the thickness of the unetched region. In addition, the minimum thickness T2 of the second conductive semiconductor layer 140 may be the minimum thickness of the second conductive type third semiconductor layer 140c. That is, the minimum thickness T2 of the second conductive semiconductor layer 140 may be the thickness of a region etched at maximum. Therefore, a maximum depth T3 of the second conductive semiconductor layer 140 to be etched may be 0.5 to 0.9 times the maximum thickness T1.

In the second conductive semiconductor layer 140, when the minimum thickness T2 is less than 0.1 times the maximum thickness T1, a light path may not be sufficiently secured. Specifically, the light may be spread not only in the active layer 150 but also in partial regions of the first and second conductive semiconductor layers 130 and 140 adjacent to the active layer 150. This may be because the light has diffusibility. That is, the light moves along the active layer 150 and the partial regions of the first and second conductive semiconductor layers 130 and 140 adjacent to the active layer 150. Thus, when the thickness of the second conductive type third semiconductor layer 140c is too thin, since the light path may become too small, a light loss may occur. Also, damage may occur to the active layer 150 under the second conductive type third semiconductor layer 140c because the thickness of the second conductive type third semiconductor layer 140c becomes too thin.

When the minimum thickness T2 of the second conductive semiconductor layer 140 is greater than 0.5 times the maximum thickness T1, the electrical interference may occur between the light-emitting part 5a and the light modulating part 5b. That is, the second conductive type third semiconductor layer 140c may not have a resistance value to the extent that the interference between the light-emitting part 5a and the light modulating part 5b is prevented.

A width D1 of the second conductive type third semiconductor layer 140c may be in a range of 5 μm to 50 μm. Here, the width D1 of the second conductive type third semiconductor layer 140c may be a width D1 of the spacer region 5c. That is, the width D1 of the second conductive type third semiconductor layer 140c may be a separation distance between the light-emitting part 5a and the light modulating part 5b.

When the width D1 of the second conductive type third semiconductor layer 140c is smaller than 5 μm, insulation between the light-emitting part 5a and the light modulating part 5b may not be achieved. That is, since the distance between the light-emitting part 5a and the light modulating part 5b is too close, the electrical interference may occur therebetween.

When the width D1 of the second conductive type third semiconductor layer 140c is greater than 50 µm, a light loss may occur between the light-emitting part 5a and the light modulating part 5b. That is, since the distance between the light-emitting part 5a and the light modulating part 5b is too long, the light loss may occur.

The first electrode 161 may be disposed on the first conductive semiconductor layer 130. Specifically, the first electrode 161 may be disposed on a region of the first conductive semiconductor layer 130 on which the active layer 150 and the second conductive semiconductor layer 140 are not disposed. Further, the first electrode 161 may be disposed on a partial region of the first conductive semiconductor layer 130, which is exposed after the etching is performed. The first electrode 161 is illustrated in the drawing to overlap the light-emitting part 5a, the light modulating part 5b, and the spacer region 5c in a second direction (a Y-axis direction), but the present invention is not limited thereto.

The first electrode 161 may be electrically connected to the first conductive semiconductor layer 130. The first electrode 161 may be formed of a material selected from among Ti, Ru, Rh, Ir, Mg, Zn, Al, In, Ta, Pd, Co, Ni, Si, Ge, Ag, Au, and selective alloys thereof.

The second electrodes 162a and 162b may be disposed on the semiconductor structure 120. The second electrodes 162a and 162b may be formed of the same material as that of the first electrode 161.

The second electrodes 162a and 162b may include a second-first electrode 162a and a second-second electrode 162b. Here, the second-first electrode 162a may be disposed in the light-emitting part 5a, and the second-second electrode 162b may be disposed in the light modulating part 5b. The second-first electrode 162a and the second-second electrode 162b may be spaced apart from each other.

The second-first electrode 162a may cover the entire upper surface of the light-emitting part 5a. Accordingly, the semiconductor structure corresponding to the light-emitting part 5a may be disposed inside (under) the second-first electrode 162a. The second-second electrode 162b may cover the entire upper surface of the light modulating part 5b. Accordingly, the semiconductor structure corresponding to the light modulating part 5b may be disposed inside (under) the second-second electrode 162b. That is, the second-first electrode 162a may be disposed on the second-conductive-type first semiconductor layer 140a, and the second-second electrode 162b may be disposed on the second conductive type second semiconductor layer 140b.

The second-second electrode 162b may include a first region 162b-1 facing the second-first electrode 162a. In this case, the first region 162b-1 may be a surface of the second-second electrode 162b, which faces the second-first electrode 162a by being disposed closest to the second-first electrode 162a.

The second-first electrode 162a may include a second region 162a-1 facing the second-second electrode 162b. In this case, the second region 162a-1 may be a surface of the second-first electrode 162a, which faces the second-second electrode 162b by being disposed closest to the second-second electrode 162b. That is, the second region 162a-1 and the first region 162b-1 may be disposed to face each other.

The second-first electrode 162a may further include a third region 162a-2 facing the second region 162a-1 on an opposite side of the second region 162a-1. The third region 162a-2 may be a surface of the second-first electrode 162a, which is disposed farthest from the second-second electrode 162b. The third region 162a-2 and the second region 162a-1 may be surfaces disposed on ends of one side and the other side of the second-first electrode 162a in the X-axis direction.

A length W1 of the first region 162b-1, a length W2 of the second region 162a-1, and a length W3 of the third region 162a-2 may have a relationship of W3>W1≥W2. This relationship may be equally applied to the lengths of the second conductive semiconductor layer 140 and the active layer 150 disposed under the second-first and second-second electrodes 162a and 162b. Specifically, the active layer 150, the second conductive semiconductor layer 140, and the second-first and second-second electrodes 162a and 162b may have the same area and may be sequentially laminated. This will be described later.

The second-first electrode 162a and the second-second electrode 162b may each be disposed on the regions of the second conductive semiconductor layer 140, which are spaced apart from each other, and thus may be electrically insulated from each other. That is, the second electrodes 162a and 162b of the light-emitting part 5a and the light modulating part 5b, which are electrically connected to the second conductive type semiconductor layers 140a and 140b, may be driven independently due to the spacer region 5c. On the other hand, the first electrode 161 electrically connected to the first conductive semiconductor layer 130 may act as a common electrode of the light-emitting part 5a and the light modulating part 5b.

Electrode pads (not shown) may be further disposed on the first electrode 161 and the second electrodes 162a and 162b. The semiconductor device 100 may be connected to an external device through the electrode pads and driven.

Further, an insulating layer (not shown) may be disposed on a region of the semiconductor device 100, on which the electrodes 161, 162a, and 162b and a reflective layer 170 to be described below are not disposed, to provide electrical insulation from the outside.

FIGS. 6A to 6C are plan views according to various modified examples of the semiconductor device according to the embodiment of the present invention.

FIG. 6A may be a plan view of the semiconductor device 100 shown in FIG. 3. Here, a first electrode 161 is omitted for convenience of description. Hereinafter, lengths of a light-emitting part 5a and a light modulating part 5b in a second direction (a Y-axis direction) will be described with reference to FIGS. 3 to 5 described above.

Referring to FIG. 6A, a second-first electrode 162a may be disposed on the light-emitting part 5a, and a second-second electrode 162b may be disposed on the light modulating part 5b.

The second-second electrode 162b may include a first region 162b-1. Here, the first region 162b-1 may be a surface of the second-second electrode 162b, which faces the second-first electrode 162a.

The second-first electrode 162a may include a second region 162a-1 and a third region 162a-2. Here, the second region 162a-1 may be a surface of the second-first electrode 162a, which faces the second-second electrode 162b. That is, the second region 162a-1 and the first region 162b-1 may be disposed to face each other. Further, the third region 162a-2 may be a surface of the second-first electrode 162a, which is disposed on an opposite side of the second region 162a-1. That is, the second region 162a-1 and the third region 162a-2 may be surfaces disposed at both ends of the second-first electrode 162a in a first direction (an X-axis direction).

Meanwhile, as described above with reference to FIG. 3, the light-emitting part 5a may include a first-first surface 5a-1 facing the light modulating part 5b, and a first-second surface 5a-2 facing the first-first surface 5a-1. The first-first surface 5a-1 and the first-second surface 5a-2 may mean surfaces disposed at both ends of the light-emitting part 5a, respectively, in the first direction (the X-axis direction). The light modulating part 5b may include a second-first surface 5b-1 facing the light-emitting part 5a. The second-first surface 5b-1 may mean a surface disposed at one side end of the light modulating part 5b in the first direction.

Here, the first-first surface 5a-1 and the first-second surface 5a-2 of the light-emitting part 5a may include surfaces disposed at both ends of an upper portion of a first conductive semiconductor layer 130, an active layer 150, a second-conductive-type first semiconductor layer 140a, and the second-first electrode 162a, which are disposed in the light-emitting part 5a. In addition, the second-first surface 5b-1 of the light modulating part 5b may include surfaces disposed one side ends of the upper portion of the first conductive semiconductor layer 130, the active layer 150, the second conductive type second semiconductor layer 140b, and the second-second electrode 162b, which are disposed in the light modulating part 5b.

Further, the upper portion of the first conductive semiconductor layer 130, the active layer 150, and the second-conductive-type first semiconductor layer 140a of the light-emitting part 5a are etched together, and thus may have the same area. Here, the second-first electrode 162a disposed so as to cover the light-emitting part 5a may also have the same area. In addition, the upper portion of the first conductive semiconductor layer 130, the active layer 150, and the second conductive type second semiconductor layer 140b of the light modulating part 5b are etched together, and thus may have the same area. Here, the second-second electrode 162b disposed so as to cover the light modulating part 5b may also have the same area. Thus, length relationships thereof may also be made equal to each other.

That is, the first-first surface 5a-1 may include the second region 162a-1, the first-second surface 5a-2 may include the third region 162a-2, and the second-first surface 5b-1 may include the first region 162b-1. Since each layer constituting the light-emitting part 5a has an area corresponding to each other, and each layer constituting the light modulating part 5b has an area corresponding to each other, the following descriptions will focus on the lengths of the second-first electrode 162a and the second-second electrode 162b disposed on the uppermost portion.

The first region 162b-1 may have a first length W1, the second region 162a-1 may have a second length W2, and the third region 162a-2 may have a third length W3. Here, the first, second, and third lengths W1, W2, and W3 may be lengths in the second direction (the Y-axis direction). Further, the second direction may be a direction perpendicular to the first direction (the X-axis direction) in which light travels. Further, the second direction may be a direction perpendicular to a third direction (a Z-axis direction) in which the first conductive semiconductor layer 130, the active layer 150, and the second conductive semiconductor layer 140 are disposed.

Meanwhile, the first length W1 may be a width of the upper portion of the first conductive semiconductor layer 130, the active layer 150, and the second conductive type second semiconductor layer 140b, which are disposed on the second-first surface 5b-1. The second length W2 may be a width of the upper portion of the first conductive semiconductor layer 130, the active layer 150, and the second-conductive-type first semiconductor layer 140a, which are disposed on the first-first surface 5a-1. The third length W3 may be a width of the upper portion of the first conductive semiconductor layer 130, the active layer 150, and the second-conductive-type first semiconductor layer 140a, which are disposed on the first-second surface 5a-2.

The first, second, and third lengths W1, W2, and W3 may have a relationship of W2≤W1<W3. Here, a width of the spacer region 5c may be equal to that of the second length W2. However, the present invention is not limited thereto.

In the semiconductor device 100 according to the present invention, the active layer 150 may be formed to have a small area for reducing capacitance. Particularly, high-speed modulation may be enabled by forming the first length W1 of the light modulating part 5b to be small. Here, the light-emitting part 5a and the light modulating part 5b may be connected to each other by a waveguide layer (the active layer). Accordingly, the second length W2 of the first-first surface 5a-1 of the light-emitting part 5a, through which the light is emitted, may be formed to correspond to the first length W1.

That is, the second length W2 may be equal to or less than the first length W1. When the second length W2 is greater than the first length W1, the width of the waveguide layer of the light-emitting part 5a becomes greater, so that a light loss may occur. In other words, since a width of a light emission part of the light-emitting part 5a becomes greater than a width of an input end of the light modulating part 5b, the light loss may occur.

Meanwhile, the second length W2 may have a value of 0.1 times or more the first length W1. When the second length W2 is smaller than 0.1 times the first length W1, the width of the light emission part 5a-1 of the light-emitting part 5a is significantly reduced, so that the light intensity may be weakened.

Further, an operating voltage of the light-emitting part 5a may be inversely proportional to an area of the light-emitting part 5a. That is, when the second length W2 is reduced, the area of the light-emitting part 5a becomes relatively small so that the operating voltage and power consumption increase while driving the device, and thus heat may be generated. This may lead to deterioration of the device and shortening of the lifespan of the device. In order to prevent this, the third length W3 may have a value greater than the second length W2. That is, the reduction in area due to the short formation of the first-first surface 5a-1 may be compensated by forming the first-second surface 5a-2 longer.

The third length W3 may be 2 to 50 times the second length W2. When the third length W3 has a value smaller than twice the second length W2, the operating voltage of the light-emitting part 5a may increase. When the third length W3 is greater than 50 times the second length W2, it may be inefficient as the entire area of the device is widened correspondingly.

In addition, the third length W3 may have a value greater than the first length W1. When the third length W3 is equal to or less than the first length W1, the area of the light-emitting part 5a may be significantly reduced. That is, due to the second length W2 smaller than the third length W3, the area of the light-emitting part 5a may be reduced to significantly increase the operating voltage.

Meanwhile, in a first modified example according to FIG. 6A, the light-emitting part 5a may be disposed in a tapered structure. That is, the width of the light-emitting part 5a may be gradually reduced from the third region 162a-2 to the second region 162a-1. Here, the length W3 of the third region 162a-2 is greater than the length W2 of the second region 162a-1. Also, the length W1 of the first region 162b-1 of the light modulating part 5b is greater than the length W2 of the second region 162a-1. However, the present invention is not limited to such a form, and all forms satisfying W3>W1≥W2 may be applied.

Referring to a second modified example according to FIG. 6B, the light-emitting part 5a may be disposed so as to have the same width in a predetermined section in a first direction from the third region 162a-2 and then to be gradually narrower to the second region 162a-1. Further, the width of the light modulating part 5b may be greater than that of the second region 162a-1 and smaller than that of the third region 162a-2. That is, the first length W1, the second length W2, and the third length W3 in FIG. 6B may have a relationship of W3>W1≥W2.

Further, referring to FIG. 6C, the light-emitting part 5a has a tapered structure similar to FIG. 6A, but the third region 162a-2 may have a curved shape. That is, the third length W3 may be longer than a third-first length W3' having a straight line shape by having a curved shape. In this case, the area of the light-emitting part 5a is further increased, so that the effect of reducing an operating voltage and power consumption may be increased. Meanwhile, the first length W1, the second length W2, and the third length W3 of the modified example in FIG. 6C may also have a relationship of W3>W1≥W2, although their shapes are different.

As described above, in the semiconductor device according to the present invention, the first length W1, the second length W2, and the third length W3 may have the relationship of W3>W1≥W2. In particular, as long as the relationship is satisfied, the light-emitting part 5a and the light modulating part 5b may be disposed in any shape.

Meanwhile, the width of the light-emitting part 5a in the first direction is illustrated in the drawing to be longer than the width of the light modulating part 5b in the first direction. However, the present invention is not limited thereto.

The semiconductor device according to the present invention may minimize the light loss by forming the second length W2 of the light emission part (the first-first surface 5a-1 or the second region 162a-1) of the light-emitting part 5a to be equal to or less than the first length W1 of the input end (the second-first surface 5b-1 or the first region 162b-1) of light modulating part 5b. Thus, the intensity of the light incident on the light modulating part 5b may be increased, and the stability and a transmission distance of the signal may be increased.

In addition, the light-emitting part 5a may be disposed such that the third length W3 of the first-second surface 5a-2 (the third region 162a-2) is greater than the second length W2 of the first-first surface 5a-1 (the second region 162a-1). Thus, the area of the light-emitting part 5a may be further increased to reduce the operating voltage and the power consumption during driving. Further, since heat generation may be reduced, reliability and lifespan of the light-emitting part 5a may be improved.

FIG. 7 is an enlarged view of a region, which is corresponding to the portion F in FIG. 4, in according to another embodiment a semiconductor device.

Referring to FIG. 7, according to another embodiment of a semiconductor device, semiconductor device may include a light-emitting part 5a, a light modulating part 5b, and a spacer region 5c. Further, the semiconductor device may include a substrate 110 (refer to FIG. 3), a semiconductor structure 120, electrodes 161, 162a, and 162b (refer to FIG. 3), and a reflective layer 170. That is, the semiconductor device according to another embodiment is the same as the above-described embodiment except that the reflective layer 170 is further disposed. Thus, only the structure of the reflective layer 170 will be described below.

The reflective layer 170 may be disposed on a second conductive semiconductor layer 140 disposed between the light-emitting part 5a and the light modulating part 5b. The reflective layer 170 may be disposed on an etched region of the second conductive semiconductor layer 140. That is, the reflective layer 170 may be disposed on a second conductive type third semiconductor layer 140c of the spacer region 5c. In addition, the reflective layer 170 may be disposed not only on the second conductive type third semiconductor layer 140c but also on portions of second-first and second-second electrodes 162a and 162b. However, the present invention is not limited thereto.

The reflective layer 170 may be disposed by laminating at least two layers having different refractive indices. In addition, the at least two layers having different refractive indices may be alternately laminated at least once or more. The reflective layer 170 may be one selected from a distribute Bragg reflector (DBR) and an omni-directional reflector (OBR), or a combination thereof.

Light loss in the second conductive type third semiconductor layer 140c having a relatively small thickness may be minimized by disposing the reflective layer 170 on the second conductive type third semiconductor layer 140c. Specifically, light may be diffused not only to an active layer 150 but also to a partial region of the periphery thereof. Here, the light passing through the spacer region 5c may be scattered and lost to the outside due to the discontinuity of the refractive indices and the structure between the light-emitting part 5a and the light modulating part 5b. In addition, since the thickness of the second conductive type third semiconductor layer 140c disposed in the spacer region 5c is relatively thin, the light may be scattered and lost to the outside. Thus, the light scattered to the outside may be minimized by disposing the reflective layer 170 on the spacer region 5c.

As described above, the semiconductor device 100 according to the present invention may minimize the light loss by causing the light to be reflected to the inside thereof due to the reflective layer 170. Further, since the optical output may be improved, the power consumption may be reduced, and the lifespan of the light-emitting part may be improved.

FIG. 8 is a graph illustrating current values according to the voltages of the semiconductor device according to the embodiment of the present invention and a semiconductor device according to Comparative Example of the present invention.

In the case of Example 1 (N1), the semiconductor device is implemented such that the first length W1, the second length W2, and the third length W3 have the relation of W3>W1≥W2 according to the embodiment described in FIG. 6A of the present invention. In the case of Comparative Example 1 (N2), a semiconductor device is implemented by making the first length W1, the second length W2, and the third length W3 the same. Here, the first lengths of Example 1 (N1) and Comparative Example 1 (N2) may be the same.

Referring to FIG. 8, it may be seen that a voltage value of Example 1 (N1) is smaller than a voltage value of Comparative Example 1 (N2) at the same current value. That is, the area of the light-emitting part 5a in Example 1 (N1) is relatively greater than that in Comparative Example 1 (N2), so that the resistance of Example 1 (N1) may be lower than that of the Comparative Example 1 (N2).

As described above, in the semiconductor device according to the present invention, the light-emitting part 5a may be formed such that the lengths of the first-first surface 5a-1 and the first-second surface 5a-2 are different from each other. That is, the light-emitting part 5a may be formed such that the length of the first-second surface 5a-2 is longer than the length of the first-first surface 5a-1. Therefore, the light-emitting part 5a of the present invention may have a great area than that in the case in which the lengths of the first-first and first-second surfaces are the same. In this manner, the light-emitting device of the present invention may reduce the operating voltage and the power consumption during driving. Further, since a heat generation phenomenon is improved, the lifespan and reliability of the device may be improved.

<A Semiconductor Device According to a Second Embodiment>

FIG. 9 is a plan view of a semiconductor device according to another embodiment of the present invention, FIG. 10 is a cross-sectional view taken along line A-A of FIG. 9, and FIG. 11 is a cross-sectional view taken along line B-B of FIG. 9.

Referring to FIGS. 9 and 10, a semiconductor device 200 according to another embodiment may include a semiconductor structure 220 having a light-emitting region P1', an insulating region P3', and a modulation region P2', which are disposed in a first direction (an X-axis direction), and a first electrode 230, a second-first electrode 240, and a second-second electrode 250, which are disposed on the semiconductor structure 220.

The semiconductor structure 220 may include a first conductive semiconductor layer 221, a first clad layer 222, a waveguide layer 280, a second clad layer 227, and a second conductive semiconductor layer 228, which are disposed on a substrate 210.

The substrate 210 may be a transparent substrate, a conductive substrate, or an insulating substrate. For example, the substrate 210 may include at least one of sapphire (Al2O3), SiC, Si, GaAs, GaN, ZnO, GaP, InP, Ge, and Ga2O3, but the present invention is not limited thereto. Uneven portions may be formed on an upper surface of the substrate 210.

The first conductive semiconductor layer 221 may be disposed on the substrate 210. The first conductive semiconductor layer 221 may be implemented with at least one of Group III-V and Group II-VI compound semiconductors. The first conductive semiconductor layer 221 may be formed of a semiconductor material having a composition formula of, for example, InxAlyGa1-x-yN (0≤x≤1, 0≤y≤1, 0≤x+y≤1).

For example, the first conductive semiconductor layer 221 may include at least one of GaN, AlN, AlGaN, InGaN, InN, InAlGaN, and AlInN. The first conductive semiconductor layer 221 may be an n-type semiconductor layer doped with an n-type dopant such as Si, Ge, Sn, Se, or Te.

The first clad layer 222 may be disposed on the first conductive semiconductor layer 221. A refractive index of the first clad layer 222 may be lower than that of an active layer 225. Thus, the first clad layer 222 may perform the role of reflecting light emitted from the active layer 225.

The first clad layer 222 may be formed of a semiconductor material having a composition formula of $Al_pGa_{1-p}N$ (0<p<1). The first clad layer 222 may have a relatively high Al composition so as to have a refractive index lower than that of the active layer 225. The first clad layer 222 may be an n-type semiconductor layer doped with an n-type dopant such as Si, Ge, Sn, Se, or Te, but the present invention is not necessarily limited thereto.

The waveguide layer may be disposed on the first clad layer 222. The waveguide layer may guide the light generated in the light-emitting region P1' in the first direction (the X-axis direction). The light guided in the first direction may be selectively absorbed in or transmitted through the modulation region P2'.

The waveguide layer 221 according to the embodiment may include a first waveguide layer 223, the active layer 225, a second waveguide layer 226, and an absorbing layer 224.

The first waveguide layer 223 may be disposed on the first clad layer 222 to guide the light emitted from the active layer 225 in the first direction. A refractive index of the first waveguide layer 223 may be greater than that of the first clad layer 222. The first waveguide layer 223 may be formed of a semiconductor material having a composition formula of InxAlyGa1-x-yN (0≤x≤1, 0≤y≤1, 0≤x+y≤1). For example, the first waveguide layer 223 may include GaN, but the present invention is not necessarily limited thereto. The first waveguide layer 223 may be doped with a dopant The active layer 225 may be disposed on the first waveguide layer 223. The active layer 225 is a layer at which electrons (or holes) injected through the first conductive semiconductor layer 221 and holes (or electrons) injected through the second conductive semiconductor layer 228 meet.

The active layer 225 may be implemented with, for example, at least one of Group III-V and Group II-VI compound semiconductors. When the active layer 225 is implemented as a multi-well structure, the active layer 225 may include a plurality of well layers 225a and a plurality of barrier layers 225b, which are alternately disposed, but the present invention is not limited thereto.

The active layer 225 may be formed of a semiconductor material having a composition formula of, for example, InxAlyGa1-x-yN (0≤x≤1, 0≤y≤1, 0≤x+y≤1). The active layer 225 may include at least one of pairs of InGaN/GaN, GaN/AlGaN, AlGaN/AlGaN, InGaN/AlGaN, and InGaN/InGaN.

When a direct current is injected, the active layer 225 in the light-emitting region P1' may generate a first light having a wavelength band of 400 nm to 450 nm. However, the present invention is not limited thereto, and an emission wavelength band may be adjusted according to the composition of a material, for example, the content of gallium such as InxGa1-xN, AlxGa1-xN or InxGa1-xAs, AlxGa1-xAs, or the like. When a reverse bias is applied, the active layer 225 in the modulation region P2' may absorb the light emitted from the light-emitting region P1'.

The second waveguide layer 226 may guide the light emitted from the active layer 225 in the first direction (the X1 axis direction). A refractive index of the second waveguide layer 226 may be greater than that of the second clad layer 227.

The second waveguide layer 226 may be formed of a semiconductor material having a composition formula of InxAlyGa1-x-yN (0≤x≤1, 0≤y≤1, 0≤x+y≤1). As an example, the second waveguide layer 226 may be formed of a material including GaN or Ga, but the present invention is not necessarily limited thereto. The second waveguide layer 226 may not include a first dopant or a second dopant. When the second waveguide layer 226 is disposed between the active layer 225 and a P-type conductive semiconductor layer, the second waveguide layer 226 may include the second dopant such as Mg to enhance carrier (e.g., hole) injection efficiency.

The absorbing layer 224 may be disposed between the first clad layer 222 and the active layer 225 to absorb a portion of the wavelength of the light emitted from the active layer 225. Accordingly, full width at half maximum (FWHM) of the emission wavelength may be narrowed while the emitted light is being guided in the first direction. The absorbing layer 224 will be described in detail below.

The second clad layer 227 may be disposed on the second waveguide layer 226. A refractive index of the second clad layer 227 may be lower than those of the active layer 225 and the second waveguide layer 226. Thus, the second clad layer 227 may perform the role of reflecting the light traveling from the active layer 225 toward the second conductive semiconductor layer 228. The second clad layer 227 may be formed of a semiconductor material having a composition formula of $Al_pGa_{1-p}N$ ($0<p<1$). The second clad layer 227 may be a p-type semiconductor layer doped with a p-type dopant such as Mg, Zn, Ca, Sr, or Ba, but the present invention is not necessarily limited thereto.

The second conductive semiconductor layer 228 may be disposed on the second clad layer 227. The second conductive semiconductor layer 228 may be implemented with at least one of Group III-V and Group II-VI compound semiconductors. The second conductive semiconductor layer 228 may be formed of a semiconductor material having a composition formula of, for example, InxAlyGa1-x-yN ($0\leq x\leq 1$, $0\leq y\leq 1$, $0\leq x+y\leq 1$).

For example, the second conductive semiconductor layer 228 may include at least one of GaN, AlN, AlGaN, InGaN, InN, InAlGaN, and AlInN. The second conductive semiconductor layer 228 may be a p-type semiconductor layer doped with a p-type dopant such as Mg, Zn, Ca, Sr, or Ba.

The light generated in the active layer 225 may travel in the first direction (the X-axis direction) along the first and second waveguide layers 223 and 226. The semiconductor structure 220 may include the first clad layer 222, the first waveguide layer 223, the active layer 225, the second waveguide layer 226, and the second clad layer 227, and the semiconductor structure 220 may have a waveguide structure formed by removing a partial region of the second conductive semiconductor layer 228 to be relatively thin in a second direction (a Y-axis direction).

The waveguide structure of the semiconductor structure 220 may include the light-emitting region P1' configured to generate the light of a certain wavelength band, the modulation region P2' configured to transmit and absorb the light selectively, and the insulating region P3' configured to partition the light-emitting region P1' and the modulation region P2'. In the embodiment, one semiconductor structure 220 may have an integral structure including the light-emitting region P1' and the modulation region P2'.

The light-emitting region P1' and the modulation region P2' may share the first conductive semiconductor layer 221, the first clad layer 222, and the active layer 225, while the second conductive semiconductor layer 228 may be electrically separated by the insulating region P3'. The second clad layer 227 may also be electrically separated as necessary.

The insulating region P3' may have a high resistance such that the light-emitting region P1' and the modulation region P2' may be controlled independently. The insulating region P3' may be formed by forming a recess or implanting ions. The insulating region P3' may prevent the current injected into the light-emitting region P1' from leaking into the modulation region P2'.

The insulating region P3' may be disposed between an input end of the modulation region P2' and an output end of the light-emitting region P1'. The light emitted from the light-emitting region P1' may be incident on the modulation region P2' through the insulating region P3'.

The modulation region P2' may transmit or absorb the incident light. The light passing through the modulation region P2' may be emitted to the outside.

The first electrode 230 may be disposed on the first conductive semiconductor layer 221 to apply power to the light-emitting region P1' and the modulation region P2'. That is, the first electrode 230 may serve as a common electrode. The area of the first electrode 230 is not specifically limited.

The first electrode 230 may be disposed so as to overlap the insulating region P3' in the second direction (the Y-axis direction). The uniformity of an electric field applied to the light-emitting region P1' and the modulation region P2' may be improved by disposing the first electrode 230 so as to overlap the insulating region P3' in the second direction.

The second-first electrode 240 is disposed on a second conductive semiconductor layer 228a (hereinafter referred to as a second-first conductive semiconductor layer) of the light-emitting region P1' to apply the power to the light-emitting region P1'. When the current is injected through the second-first electrode 240, the active layer 225 of the light-emitting region P1' may emit light. The second-first electrode 240 may be disposed to have a greater width than a width of the light-emitting region P1' in the second direction (the Y-axis direction). That is, the second-first electrode 240 may completely cover an upper surface and side surfaces of the light-emitting region P1'. Thus, the light is not emitted to the upper surface and the side surfaces of the light-emitting region P1', so that an extinction ratio of the optical signal may be improved.

The second-second electrode 250 is disposed on a second conductive semiconductor layer 228b (hereinafter referred to as a second-second conductive semiconductor layer) of the modulation region P2' to apply a lower bias or a reverse bias with respect to the bias applied to the light-emitting region P1'. The modulation region P2' may transmit the light when the reverse bias is applied and may absorb the light when the reverse bias is not applied. Thus, the light absorbed in or transmitted through the active layer of the modulation region P2' may be emitted through the output end of the modulation region P2' to transmit the optical signal.

The second-second electrode 250 may include a contact part 251 disposed on the second-second conductive semiconductor layer 228b of the modulation region P2', a pad part 253 connected to an external power source, and a connection part 252 connecting the pad part 253 to the contact part 251. Here, the width of the connection part 252 may become thicker toward the contact part 251 in the first direction. Thus, a phenomenon in which the modulation region P2' is damaged by a high bias may be improved.

Referring to FIGS. 9 and 11, an insulating layer 270 may be disposed between the semiconductor structure 220 and the plurality of electrodes 230, 240, and 250. The first electrode 230 may be electrically connected to the first conductive semiconductor layer 221 by a first through-hole 271 of the insulating layer 270. The second-first electrode 240 may be electrically connected to the second-first conductive semiconductor layer 228a by a second through-hole 272 of the insulating layer 270. The second-second electrode 250 may be electrically connected to the second-second conductive semiconductor layer 228b by a third through-hole 273 of the insulating layer 270.

The second-first electrode 240 and the pad part 253 of the second-second electrode 250 disposed on the light-emitting region P1' and the modulation region P2', respectively, may be disposed on the insulating layer 270 in a region outside the light-emitting region P1' and the modulation region P2'.

The first through-hole 271, the second through-hole 272, and the third through-hole 273 may be formed on the insulating layer 270, and then the first electrode 230, the second-first electrode 240, and the second-second electrode 250 may be formed. Thus, it is possible to reduce process steps of the semiconductor device 200 and to reduce the unit cost of the semiconductor device 200.

Further, since the insulating layer 270 is disposed between the first conductive semiconductor layer 221 and the second-first and second electrodes 240 and 250, a phenomenon in which the second-first electrode 240 and the second-second electrode 250 disposed outside the waveguide are electrically connected to the first conductive semiconductor layer 221 to cause a short circuit in the device may be suppressed.

Since the semiconductor structure 220 according to the embodiment has a light-emitting diode structure, the emitted light has a wide wavelength band, unlike a laser. When a light-emitting diode is used as a light source for optical communication, there are problems that a transmission distance is limited and noise is increased.

When the spectrum of a light source is wide, a moving speed of a short wavelength and a moving speed of a long wavelength may be different to generate distortion in an optical signal. That is, since the moving speed of a short wavelength component and the moving speed of a long wavelength component are different in a medium when light passes through an optical fiber, chromatic dispersion may occur depending on a refractive index of the medium through which the light travels. In order to reduce distortion due to the chromatic dispersion, it may be advantageous that FWHM of the light source is excellent.

FIG. 12 is a view illustrating the semiconductor structure of FIG. 10, FIG. 13 is a graph illustrating changes in an optical spectrum due to the absorbing layer, and FIG. 14 is a graph illustrating a result of measuring a photoluminescence (PL) spectrum of the semiconductor structure of FIG. 9.

Referring to FIG. 12, in the semiconductor structure 220 according to the embodiment, the absorbing layer 224 may be disposed between the first waveguide layer 223 and the active layer 225.

The absorbing layer 224 may absorb light of a certain wavelength band in the light emitted from the active layer 225. The absorbing layer 224 may be formed of a semiconductor material having a composition formula of, for example, $In_xAl_yGa_{1-x-y}N$ ($0 \leq x \leq 1$, $0 \leq y \leq 1$, $0 \leq x+y \leq 1$).

The absorbing layer 224 may have a structure in which a first layer 224a and a second layer 224b are alternately disposed. As an example, the absorbing layer 224 may include at least one of pairs of InGaN/GaN, GaN/AlGaN, AlGaN/AlGaN, InGaN/AlGaN, and InGaN/InGaN.

An indium composition of the first layer 224a may be less than an indium composition of the well layer 225a. The indium composition of the first layer 224a may be 80% to 95% of the indium composition of the well layer 225a. Thus, the first layer 224a may partially absorb short wavelength light in the light emitted from the well layer 225a. As an example, when the indium composition of the well layer 225a is 14%, the indium composition of the first layer 224a may be 13%.

When the indium composition of the first layer 224a is smaller than 80%, an absorption rate may be lowered by absorbing a short wavelength having a low emission intensity. As an example, when the spectrum of light is 400 nm to 450 nm and the peak is 435 nm, absorption at a wavelength of 380 nm may not affect on reducing the FWHM.

Further, when the indium composition of the first layer 224a is greater than 95%, a long wavelength is absorbed to absorb the entire wavelength band of the first light, and thus it may be difficult to reduce the FWHM. As an example, when the spectrum of the light is 400 nm to 450 nm and the wavelength band absorbed by the first layer 224a is 450 nm, the wavelengths of 450 nm or less are all absorbed, so that the FWHM may not be effectively reduced.

A thickness of the first layer 224a may be between 95% and 105% of a thickness of the well layer 225a. That is, the thickness of the first layer 224a may be similar to the thickness of the well layer 225a. Accordingly, since the first layer 224a has a smaller indium composition than the well layer 225a and a thickness similar to that of the well layer 225a, the first layer 224a may absorb short wavelength light in the light emitted from the well layer 225a.

The absorbing layer 224 of the embodiment has a structure similar to that of the active layer 225 but differs from the active layer 225 in that the absorbing layer 224 does not participate in light emission and partially absorbs the light emitted from the active layer 225.

Referring to FIG. 13, a portion of a spectrum G1 of the first light initially emitted from the light-emitting region, which intersects an absorption spectrum G2 of the absorbing layer 224, may be absorbed. Thus, an FWHM F2 of a second light finally emitted to the outside may be smaller than an FWHM F1 of the first light.

As an example, it may be seen that the FWHM may be reduced by 25% or more when the FWHM of the first light is about 16 nm and the FWHM of the second light is about 12 nm. Thus, since the chromatic dispersion problem may be reduced by reducing the FWHM, the transmission distance of the optical signal may be improved.

An intersecting point X1 between the absorption spectrum G2 of the absorbing layer 224 and the spectrum G1 of the first light may satisfy the following relational expression.

Wavelength of emission peak−FWHM of first light≤X1<wavelength of emission peak [Relational Expression 1]

That is, the intersecting point X1 may be greater than the difference between the wavelength of an emission peak P1' of the first light and the FWHM F1 of the first light, and may be smaller than the wavelength of the emission peak P1'. When the intersecting point is smaller than the difference between the wavelength of the emission peak of the first light and the FWHM of the first light, the wavelength at which the first light is absorbed is shortened, so that absorption efficiency is lowered and it is diffi'cult to reduce the FWHM effectively.

Further, when the intersecting point X1 is greater than the wavelength of the emission peak, it is difficult to reduce the FWHM effectively because the light is absorbed to the emission peak wavelength band.

As an example, when the spectrum of the peak of the first light is 433 nm, and the FWHM is 16 nm, the intersecting point X1 may be set to be greater than 417 nm and smaller than 433 nm. That is, the intersecting point X1 may have a wavelength range of 96% to 99% of the wavelength of the peak of the first light. However, the present invention is not necessarily limited thereto, and the position of the intersecting point X1 may vary depending on the degree of normalization of the emission and absorption spectra.

It may be seen that the FWHM F2 of the second light actually output is asymmetric with respect to an emission peak P2'. This is because, based on the emission peak P2', the long wavelength is maintained, while the short wavelength is absorbed so that the FWHM is decreased. According to the embodiment, since the intersecting point X1 satisfies the above-described Relational Expression 1, the ratio (F21:F22) of a width F21 on the short wavelength side to a width F22 on the long wavelength side based on the emission peak P2' may satisfy a ratio of 1:1.2 to 1:5.

Referring to FIG. 14, it may be seen that a PL curve of the semiconductor structure 220 according to the embodiment has a main emission peak P21 and a peak P22 of the absorbing layer 224. The peak P22 of the absorbing layer is obtained by measuring the wavelength band of the emitted light after the absorbing layer 224 absorbs energy when the energy is irradiated.

Here, the peak P22 of the absorbing layer 224 may satisfy the following relational expression.

Wavelength of main emission peak $P21$–FWHM $F31 \le$ wavelength of peak of absorbing layer<wavelength of main emission peak [Relational Expression 1]

In the PL curve, the wavelength of the peak P22 of the absorbing layer 224 may be greater than the difference between the wavelength of the main emission peak P21 and the FWHM F31 and may be smaller than the wavelength of the emission peak P1'. When the wavelength of the peak P22 of the absorbing layer 224 is smaller than the difference between the wavelength of the main emission peak P2 and the FWHM F31 (when it is smaller than a first range F32), the absorbed wavelength is shortened, so that the absorption efficiency is lowered and it is difficult to reduce the FWHM effectively.

Further, when the wavelength of the peak P22 of the absorbing layer 224 is greater than the wavelength of the main emission peak, it is difficult to reduce the FWHM effectively because the light is absorbed to the emission peak wavelength band.

According to the embodiment, the peak P22 of the absorbing layer 224 may be positioned within the first range F32 obtained by subtracting the FWHM F31 from the wavelength of the main emission peak P21 of the PL curve. When the spectrum of the main emission peak P21 is 451 nm and the FWHM F31 is 20 nm, the peak P22 of the absorbing layer 224 may be set such that the wavelength is greater than 431 nm and smaller than 451 nm.

Thus, since the peak of the absorbing layer 224 is positioned within the first range F32, it is possible to absorb the light of the short wavelength band effectively and to reduce the FWHM.

FIG. 15 is a view illustrating a process in which light is guided.

Referring to FIG. 15, the active layer 225 may emit a first light L11 when electrons and holes which are carriers are injected. Here, the carriers (electrons) may be injected into the active layer 225 through the first clad layer 222, the first waveguide layer 223, and the absorbing layer 224. Thus, the absorbing layer 224 may include a dopant such that the carriers are easily injected. The dopant may include n-type dopants such as Si, Ge, Sn, Se, and Te, but the present invention is not necessarily limited thereto.

A concentration of the dopant may be in a range of $1 \times 10^{17}/cm^3$ to $1 \times 10^{19}/cm^3$. When the concentration of the dopant is less than 1×10^17/cm3, the concentration of the dopant is small, and thus the injection of the carriers may not be smooth, and when the concentration of the dopant is greater than 1×10^19/cm3, the injection of the carriers (electrons) may be too excessive.

The dopant may be doped into the second layer 224b of the absorbing layer 224, but the present invention is not necessarily limited thereto. As an example, the dopant may also be dispersed in both the first layer 224a and the second layer 224b of the absorbing layer 224.

The light emitted from the active layer 225 may be absorbed in some wavelength bands thereof while passing through the absorbing layer 224. Light L12 passed through the absorbing layer 224 may be reflected from the first and second clad layers 222 and 227 and guided in the first direction.

In the modulation region P2', a reverse bias voltage may be applied to absorb or pass the light selectively. Here, the reverse bias voltage may depend on the thickness of an undoped layer. That is, the more the undoped layers, the higher the reverse bias voltage. Since the cost of driving IC chips increases when a required bias level is increased, it is advantageous to lower the reverse bias voltage.

As described above, the absorbing layer 224 may be doped with the dopant. When doping concentration is in a range of $1 \times 10^{17}/cm^3$ to $1 \times 10^{19}/cm^3$, the reverse bias voltage increased by the absorbing layer 224 may be lowered. Here, when both the first layer 224a and the second layer 224b of the absorbing layer 224 are doped with the dopant, the reverse bias voltage may be effectively lowered.

FIG. 16 is a view illustrating a modified example of the absorbing layer, and FIGS. 17A to 17C are views illustrating various arrangements of the absorbing layer and a superlattice layer.

Referring to FIG. 16, since an absorbing layer 224 has a structure similar to that of an active layer 225, light may be generated when carriers are injected into the absorbing layer 224. Thus, the absorbing layer 224 may be disposed on a position into which holes are not injected, or the injection of the holes may be intentionally suppressed.

As an example, a plurality of second layers 224b may be formed such that a thickness of the second layer 224b closest to the active layer 225 among the second layers 224b is greater than a thickness of the remaining second layers 224b. As an example, the thickness of the second layer 224b closest to the active layer 225 may be in a range of 60 Å to 200 Å.

When the thickness of the second layer 224b closest to the active layer 225 is less than 60 Å, it may be difficult to block the injection of the holes. When the thickness is greater than 200 Å, the overall thickness of a chip may be increased, and the flow of electrons may be blocked.

The second layer 224b closest to the active layer 225 may not be doped with a dopant. Thus, the resistance of the second layer 224b closest to the active layer 225 may be increased to suppress the injection of the holes.

Referring to FIG. 17A, a superlattice layer 229 may be disposed below the absorbing layer 224. The superlattice layer 229 may perform the role of mitigating lattice mismatch between the active layer 225 and the first conductive semiconductor layer 221.

The superlattice layer 229 may include a first lattice layer 229a and a second lattice layer 229b. The first lattice layer 229a may include indium. However, an indium composition of the first lattice layer 229a may be about 5%. This is because the first lattice layer 229a includes indium to mitigate lattice mismatch. Accordingly, the difference in indium composition between the well layer 225a and the first lattice layer 229a may be greater than the difference in indium composition between the well layer 225a and the first layer 224a.

However, the present invention is not necessarily limited thereto, and the absorbing layer 224 may be disposed between the active layer 225 and the superlattice layer 229 as illustrated in FIG. 17B, or the absorbing layer 224 may be disposed between superlattice layers 229-1 and 229-2 as illustrated in FIG. 17C.

The semiconductor device 200 according to the present invention may be used for 10 Gbps high-speed optical communication at a distance of 100 m or less, for example, for a short distance high-speed optical communication for a home network, an automobile, or the like. Further, since the light-emitting diode and a modulator are integrally manufactured in the semiconductor device 200 according to the present invention, reliability may be maintained at a high temperature. Thus, a separate thermoelectric cooler (TEC) may be omitted. In addition, the FWHM may be reduced to increase a transmission length and improve noise.

<A Semiconductor Device According to a Third Embodiment>

FIG. 18 is a perspective view of a semiconductor device according to still another embodiment of the present invention, FIG. 19 is a top view of the semiconductor device according to still another embodiment of the present invention, FIG. 20 is a cross-sectional view of the semiconductor device according to still another embodiment of the present invention, and FIG. 21 is an enlarged view of portion F' of FIG. 20.

Referring to FIGS. 18 to 21, a semiconductor device 300 according to still another embodiment of the present invention may include a light-emitting part 5a', a light modulating part 5b', and a connection part 5c' disposed between the light-emitting part 5a' and the light modulating part 5b'. The light-emitting part 5a' may be disposed on one side of the semiconductor device 300, the light modulating part 5b' may be disposed on the other side of the semiconductor device 300, and the connection part 5c' may be disposed between the light-emitting part 5a' and the light modulating part 5b'.

The light-emitting part 5a', the connection part 5c', and the light modulating part 5b' may be continuously disposed in the semiconductor device 300 in a first direction (an X-axis direction). Here, the first direction may be a direction in which light generated in the light-emitting part 5a' travels to the light modulating part 5b' through the connection part 5c'.

The connection part 5c' may be disposed between the light-emitting part 5a' and the light modulating part 5b' to electrically connect the light-emitting part 5a' to the light modulating part 5b'. When a reverse voltage is applied to the light modulating part 5b', a current may flow through the connection part 5c'.

An electrode may be connected to each of the light-emitting part 5a' and the light modulating part 5b'. For example, the light-emitting part 5a' may be supplied with a constant dc power to emit the light, and the light modulating part 5b' may be supplied with an ac power to modulate the light. However, the present invention is not limited to such power.

The light emitted from the light-emitting part 5a' may pass through the connection part 5c' and may be provided to the light modulating part 5b'. The light incident from the light-emitting part 5a' to an input end of the light modulating part 5b' may be absorbed in or transmitted through the light modulating part 5b'. The light modulating part 5b' may modulate an optical signal and emit the modulated optical signal through an output end disposed on an opposite side to the input end of the light modulating part 5b'. Here, the input end of the light modulating part 5b' may be an edge of the light modulating part 5b', which faces the light-emitting part 5a' most closely, and the output end may be an opposite edge facing the input end in the first direction.

The light-emitting part 5a', the connection part 5c', and the light modulating part 5b' may be integrated on a substrate 310 and manufactured simultaneously.

Thus, a light emission part (an edge of the light-emitting part 5a' facing the light modulating part 5b') of the light-emitting part 5a' and the input end (the edge of the light modulating part 5b' facing the light-emitting part 5a') of the light modulating part 5b' may be arranged to face each other in the first direction (the X-axis direction). That is, in the semiconductor device 300 according to the present invention, an alignment error between the light-emitting part 5a' and the light modulating part 5b' may be prevented, and thus light loss may be reduced, and distortion of the optical signal may be improved.

The semiconductor device 300 according to still another embodiment of the present invention includes the substrate 310, a semiconductor structure 320 disposed on the substrate 310, a first electrode 381, a second electrode 383a, and a third electrode 383b.

First, the substrate 310 may be a transparent substrate 310, a conductive substrate 310, or an insulating substrate 310. For example, the substrate 310 may include at least one of sapphire (Al2O3), SiC, Si, GaAs, GaN, ZnO, GaP, InP, Ge, and Ga2O3. However, the present invention is not limited thereto.

The semiconductor structure 320 may be disposed on an upper surface of the substrate 310. The light-emitting part 5a' may be disposed on one side of the substrate, and the light modulating part 5b' may be disposed on the other side of the substrate. In addition, the connection part 5c' may be disposed between the light-emitting part 5a' and the light modulating part 5b'.

The substrate 310 may include a plurality of protrusion parts 311. A side cross section of each of the plurality of protrusion parts may include at least one of a hemispherical shape, a polygonal shape, and an elliptical shape, and the plurality of protrusion parts may be arranged in a stripe form or a matrix form. The plurality of protrusion parts 311 scatter the light incident on the substrate 310 to improve the efficiency of light re-incident on the semiconductor structure 320.

The semiconductor structure 320 may be disposed on the substrate 310. The semiconductor structure 320 may include a first conductive semiconductor layer 330, a second conductive semiconductor layer 340, an active layer 350 disposed between the first conductive semiconductor layer 330 and the second conductive semiconductor layer 340, a first clad layer 360, and a second clad layer 370.

The first conductive semiconductor layer 330 may be disposed on the substrate 310. The first conductive semiconductor layer 330 may be implemented with at least one of Group III-V and Group II-VI compound semiconductors. The first conductive semiconductor layer 330 may be formed of a semiconductor material having a composition formula of, for example, $In_xAl_yGa_{1-x-y}N$ ($0 \leq x \leq 1$, $0 \leq y \leq 1$, $0 \leq x+y \leq 1$). For example, the first conductive semiconductor layer 330 may include at least one of GaN, AlN, AlGaN, InGaN, InN, InAlGaN, and AlInN. The first conductive semiconductor layer 330 may be an n-type semiconductor layer doped with an n-type dopant such as Si, Ge, Sn, Se, or Te.

The active layer 350 may be disposed on the first conductive semiconductor layer 330. The active layer 350 is a layer at which electrons (or holes) injected through the first conductive semiconductor layer 330 and holes (or electrons) injected through the second conductive semiconductor layer 340 meet.

The active layer 350 may be implemented with, for example, at least one of Group III-V and Group II-VI compound semiconductors. When the active layer 350 is implemented as a multi-well structure, the active layer 350 may include a plurality of well layers and a plurality of barrier layers, which are alternately disposed, but the present invention is not limited thereto. The active layer 350 may be formed of a semiconductor material having a composition formula of $In_xAl_yGa_{1-x-y}N$ ($0 \leq x \leq 1$, $0 \leq y \leq 1$, $0 \leq x+y \leq 1$). The active layer 350 may include at least one of pairs of InGaN/GaN, GaN/AlGaN, AlGaN/AlGaN, InGaN/AlGaN, and InGaN/InGaN. When the active layer 350 is made of a material that forms a bond such as a hexagonal closed packed (HCP) structure, a band gap of the active layer may be bent by spontaneous polarization, but the present invention is not limited thereto.

Meanwhile, the active layer 350 disposed in the light-emitting part 5a' may be a light-emitting layer. That is, as electrons and holes are recombined, the active layer 350 of the light-emitting part 5a' may generate the light by a band gap difference according to a material of which the active layer 350 is formed.

The active layer 350 disposed in the light modulating part 5b' may be a light modulating layer. That is, the active layer 350 of the light modulating part 5b' may absorb or transmit the light by band gap energy.

When the active layer 350 disposed in the light modulating part 5b' absorbs the light, the intensity of the light output from the output end may be weak. On the other hand, when the active layer 350 disposed in the light modulating part 5b' transmits the light, the intensity of the light output from the output end may be sufficient. According to such a configuration, the active layer 350 disposed in the light modulating part 5b' may perform the role of absorbing or transmitting the light so that the optical signal provided from the active layer 350 disposed in the light-emitting part 5a' may be modulated at the output end.

The active layer 350 disposed in the connection part 5c' may guide the light emitted from the active layer 350 of the light-emitting part 5a' to the active layer 350 of the light modulating part 5b'.

The light may be generated in the active layer 350 of the light-emitting part 5a', and the light may be modulated in the active layer 350 of the light modulating part 5b'. The light may travel in the first direction (the X-axis direction) from the active layer 350 of the light-emitting part 5a' toward the active layer 350 of the light modulating part 5b' through the active layer 350 of the connection part 5c'.

A width of the light modulating part 5b' and the light-emitting part 5a' in a second direction (a Y-axis direction) may be in a range of 2 um to 5 um in consideration of a process margin. Here, the second direction (the Y-axis direction) is a direction perpendicular to the first direction (the X-axis direction). When the width of the light modulating part 5b' and the light-emitting part 5a' in the second direction is greater than 2 urn, the yield of a process of defining the connection region between the light-emitting part 5a' and the light modulating part 5b' may be increased, and the efficiency with which the light emitted from the light-emitting part 5a' is incident on the input end of the light modulating part 5b' may be secured. Further, when the width is 5um or less, the capacitance of the light modulating part 5b' can be designed to be small, and thus the cutoff frequency of the semiconductor device 300 can be designed to be high, thereby manufacturing the semiconductor device 300 capable of operating at high speed.

The second conductive semiconductor layer 340 may be disposed on the active layer 350. The second conductive semiconductor layer 340 may be implemented with at least one of Group III-V and Group II-VI compound semiconductors. The second conductive semiconductor layer 340 may be formed of a semiconductor material having a composition formula of, for example, $In_xAl_yGa_{1-x-y}N$ ($0 \leq x \leq 1$, $0 \leq y \leq 1$, $0 \leq x+y \leq 1$).

For example, the second conductive semiconductor layer 340 may include at least one of GaN, AlN, AlGaN, InGaN, InN, InAlGaN, and AlInN. The second conductive semiconductor layer 340 may be a p-type semiconductor layer doped with a p-type dopant such as Mg, Zn, Ca, Sr, or Ba.

The first clad layer 360 may be disposed between the first conductive semiconductor layer 330 and the active layer 350. In addition, the second clad layer 370 may be disposed between the second conductive semiconductor layer 340 and the active layer 350.

The first and second clad layers 360 and 370 may confine the light in the active layer 350 so that the light moves in the first direction (the X-axis direction) in the active layer 350. To this end, the first and second clad layers 360 and 370 may be disposed with the active layer 350 therebetween.

The first and second clad layers 360 and 370 may have a refractive index and a band gap different from those of the active layer 350. For example, the first and second clad layers 360 and 370 may include Al. In addition, an Al composition of the first and second clad layers 360 and 370 may be greater than an Al composition of the active layer 350.

The first and second clad layers 360 and 370 may have a band gap greater than a band gap of the active layer 350. The first and second clad layers 360 and 370 may have a band gap different from the band gap of the active layer 350 by 0.5 eV to 1.0 eV. However, the present invention is not limited thereto.

Further, the first and second clad layers 360 and 370 may have a refractive index lower than that of the active layer 350. As a result, the emitted light may travel in the first direction. That is, the first and second clad layers 360 and 370 may confine the light so that the light is provided in the first direction.

The first clad layer 360 may be a nitride-based semiconductor. The first clad layer 360 may be formed of a semiconductor material having a composition formula of $Al_pGa_{1-p}N$ ($0<p<1$).

The first clad layer 360 may be an n-type semiconductor layer doped with an n-type dopant such as Si, Ge, Sn, Se, or Te.

The second clad layer 370 may be a nitride-based semiconductor. The second clad layer 370 may be formed of a semiconductor material having a composition formula of $Al_pGa_{1-p}N$ ($0<p<1$). The second clad layer 370 may be a p-type semiconductor layer doped with a p-type dopant such as Mg, Zn, Ca, Sr, or Ba.

The semiconductor structure 320 may include a waveguide layer so that the light emitted from the light-emitting part 5a' travels in the first direction (the X-axis direction).

The waveguide layer may include the first clad layer 360, the second clad layer 370, and the active layer 350 disposed between the first clad layer 360 and the second clad layer 370. The waveguide layer may include the first clad layer 360 and the second clad layer 370 having a refractive index different from that of the active layer 350.

Further, as described above, the active layer 350 is disposed between the first clad layer 360 and the second clad layer 370 to control the light emitted from the light-emitting part 5a' to be moved in the first direction (the X-axis direction) due to a difference in refractive index between the first clad layer 360 and the active layer 350 and a difference in refractive index between the second clad layer 370 and the active layer 350. In addition, the first clad layer 360 and the second clad layer 370 may have different refractive indices. The first electrode 381 may be disposed on the first conductive semiconductor layer 330. Specifically, the first electrode 381 may be disposed on a region of the first conductive semiconductor layer 330, on which the active layer 350 and the second conductive semiconductor layer 340 are not disposed, in the semiconductor structure 320. Accordingly, the first electrode 381 may function as a common electrode of the light-emitting part 5a' and the light modulating part 5b'.

The first electrode 381 may be electrically connected to the first conductive semiconductor layer 330. The first electrode 381 may be formed of a material selected from among Ti, Ru, Rh, Ir, Mg, Zn, Al, In, Ta, Pd, Co, Ni, Si, Ge, Ag, Au, and selective alloys thereof.

In addition, the first electrode 381 may be formed of a transparent conductive oxide (TCO) film. The TCO film may be formed of a material selected from among an indium tin oxide (ITO), an indium zinc oxide (IZO), an aluminum zinc oxide (AZO), an aluminum gallium zinc oxide (AGZO), an indium zinc tin oxide (IZTO), an indium aluminum zinc oxide (IAZO), an indium gallium zinc oxide (IGZO), an indium gallium tin oxide (IGTO), an antimony tin oxide (ATO), a gallium zinc oxide (GZO), an IZO nitride (IZON), ZnO, IrOx, RuOx, NiO, and the like.

Also, the first electrode 381 may be formed of an opaque metal, such as Ag, Ni, Al, Rh, Pd, Ir, Ru, Mg, Zn, Pt, Au, and Hf, and may be configured with one or a plurality of layers made of a mixture of a TCO film and an opaque metal, but the present invention is not limited thereto.

Also, the first electrode 381 may partially overlap the second electrode 383a in the second direction (the Y-axis direction) within a separation distance from the second electrode 383a, but the first electrode 381 is not limited to such a shape.

The second electrode 383a and the third electrode 383b may be disposed on the semiconductor structure 320. The second electrode 383a and the third electrode 383b may be formed of the same material as that of the first electrode 381.

Here, the second electrode 383a may be disposed in the light-emitting part 5a', and the third electrode 383b may be disposed in the light modulating part 5b'.

The second electrode 383a and the third electrode 383b may be disposed on the second conductive semiconductor layer 340 in the light-emitting part 5a' and the light modulating part 5b', respectively, which are spaced apart from each other. The second electrode 383a and the third electrode 383b may be electrically connected to each other through the second conductive semiconductor layer 340 of the connection part 5c'.

A ratio of a length d2 of the third electrode 383b disposed in the light modulating part 5b' to a length d1 of the second electrode 383a disposed in the light-emitting part 5a' may be in a range of 1:1 to 1:5. Here, the length d1 of the second electrode 383a disposed in the light-emitting part 5a' may correspond to a length of a first region 340a. Here, the first region 340a is the second conductive semiconductor layer 340 disposed in the light-emitting part 5a'. As an example, the length d1 of the second electrode 383a disposed in the light-emitting part 5a' may be in a range of 40 μm to 200 μm. The length d2 of the third electrode 383b disposed in the light modulating part 5b' may be 200 μm. However, the present invention is not limited to such a length, and the length may be variously applied depending on the size.

Further, the length of the second electrode 383a disposed in the light-emitting part 5a' in the first direction (the X-axis direction) is smaller than the length of the third electrode 383b disposed in the light modulating part 5b' in the first direction (the X-axis direction), but the present invention is not limited thereto.

When the ratio of the length d2 of the third electrode 383b disposed in the light modulating part 5b' to the length d1 of the second electrode 383a disposed in the light-emitting part 5a' is greater than 1:5, a capacitance value may increase, so that the semiconductor device 300 may be difficult to operate at high speed.

When the ratio of the length d2 of the third electrode 383b disposed in the light modulating part 5b' to the length d1 of the second electrode 383a disposed in the light-emitting part 5a' is smaller than 1:1, an extinction ratio may be lowered. Here, the extinction ratio is a ratio between intensities of the light output when a reverse bias and a positive bias are applied to the light modulating part 5b'.

The length d2 of the third electrode 383b disposed in the light modulating part 5b' may be in a range of 180 μm to 200 μm. In addition, the length d2 of the third electrode 383b disposed in the light modulating part 5b' may correspond to a length of a second region 340b. Here, the second region 340b is the second conductive semiconductor layer 340 disposed in the light modulating part 5b'.

The length d2 of the third electrode 383b disposed in light modulating part 5b' may correspond to a length of the active layer disposed in the light modulating part 5b'.

Thus, when the length d2 of the third electrode 383b disposed in the light modulating part 5b' is 180 μm or more, the distortion of the optical signal may be reduced by securing the extinction ratio of the semiconductor device, and when the length d2 of the third electrode 383b is smaller than 220 μm, the capacitance of the light modulating part 5b' may be designed to be small. Accordingly, the cutoff frequency of the semiconductor device 300 may be designed to be high, thereby making it possible to manufacture the semiconductor device 300 operating at high speed. A ratio of a separation distance d3 between the second electrode 383a and the third electrode 383b to the length d2 of the third electrode 383b disposed in the light modulating part 5b' may be in a range of 1:0.25 to 1:0.1. Here, the separation distance d3 between the second electrode 383a and the third electrode 383b may correspond to a length of a third region 340c. Here, the third region 340c is the second conductive semiconductor layer 340 disposed in the connection part 5c'.

As an example, when the length d2 of the third electrode 383b disposed in the light modulating part 5b' is 200 μm, the separation distance d3 between the second electrode 383a and the third electrode 383b may be in a range of 5 μm to 20 μm. However, the present invention is not limited to such a length.

When the separation distance d3 between the second electrode 383a and the third electrode 383b is smaller than 5 μm, light emission in the light-emitting part 5a' may not occur sufficiently.

When the separation distance d3 between the second electrode 383a and the third electrode 383b is greater than 20 μm, the length of the third region 340c may be increased to increase resistance.

A ratio of the shortest separation distance between the second electrode 383a and the third electrode 383b in the first direction (the X-axis direction) to the length of the second electrode 383a in the first direction (the X-axis direction) may be in a range of 1:2 to 1:40.

When the ratio of the shortest separation distance between the second electrode 383a and the third electrode 383b in the first direction (the X-axis direction) to the length of the second electrode 383a in the first direction (the X-axis direction) is smaller than 1:2, the difference in optical power output through the output end when the reverse bias or the positive bias is applied to the light modulating part is small, so that the extinction ratio may be very low.

When the ratio of the shortest separation distance between the second electrode 383a and the third electrode 383b in the first direction (the X-axis direction) to the length of the second electrode 383a in the first direction (the X-axis direction) is greater than 1:40, the length of the second electrode 383a in the first direction is increased to increase the capacitance value. Accordingly, the cutoff frequency decreases, and thus the high-speed operation may be difficult.

Further, in manufacturing the semiconductor device 300 according to still another embodiment, etching may be performed to a portion of the third region 340c of the second conductive semiconductor layer 340 in the semiconductor structure 320. Thus, the thickness of the third region 340c of the second conductive semiconductor layer 340 in the process may be less than the thickness of the first region 340a of the second conductive semiconductor layer 340 and the thickness of the second region 340b of the second conductive semiconductor layer 340.

A second-first pad 382a may be disposed on the second electrode 383a. In addition, a second-second pad 382b may be disposed on the third electrode 383b.

The second-first pad 382a and the second-second pad 382b may be disposed on the second electrode 383a and the third electrode 383b, respectively, to be electrically connected thereto. The second-first pad 382a and the second-second pad 382b may be intermediate electrodes.

The second-first pad 382a and the second-second pad 382b may include Ag, Ni, Al, Rh, Pd, Ir, Ru, Mg, Zn, Pt, Au, Hf, Au, Cr, or the like, but the present invention is not limited to such a material.

FIGS. 22A and 22B are photographs taken by observing the difference in extinction ratio depending on the presence or absence of the connection part.

Referring to FIG. 22, FIG. 22A illustrates a case in which optical power is observed when the third region of the second conductive semiconductor layer is removed through etching. FIG. 22B illustrates a case in which the optical power is observed after disposing the third region of the second conductive semiconductor layer as in the semiconductor device according to still another embodiment.

Referring to FIG. 22A, it may be seen that, in a case in which the third region is removed, light intensity at an output end O-1 is greater than that in the case of FIG. 22B. It may also be seen that a background S-1 affected by the light generated in the light-emitting part may be brighter than that in the case of FIG. 22B. This is because the current cannot flow through the third region so that the intensity of the light emitted from the light-emitting part is great. As a result, it may be seen that the extinction ratio is decreased.

Referring to FIG. 22B, it may be seen that, in a case in which the third region is disposed, light intensity at an output end O-2 is smaller than that in the case of FIG. 22A. It may also be seen that a background S-2 affected by the light generated in the light-emitting part may be darker than that in the case of FIG. 22A. This is because a portion of the current flowing in the light-emitting part flows to the light modulating part through the third region as described above. As a result, it may be seen that the extinction ratio is increased. Thus, when the third region is disposed, the extinction ratio is increased, so that the semiconductor device having excellent performance may be provided.

Specifically, when the third region of the second conductive semiconductor layer 340 is not removed, a portion of the current generated by applying the voltage to the light-emitting part 5a' may flow from the second conductive semiconductor layer 340 toward the first conductive semiconductor layer 330, and the remaining portion may flow to the light modulating part 5b' through the third region 340c.

Accordingly, when the bias is applied to the light modulating part 5b', the intensity of the light generated in the light-emitting part 5a' in the case (the semiconductor device according to still another embodiment) in which the third region of the second conductive semiconductor layer 340 is not removed may be smaller than that in the case in which the third region of the second conductive semiconductor layer is removed.

As a result, the intensity of the light emitted through the output end (the edge of the active layer 350 in the first direction (the X-axis direction) in the light modulating part 5b') of the light modulating part 5b' in the case (the semiconductor device according to still another embodiment) in which the third region of the second conductive semiconductor layer is not removed is smaller than that in the case in which the third region of the second conductive semiconductor layer is removed.

Accordingly, since the intensity of the light output through the light modulating part 5b' in the case (the semiconductor device according to still another embodiment) in which the third region of the second conductive semiconductor layer 340 is not removed is smaller than that in the case in which the third region of the second conductive semiconductor layer 340 is removed, the minimum value of the intensity of the output light may be decreased to increase the extinction ratio.

With such a configuration, the semiconductor device 300 according to still another embodiment may provide a high extinction ratio. In addition, the distortion of the optical signal of the semiconductor device may be suppressed according to the improvement of the extinction ratio. FIGS. 23A and 23B are photographs taken by observing a light leakage phenomenon depending on the presence or absence of the connection part.

Referring to FIG. 23, FIG. 23A illustrates whether the light is lost or not when the third region of the second conductive semiconductor layer is removed through etching. FIG. 23B illustrates whether the light is lost or not after disposing the third region of the second conductive semiconductor layer as in the semiconductor device according to still another embodiment.

Referring to FIG. 23A, the light leakage phenomenon is observed at the connection part 5c' between the light-emitting part 5a' and the light modulating part 5b'. That is, it may be seen that since the third region does not exist, the light generated in the light-emitting part 5a' is scattered in the connection part 5c' while moving to the light modulating part 5b' along the waveguide layer, resulting in increasing the intensity of light emitted to the outside. Accordingly, the difference in the intensity of the light detected at the output end of the light modulating part 5b' may not be great enough to secure the extinction ratio of the light to be used as the optical signal.

On the other hand, referring to FIG. 23B, the light leakage phenomenon is hardly observed in the connection part 5c'. That is, it may be seen that since the light moving toward the outside from the waveguide layer of the connection part 5c' is incident on the input end of the light modulating part 5b' through the connection part 5c' by disposing the third region, the intensity of the light emitted to the outside is minimized. Accordingly, since the difference in the intensity of the light detected at the output end of the light modulating part 5b' may be assured, the extinction ratio of the light to be used as the optical signal may be sufficiently secured.

FIGS. 24A and 24B illustrate a modified example of FIG. 21, and FIG. 24C is a perspective view of FIG. 24B.

Referring to FIG. 24A, a reflective layer 390 may be disposed on the third region 340c of the second conductive semiconductor layer 340.

The reflective layer 390 may be disposed on the third region 340c of the second conductive semiconductor layer 340, which is disposed between the light-emitting part 5a' and the light modulating part 5b'. The reflective layer 390 may be disposed on the third region 340c of the connection part 5c'.

Further, referring to FIGS. 24B and 24C, the reflective layer 390 may extend to the light-emitting part 5a' and the light modulating part 5b' on the semiconductor structure 320 and may cover the semiconductor structure 320. A phenomenon in which light in the third region 340c of the second conductive semiconductor layer 340 is lost to the outside (a light leakage phenomenon) may be prevented firstly with such a configuration, and secondarily, the reflective layer 390 may prevent the light from being lost to the outside. That is, the reflective layer 390 may further suppress the occurrence of the light leakage phenomenon.

Referring again to FIG. 24A, the reflective layer 390 may be disposed to be spaced apart from the second electrode 383a on the first region 340a. The reflective layer 390 may be disposed to be spaced apart from the third electrode 383b on the second region 340b.

A light loss in the third region 340c may be minimized by disposing the reflective layer 390 on the third region 340c. Specifically, the light may be diffused not only to the active layer 350 but also to a partial region of the periphery thereof.

Here, the light passing through the connection part 5c' may be scattered and lost to the outside due to the discontinuity of refractive indices and the structure between the light-emitting part 5a' and the light modulating part 5b'. Further, the light may be scattered into the third region 340c disposed in the connection part 5c' and lost. Thus, the light scattered to the outside may be minimized by disposing the reflective layer 390 on the connection part 5c'. Accordingly, since distortion of the optical signal viewed from the output end of the light modulating part 5b' may be suppressed, a waveform deterioration phenomenon of the output optical signal may be improved.

As described above, the semiconductor device 300 according to the present invention may minimize the light loss by causing the light to be reflected to the inside thereof due to the reflective layer 390. Further, since optical power may be improved, power consumption may be reduced and lifespan of the light-emitting part 5a' may be improved. Meanwhile, an insulating layer (not shown) may be disposed between the second electrode 383a and the reflective layer 390 so that electrical insulation may be provided therebetween. The insulating layer (not shown) may also be disposed between the third electrode 383b and the reflective layer 390 so that electrical insulation may be provided therebetween. Also, the reflective layer 390 may be a DBR.

<A Semiconductor Device According to a Fourth Embodiment>

FIG. 25 is a top view of a semiconductor device according to yet another embodiment of the present invention, FIG. 26 is a cross-sectional view taken along line B-B' of FIG. 25, FIG. 27 is an enlarged view of portion F''' in FIG. 25, FIGS. 28A and 28B are photographs for describing an effect of the semiconductor device of yet another embodiment, and FIG. 29 is a side view of the semiconductor device according to yet another embodiment.

Referring to FIGS. 25 and 26, a semiconductor device 400 according to yet another embodiment of the present invention includes a semiconductor structure 420 having a light-emitting region P1" and a modulating region P2" disposed in a first direction, an insulating layer 430 disposed on the semiconductor structure 420, a first electrode 441, a second electrode 442, and a third electrode 443.

A substrate 410 may be a transparent substrate, a conductive substrate, or an insulating substrate. For example, the substrate 410 may include at least one of sapphire (Al2O3), SiC, Si, GaAs, GaN, ZnO, GaP, InP, Ge, and Ga2O3, but the present invention is not limited thereto. Uneven portions may be formed on an upper surface of the substrate 410.

The substrate 410 may include a plurality of protruding shapes. A side cross section of each of the plurality of protruding shapes may include at least one of a hemispherical shape, a polygonal shape, and an elliptical shape, and the present invention is not limited to such a shape. The plurality of protruding shapes scatter light incident on the substrate 410 to improve the efficiency of light re-incident on a waveguide layer.

The semiconductor structure 420 may be disposed on the substrate 410.

The semiconductor structure 420 may include a first conductive semiconductor layer 421, a first clad layer 422, an active layer 423, a second clad layer 424, and a second conductive semiconductor layer 425, which are disposed on the substrate 410.

The first conductive semiconductor layer 421 may be disposed on the substrate 410. The first conductive semiconductor layer 421 may be implemented with at least one of Group III-V and Group II-VI compound semiconductors. The first conductive semiconductor layer 421 may be formed of a semiconductor material having a composition formula of, for example, $In_xAl_yGa_{1-x-y}N$ ($0 \leq x \leq 1$, $0 \leq y \leq 1$, $0 \leq x+y \leq 1$).

For example, the first conductive semiconductor layer 421 may include at least one of GaN, AlN, AlGaN, InGaN, InN, InAlGaN, and AlInN. The first conductive semiconductor layer 421 may be an n-type semiconductor layer doped with an n-type dopant such as Si, Ge, Sn, Se, or Te.

The first clad layer 422 may be disposed on the first conductive semiconductor layer 421.

A refractive index of the first clad layer 422 may be lower than that of the active layer 423. In addition, the first clad layer 422 may have a band gap greater than that of the active layer 423. For example, an Al composition of the first clad layer 422 may be greater than an Al composition of the active layer 423. With such a configuration, the first clad layer 422 may reflect the light so that the light generated in the active layer 423 is not transmitted to the first conductive semiconductor layer 421.

The first clad layer 422 may include a semiconductor material having a composition formula of $Al_pGa_{1-p}N$ (0<p<1). The first clad layer 422 may be an n-type semiconductor layer doped with an n-type dopant such as Si, Ge, Sn, Se, or Te, but the present invention is not necessarily limited thereto.

The active layer 423 may be disposed on the first clad layer 422. The active layer 423 is a layer at which electrons (or holes) injected through the first conductive semiconductor layer 421 and holes (or electrons) injected through the second conductive semiconductor layer 425 meet.

The active layer 423 may be implemented with, for example, at least one of Group III-V and Group II-VI compound semiconductors. When the active layer 423 is implemented as a multi-well structure, the active layer 423 may include a plurality of well layers and a plurality of barrier layers, which are alternately disposed, but the present invention is not limited thereto.

The active layer 423 may be formed of a semiconductor material having a composition formula of, for example, InxAlyGa1-x-yN (0≤x≤1, 0≤y≤1, 0≤x+y≤1). The active layer 423 may include at least one of pairs of InGaN/GaN, GaN/AlGaN, AlGaN/AlGaN, InGaN/AlGaN, and InGaN/InGaN.

When the active layer 423 is made of a material that forms a bond such as a hexagonal closed packed (HCP) structure, a band gap of the active layer 423 may be bent by spontaneous polarization, but the present invention is not limited thereto.

The second clad layer 424 may be disposed on the active layer 423. A refractive index of the second clad layer 424 may be lower than that of the active layer 423. In addition, the second clad layer 424 may have a band gap greater than that of the active layer 423. For example, an Al composition of the second clad layer 424 may be greater than an Al composition of the active layer 423. With such a configuration, the second clad layer 424 may reflect the light so that the light generated in the active layer 423 is not transmitted to the second conductive semiconductor layer 425.

The second clad layer 424 may be formed of a semiconductor material having a composition formula of $Al_pGa_{1-p}N$ (0<p<1). The second clad layer 424 may be a p-type semiconductor layer doped with a p-type dopant such as Mg, Zn, Ca, Sr, or Ba.

The second conductive semiconductor layer 425 may be disposed on the second clad layer 424. The second conductive semiconductor layer 425 may be implemented with at least one of Group III-V and Group II-VI compound semiconductors. The second conductive semiconductor layer 425 may be formed of a semiconductor material having a composition formula of, for example, InxAlyGa1-x-yN (0≤x≤1, 0≤y≤1, 0≤x+y≤1).

For example, the second conductive semiconductor layer 425 may include at least one of GaN, AlN, AlGaN, InGaN, InN, InAlGaN, and AlInN. The second conductive semiconductor layer 425 may be a p-type semiconductor layer doped with a p-type dopant such as Mg, Zn, Ca, Sr, or Ba.

The active layer 423 may be disposed between the first conductive semiconductor layer 421 and the second conductive semiconductor layer 425. The light generated in the active layer 423 may be reflected from the first clad layer 422 and the second clad layer 424. Thus, the light generated in the active layer 423 may travel in the first direction (the X-axis direction).

Further, the active layer 423 may extend to one side of the second conductive semiconductor layer 425 so that the light may be emitted toward the one side of the second conductive semiconductor layer 425.

The semiconductor structure 420 may include the light-emitting region P1", an insulating region P3", and the modulating region P2" in the first direction (the X-axis direction).

The light-emitting region P1" may generate light of a certain wavelength band. Here, the light may have a wavelength band of 400 nm to 550 nm.

The light-emitting region P1" may include a first emitting part O1 disposed on one side thereof. The light in the light-emitting region P1" may be emitted through the first emitting part O1. The modulating region P2" may transmit or absorb the light generated in the light-emitting region P1 ".

The modulating region P2" may include a second emitting part O2 disposed on one side thereof and a first incident part I1 disposed on the other side thereof in the first direction. The light may be incident on the modulating region P2" through the first incident part I1. The first incident part I1 may be disposed to face the first emitting part O1 of the light-emitting region P1". The second emitting part O2 is disposed at one side of the second conductive semiconductor layer 425 in the modulating region P2" so that the light may be emitted to the outside.

The modulating region P2" may selectively control the transmission of the light according to an applied voltage. In addition, when the light transmits the modulating region P2", the light may be emitted through the second emitting part O2 of the semiconductor structure 420 in the first direction (the X-axis direction).

That is, the light generated in the active layer 423 of the light-emitting region P1" may travels to the modulating region P2" and may be absorbed in or transmitted through the modulating region P2".

Widths of the first emitting part O1 and the first incident part I1 in a second direction (a Y-axis direction) may be the same. However, the present invention is not limited thereto, and the width of the first emitting part O1 may be smaller than the width of the first incident part I1 to reduce the loss of the light moving to the first incident part I1 through the first emitting part O1.

Here, the width of the first emitting part O1 may be a width of the first conductive semiconductor layer 421, the active layer 423, and the second conductive semiconductor layer 425 disposed in the first emitting part O1. In addition, the width of the first incident part I1 may be a width of the first conductive semiconductor layer 421, the active layer 423, and the second conductive semiconductor layer 425 disposed in the first incident part I1.

The insulating region P3" may be disposed between the light-emitting region P1" and the modulating region P2". The insulating region P3" has a high resistance to electrically isolate the light-emitting region P1" from the insulating region P3". However, since the semiconductor structure 420 may not have the insulating region, the present invention is not limited to such a structure. In addition, the insulating region P3" may include a hole H formed by etching.

Further, the insulating region P3" may be formed with a high resistance by implanting ions into the second conductive semiconductor layer 425. Typically, the ions to be implanted include hydrogen ions (H+), but the present invention is not limited thereto. Further, the insulating region P3" may minimize the electrical interference between the light-emitting region P1" and the modulating region P2".

The insulating layer 430 may be disposed on the semiconductor structure 420. The insulating layer 430 may be formed by being entirely disposed on the semiconductor structure 420 and then partially removed in the manufacturing process. That is, the insulating layer 430 may be disposed to be spaced apart from one side of the second conductive semiconductor layer 425.

The insulating layer 430 may be partially removed to form a through-hole. The semiconductor structure 420 disposed under the insulating layer 430 may be electrically connected to the first electrode 441, the second electrode 442, and the third electrode 443 disposed on the insulating layer 430 through the through-hole.

The insulating layer 430 may be disposed to be spaced apart from one side edge of the second conductive semiconductor layer 425 in the first direction (the X-axis direction). As a result, the edge of the second conductive semiconductor layer 425 in the first direction (the X-axis direction) may be exposed. In addition, an edge of the first conductive semiconductor layer 421 in the first direction (the X-axis direction) may also be exposed. A detailed description thereof will be given with reference to FIG. 27.

The insulating layer 430 may include at least one selected from the group consisting of SiO2, SixOy, Si3N4, SixNy, SiOxNy, AD5O3, TiO2, AlN, and the like.

The insulating layer 430 may be entirely disposed on the insulating region P3". With such a configuration, the insulating layer 430 may block an electrical connection between the light-emitting region P1" and the modulating region P2" in the insulating region P3".

The first electrode 441 may be disposed on the first conductive semiconductor layer 421. In the manufacturing process, the insulating layer 430 may be disposed on the semiconductor structure 420, and then a portion of the insulating layer 430 may be removed, and the first electrode 441 may be disposed on the removed portion. Accordingly, the first electrode 441 may be electrically connected to the first conductive semiconductor layer 421 through the insulating layer 430. The first electrode 441 may function as a common electrode.

The area and shape of the first electrode 441 are not limited and may be varied. In addition, the area in contact with the first conductive semiconductor layer 421 may also be varied. For example, the first electrode 441 may be partially disposed on the first conductive semiconductor layer 421 and may cover the first conductive semiconductor layer 421.

The first electrode 441 may be formed of a TCO film. The TCO film may be formed of a material selected from among an indium tin oxide (ITO), an indium zinc oxide (IZO), an aluminum zinc oxide (AZO), an aluminum gallium zinc oxide (AGZO), an indium zinc tin oxide (IZTO), an indium aluminum zinc oxide (IAZO), an indium gallium zinc oxide (IGZO), an indium gallium tin oxide (IGTO), an antimony tin oxide (ATO), a gallium zinc oxide (GZO), an IZO nitride (IZON), ZnO, IrOx, RuOx, NiO, and the like.

Also, the first electrode 441 may be formed of an opaque metal, such as Ag, Ni, Al, Rh, Pd, Ir, Ru, Mg, Zn, Pt, Au, and Hf, and may be configured with one or a plurality of layers made of a mixture of a TCO film and an opaque metal, but the present invention is not limited thereto.

The second electrode 442 may be disposed on the second conductive semiconductor layer 425 of the light-emitting region P1". Hereinafter, the second conductive semiconductor layer 425 of the light-emitting region P1" will be referred to as a second-first conductive semiconductor layer 425a.

In the manufacturing process, the insulating layer 430 may be disposed on the semiconductor structure 420, and then a portion of the insulating layer 430 may be removed, and the second electrode 442 may be disposed on the removed portion. Accordingly, the second electrode 442 may be electrically connected to the second-first conductive semiconductor layer 425a through the insulating layer 430.

Power may be applied to the second electrode 442. When the power is applied through the second electrode 442, a current may flow through the second-first conductive semiconductor layer 425a, the active layer 423, and the first conductive semiconductor layer 421, and the light may be generated in the active layer 423. The second electrode 442 may be partially disposed on the insulating region P3", but the present invention is not limited to such a structure.

The third electrode 443 may be disposed on the second conductive semiconductor layer 425 of the modulating region P2". Hereinafter, the second conductive semiconductor layer 425 of the light modulating region P2" will be referred to as a second-second conductive semiconductor layer 425b.

In the manufacturing process, the insulating layer 430 may be disposed on the semiconductor structure 420, and then a portion of the insulating layer 430 may be removed, and the third electrode 443 may be disposed on the removed portion. Accordingly, the third electrode 443 may be electrically connected to the second-second conductive semiconductor layer 425b through the insulating layer 430. The power may be applied to the third electrode 443. When the power is applied through the third electrode 443, a current may flow through the second-second conductive semiconductor layer 425b, the active layer 423, and the first conductive semiconductor layer 421, and the light may be absorbed in the active layer 423.

A reverse bias may be applied to the third electrode 443. When the reverse bias is applied to the modulating region P2" through the third electrode 443, the light may be transmitted through the active layer 423 of the modulating region P2". As a result, the light may be emitted through the outermost side surface of the semiconductor structure 420 in the first direction.

Alternatively, when the reverse bias power is not applied to the modulating region P2" through the third electrode 443, the light may be absorbed in the active layer 423 of the modulating region P2".

Electrode pads (not shown) may be disposed on the first electrode 441, the second electrode 442, and the third electrode 443. The electrode pad (not shown) may include Ag, Ni, Al, Rh, Pd, Ir, Ru, Mg, Zn, Pt, Au, Hf, Au, Cr, or the like, but the present invention is not limited to such a material.

Since constant power is applied to the first electrode 441 and the second electrode 442, no parasitic capacitance may exist, and when variable power is applied to the third electrode 443, a parasitic capacitance may exist. With such a configuration, the third electrode 443 may have a smaller area than the first electrode 441 and the second electrode 442.

Further, a dummy electrode (not shown) may be disposed on the insulating layer 430. The dummy electrode (not shown) may prevent the light from emitting above the semiconductor structure 420.

Referring to FIG. 27, the insulating layer 430 may be disposed to be spaced apart from an edge of the semiconductor structure 420 in the first direction (the X-axis direction). The insulating layer 430 may not be formed on the edge of the semiconductor structure 420 in the first direction (the X-axis direction). In the manufacturing process, the insulating layer 430 may be formed on the semiconductor structure 420, and then a portion of the insulating layer 430 disposed on the edge of the semiconductor structure 420 in the first direction may be removed.

When the insulating layer 430 covers the edge of the semiconductor structure 420 in the first direction, a portion of the semiconductor structure 420 may be torn while the semiconductor device 400 is separated through a cutting process in the manufacturing process due to the bonding between the insulating layer 430 and the semiconductor structure 420.

As a result, an outer surface of the second emitting part of the modulating region in the semiconductor structure 420 may be uneven to increase roughness. Further, the roughness is easily cracked by an impact, so that the reliability of the semiconductor device may be deteriorated. Further, the light emitted through the outermost side surface of the semiconductor structure 420 in the first direction (the X-axis direction) may be spread due to the cracks of the second-second conductive semiconductor layer 425b.

Accordingly, the insulating layer 430 may be disposed to be spaced apart from the edge of the second conductive semiconductor layer 425 in the first direction such that the insulating layer 430 may not cover to the edge of the semiconductor structure 420 in the first direction. As a result, it is possible to prevent the problem that the roughness of the second emitting part increases during the separation process in the manufacturing process due to the bonding between the protrusion part E and an upper surface of the semiconductor structure 420 in the manufacturing process.

Further, the light emitted through the second emitting part, which is the outermost side surface of the semiconductor structure 420, in the first direction (the X-axis direction) does not spread. Thus, the light is transmitted to an optical fiber connected to the outermost side surface of the semiconductor structure 420, and optical communication using the semiconductor structure 420 may be performed without error.

Further, the insulating layer 430 may include a protrusion part E protruding in the first direction. The protrusion part E may cover the second-second conductive semiconductor layer 425b to protect the second-second conductive semiconductor layer 425b from the outside. As a result, the reliability of the semiconductor device of the embodiment may be improved.

In addition, the protrusion part E as a portion of the insulating layer 430 may reflect the light, which is provided to the modulating region P2" through the light-emitting region P1" and the insulating region P3", to prevent the light from being emitted to the outside of the semiconductor structure 420, so that light loss may be prevented.

Further, the protrusion part E may indicate the direction in which the light is emitted through the modulating region P2" and the position of the second emitting part O2 to clearly provide a direction and a position in which the optical fiber to which the emitted light is transmitted is disposed.

A length D4 of the protrusion part E may be in a range of 14 μm to 24 μm. Hereinafter, the length is described as a distance in the first direction. However, since the protrusion part E is disposed to be still spaced apart from an edge of the second-second conductive semiconductor layer 425b in the first direction, a portion of the second-second conductive semiconductor layer 425b disposed on the first direction side of the protrusion part E may be exposed. That is, a length of the exposed surface of the second-second conductive semiconductor layer 425b in the first direction (the X-axis direction) may be equal to a length in which the insulating layer 430 is spaced apart from one side of the second-second conductive semiconductor layer 425b.

A length D5 of the exposed surface of the second-second conductive semiconductor layer 425b may be in a range of 30 μm to 50 μm. When the length D5 of the exposed surface of the second-second conductive semiconductor layer 425b is less than 30 μm, the adjacent insulating layer 430 may be broken in the process, so that the reliability may be deteriorated.

In addition, when the length D5 of the exposed surface of the second-second conductive semiconductor layer 425b in the first direction is greater than 50 μm, there is a limitation that the light emitted in the first direction through the active layer 423 of the modulating region P2" scatters onto the semiconductor structure 420.

Also, a portion of the first conductive semiconductor layer 421 disposed from the exposed surface of the second-second conductive semiconductor layer 425b in the second direction (the Y-axis direction) may be exposed. As a result, the insulating layer 430 may be disposed to be spaced apart from the edge of the first conductive semiconductor layer 421 in the first direction. With such a configuration, a portion of the semiconductor structure 420 may be prevented from being be torn while the semiconductor device 400 is separated through the cutting process in the manufacturing process due to the bonding between the insulating layer 430 and the semiconductor structure 420. Thus, the reliability of the semiconductor device 400 may be improved, and the light may be emitted without scattering.

A length ratio of the length D4 of the protrusion part E to the length D5 of the exposed portion of the second-second conductive semiconductor layer 425b may be in a range of 1:5/4 to 1:25/7. With such a configuration, the light transmitted through the modulating region P2" may be emitted to the second emitting part O2 in a state in which loss and scattering are minimized. Thus, the light transmitted through the modulating region P2" may be provided to the optical fiber connected to a rear end of the semiconductor device 400 with minimized noise.

When the length ratio of the length D4 of the protrusion part E to the length D5 of the exposed portion of the second-second conductive semiconductor layer 425b is less than 1:5/4, there is a limitation that the light is lost above the semiconductor structure 420 through the modulating region P2", and the light is scattered to the second emitting part O2.

When the length ratio of the length D4 of the protrusion part E to the length D5 of the exposed portion of the second-second conductive semiconductor layer 425b is greater than 1:25/7, the light may be lost through an upper surface of the semiconductor structure 420 in the modulating region P2", and there is a limitation on the etching method for forming the protrusion part E. Referring to FIG. 28, FIG. 28A is a photograph of the edge of the semiconductor structure taken in the first direction in FIG. 27, and FIG. 28B is a photograph of the edge of the semiconductor structure taken in the first direction when the insulating layer covers the edge of the semiconductor structure in the first direction.

As in FIG. 28A, when the insulating layer 430 does not cover up to the edge of the semiconductor structure 420, as described above, an upper surface of the edge of the second-second conductive semiconductor layer in the first direction (the X-axis direction) is flat. Further, the surface of the second-second conductive semiconductor layer, through which the light is emitted, is also flat. As a result, the emitted light does not spread. Here, the upper surface of the second-second conductive semiconductor layer may be the upper surface of the semiconductor structure 420.

In the case of FIG. 28B, when the insulating layer 430 covers up to the edge of the semiconductor structure 420' in the first direction (the X-axis direction), the upper surface of the edge of the semiconductor structure 420' may be bonded to the insulating layer 430'. When the semiconductor device is separated by the cutting process, the surface of the second-second conductive semiconductor layer, through which the light is emitted, is not flat to increase the roughness due to the bonding between the insulating layer 430' and the upper surface of the edge of the semiconductor structure 420'. Thus, the light emitted through the semiconductor structure 420' is spread, so that some of the light may not be provided to the optical fiber.

Referring again to FIG. 27, a width W4 of an upper surface of the exposed portion of the second-second conductive semiconductor layer 425b is in a range of 8 μm to 12 μm. In order to form the width W4 of the upper surface of the exposed portion of the second-second conductive semiconductor layer 425b to be smaller than 8 μm, there is a process limit. When the width W4 of the upper surface of the exposed portion of the second-second conductive semiconductor layer 425b is greater than 12 μm, a dielectric constant may be increased to decrease a cutoff frequency in communication. As a result, there is a limitation that a communication speed is decreased. Here, the width may be a length in the second direction (the Y-axis direction).

In addition, a width W5 of the protrusion part E may be in a range of 16 μm to 24 μm.

Referring to FIG. 29, the semiconductor structure 420 may have a '凸' shape but may be formed in various shapes depending on the etching, so the present invention is not limited thereto. The insulating layer 430 may be disposed on the semiconductor structure 420.

In addition, the first electrode 441, the second electrode 442, and the third electrode 443 may be disposed on the insulating layer 430. The first electrode 441, the second electrode 442, and the third electrode 443 may be sequentially disposed in the second direction. However, the present invention is not limited to such an arrangement order.

The first electrode 441 may be disposed further downward than the second electrode 442 and the third electrode 443. Further, the width of the second electrode 442 may be greater the width of the third electrode 443.

In addition, as described above, variable power may be applied to the third electrode 443 so that parasitic capacitance may exist. Accordingly, the area of the third electrode 443 may be smaller than those of the first electrode 441 and the second electrode 442. FIGS. 30A to 30E are views illustrating a method of manufacturing the semiconductor device according to yet another embodiment of the present invention.

Referring to FIG. 30A, a semiconductor structure 420 may be grown on a substrate 410. The substrate 410 may be a GaAs substrate 410.

In addition, a first conductive semiconductor layer 421 may be formed on the substrate 410. A buffer layer may be formed on the first conductive semiconductor layer 421 and the substrate 410, but the present invention is not limited thereto. The first conductive semiconductor layer 421 may have a thickness of 0.6 μm to 0.75 μm. Here, the thickness may be a length in a third direction (a Z-axis direction). However, the present invention is not limited to such a thickness, and the thickness may be variously applied depending on the size of the semiconductor device.

The first conductive semiconductor layer 421 may be formed of a semiconductor material having a composition formula of $In_xAl_yGa_{1-x-y}N$ ($0 \leq x \leq 1$, $0 \leq y \leq 1$, $0 \leq x+y \leq 1$).

A first clad layer 422 may be formed on the first conductive semiconductor layer 421. The first clad layer 422 may be an n-type semiconductor layer doped with an n-type dopant and may be formed of a semiconductor material having a composition formula of $Al_pGa_{1-p}N$ ($0<p<1$). Further, the first clad layer 422 may have a thickness of 1 μm to 1.2 μm. However, the present invention is not limited to such a thickness, and the thickness may be variously applied depending on the size of the semiconductor device.

An active layer 423 may be formed on the first clad layer 422. The active layer 423 may be formed of a semiconductor material having a composition formula of $In_xAl_yGa_{1-x-y}N$ ($0 \leq x \leq 1$, $0 \leq y \leq 1$, $0 \leq x+y \leq 1$).

A first guide layer (not shown) may be further formed between the active layer 423 and the first clad layer 422. The first guide layer (not shown) may be formed of a semiconductor material having a composition formula of $In_xAl_yGa_{1-x-y}N$ ($0 \leq x \leq 1$, $0 \leq y \leq 1$, $0 \leq x+y \leq 1$). For example, the first guide layer (not shown) may include at least one of GaN, AlN, AlGaN, InGaN, InN, InAlGaN, and AlInN. The first guide layer (not shown) may be GaN or an n-type semiconductor layer doped with an n-type dopant such as Si, Ge, Sn, Se, or Te.

A refractive index of the first guide layer (not shown) may be different from a refractive index of the first clad layer 422. The refractive index of the first guide layer (not shown) may be greater than the refractive index of the first clad layer 422. Thus, the first guide layer (not shown) may reflect light generated in the active layer 423. Accordingly, the light generated in the active layer 423 may travel in a first direction.

The active layer 423 may have a thickness of 0.027 μm to 0.033 μm. However, the present invention is not limited to such a thickness, and the thickness may be variously applied depending on the size of the semiconductor device.

A second clad layer 424 may be formed on the active layer 423. The second clad layer 424 may be formed of a semiconductor material having a composition formula of $Al_pGa_{1-p}N$ ($0<p<1$).

A second guide layer (not shown) may be further formed between the second clad layer 424 and the active layer 423. The second guide layer (not shown) may be formed of a semiconductor material having a composition formula of $In_xAl_yGa_{1-x-y}N$ ($0 \leq x \leq 1$, $0 \leq y \leq 1$, $0 \leq x+y \leq 1$). For example, the second guide layer (not shown) may include at least one of GaN, AlN, AlGaN, InGaN, InN, InAlGaN, and AlInN. The second guide layer (not shown) may be GaN or a p-type semiconductor layer doped with a p-type dopant such as Mg, Zn, Ca, Sr, or Ba.

A refractive index of the second guide layer (not shown) may be different from a refractive index of the second clad layer 424. The refractive index of the second guide layer (not shown) may be greater than the refractive index of the second clad layer 424. Thus, the second guide layer (not shown) may reflect the light generated in the active layer 423. Thus, the light generated in the active layer 423 may travel in the first direction.

The second clad layer 424 may have a thickness of 0.45 μm to 0.55 μm. However, the present invention is not limited to such a thickness, and the thickness may be variously applied depending on the size of the semiconductor device.

A second conductive semiconductor layer 425 may be formed on the second clad layer 424. The second conductive semiconductor layer 425 may have a thickness of 16 μm to 24 μm. However, the present invention is not limited to such a thickness, and the thickness may be variously applied depending on the size of the semiconductor device.

The second conductive semiconductor layer 425 may be formed of a semiconductor material having a composition formula of, for example, InxAlyGa1-x-yN (0≤x≤1, 0≤y≤1, 0≤x+y≤1).

Referring to FIG. 30B, a first etching may be performed to an upper surface of the active layer 423 to form an insulating region. The second conductive semiconductor layer 425 may be electrically separated into a second-first conductive semiconductor layer 425a and a second-second conductive semiconductor layer 425b through the first etching. The second clad layer 424 may also be separated into a second-first clad layer 424a and a second-second clad layer 424b. A hole H formed by the first etching may have various thicknesses so that the insulating region has a certain resistance or more. However, a portion of the second conductive semiconductor layer 425 may remain in the insulating region due to a manufacturing method.

Referring to FIG. 30C, an insulating layer 430 may be formed on an upper surface of the semiconductor structure 420. The insulating layer 430 may be formed of at least one selected from the group consisting of SiO2, SixOy, Si3N4, SixNy, SiOxNy, AD5O3, TiO2, AlN, and the like.

Referring to FIG. 30D, a portion of the insulating layer 430 on the second-first conductive semiconductor layer 425a may be removed. Further, a portion of the insulating layer 430 on the second-second conductive semiconductor layer 425b may also be removed. Here, a portion of the insulating layer 430 disposed on an upper surface of an edge of the second-second conductive semiconductor layer 425b in the first direction may be removed so that the insulating layer 430 is disposed to be spaced apart from the edge of the second-second conductive semiconductor layer 425b in the first direction. As a result, the edge of the second-second conductive semiconductor layer 425b may be exposed.

Further, although not shown in FIG. 30D, a portion of the insulating layer 430 on the first conductive semiconductor layer 421 may be removed so that the first conductive semiconductor layer 421 is electrically connected to a first electrode 441.

Referring to FIG. 30E, a second electrode 442 may be disposed on the second-first conductive semiconductor layer 425a so as to cover a portion where the insulating layer 430 is not present. Thus, the second electrode 442 may be electrically connected to the second-first conductive semiconductor layer 425a.

Likewise, a third electrode 443 may be disposed on the second-second conductive semiconductor layer 425b so as to cover a portion where the insulating layer 430 is not present. Thus, the third electrode 443 may be electrically connected to the second-second conductive semiconductor layer 425b.

Although not shown in FIG. 30E, the first electrode 441 may be disposed on the first conductive semiconductor layer 421 so as to cover a portion where the insulating layer 430 is not present. Thus, the first electrode 441 may be electrically connected to the first conductive semiconductor layer 421.

FIGS. 31A to 31D are top views illustrating a method of manufacturing the semiconductor device according to yet another embodiment of the present invention.

Referring to FIG. 31A, the semiconductor structure 420 is grown on the substrate 410, and then a partial region of the semiconductor structure 420 is etched to the upper surface of the active layer 423 in the first direction by the first etching to form the hole H of the insulating region. The active layer 423 and the second conductive semiconductor layer 425 may be partially exposed by the first etching.

In addition, a partial region of the semiconductor structure 420 may be etched to an upper surface of the first conductive semiconductor layer 421 by a second etching. The first conductive semiconductor layer 421 may be exposed by the second etching.

However, regardless of the order, the first etching (etching to the upper surface of the active layer 423 to form the hole H of the insulating region) may be performed after the second etching (etching to the upper surface of the first conductive semiconductor layer 421) is performed.

Further, a scribe line on a wafer (not shown) may partition a plurality of semiconductor devices. The scribe line may be a portion on which a beam is irradiated to separate the semiconductor devices in a subsequent process. When the beam is irradiated along the scribe line, the plurality of semiconductor devices on the wafer (not shown) may be separated from each other.

Referring to FIG. 31B, the insulating layer 430 may be formed on the semiconductor structure 420 after the first etching and the second etching. The insulating layer 430 may be formed on the entire upper surface of the semiconductor structure 420.

Referring to FIG. 31C, a portion of the insulating layer 430 may be removed. Hereinafter, one semiconductor device C will be described as a reference. The insulating layer 430 disposed on the first conductive semiconductor layer 421 may be partially removed so that the first conductive semiconductor layer 421 may be partially exposed.

The insulating layer 430 disposed on the second-first conductive semiconductor layer 425a may be partially removed so that the second-first conductive semiconductor layer 425a may be partially exposed. Likewise, the insulating layer 430 disposed on the second-second conductive semiconductor layer 425b may be partially removed so that the second-second conductive semiconductor layer 425b may be partially exposed.

In addition, the insulating layer 430 disposed at an outer periphery of one semiconductor device C may be removed. Accordingly, the insulating layer 430 may be disposed to be spaced apart from an edge of the semiconductor device.

A portion of the insulating layer 430 may be removed to partially protrude from an upper surface of the second-second conductive semiconductor layer 425b in the first direction. Accordingly, the insulating layer 430 may include a protrusion part that partially protrudes in the first direction (the X-axis direction).

Referring to FIG. 31D, the first electrode 441 may be disposed to cover the exposed portion of the first conductive semiconductor layer 421. The first electrode 441 may be in contact with the first conductive semiconductor layer 421.

In addition, the second electrode 442 may be disposed so as to cover the exposed portion of the second-first conductive semiconductor layer 425a. The second electrode 442 may be in contact with the second-first conductive semiconductor layer 425a.

The third electrode 443 may be disposed so as to cover the exposed portion of the second-second conductive semiconductor layer 425b. The third electrode 443 may be in contact with the second-second conductive semiconductor layer 425b.

The second electrode 442 may be formed to have a smaller area than the first electrode 441 and the third electrode 443. Further, the first electrode 441, the second electrode 442, and the third electrode 443 may have various shapes.

Then, a beam is irradiated along scribe lines S1 to S4 for partitioning the plurality of semiconductor devices to perform a cutting process. The beam may be a laser.

When the laser is irradiated along the scribe line, the plurality of semiconductor devices on the wafer (not shown) may be separated from each other. A cutting process may be performed in the semiconductor device C such that only an edge of the first conductive semiconductor layer 421 of the semiconductor device in the first direction (the X-axis direction) is exposed.

FIG. 32 is a top view of the semiconductor device according to yet another embodiment of the present invention.

Referring to FIG. 32, in FIG. 31D, a cutting process may be performed in the semiconductor device C such that each edge of the first conductive semiconductor layer of the semiconductor device is exposed. Accordingly, the insulating layer may be disposed to be spaced apart from the edge of the semiconductor device.

With such a configuration, since cracks, which may occur on a surface through which the light is emitted during the cutting process on the upper surface of the semiconductor device and the second-second conductive semiconductor layer due to the bonding between the insulating layer and the semiconductor device, are prevented, reliability of the semiconductor device may be improved.

<Conceptual Diagram of an Optical Communication Module According to the Embodiments>

FIG. 33 is a conceptual diagram of an optical transmission module according to embodiments of the present invention.

Referring to FIG. 33, an optical transmission module 5 according to the present invention may include a semiconductor device 100, 200, 300, or 400, a lens module 13, and an output waveguide 15.

The semiconductor device 100, 200, 300, or 400 may include the structures described above.

The lens module 13 may be disposed between the semiconductor device 100, 200, 300, or 400 and the output waveguide 15. The lens module 13 may include a function of providing optical signals provided from the semiconductor device 100, 200, 300, or 400 to the output waveguide 15.

The output waveguide 15 may output the optical signals provided through the lens module 13 to the outside. The output waveguide 15 may include a clad and a core, which may be disposed in parallel with the lens module 13 and the semiconductor device 100, 200, 300, or 400 in a vertical direction.

The optical transmission module 5 may include a first cover part 11A, a second cover part 11B, and a third cover part 11C. The first, second, and third cover parts 11A, 11B, and 11C may cover the semiconductor device 100, 200, 300, or 400, the lens module 13, and the output waveguide 15, but the present invention is not limited thereto.

The semiconductor device according to the present invention may be used for 10 Gbps high-speed optical communication at a distance of 100 m or less, for example, for a short distance high-speed optical communication for a home network, an automobile, or the like. Further, the semiconductor device according to the present invention may reduce the manufacturing cost of a general laser diode (light-emitting part) and improve alignment reliability between the laser diode and a light modulator (light modulating part).

While the embodiments have been mainly described, they are only examples but do not limit the present invention, and it may be known to those skilled in the art that various modifications and applications, which have not been described above, may be made without departing from the essential properties of the embodiments. For example, elements described in the embodiments above in detail may be modified and implemented. It should be construed that differences related to such a variation and application are included in the scope of the present invention defined in the following claims.

The invention claimed is:

1. A semiconductor device comprising:
a first conductive semiconductor layer;
a first clad layer disposed on the first conductive semiconductor layer;
a waveguide layer disposed on the first clad layer;
a second clad layer disposed on the waveguide layer; and
a second conductive semiconductor layer disposed on the second clad layer,
wherein the waveguide layer includes an active layer having a plurality of well layers and a plurality of barrier layers, and an absorbing layer disposed between the first clad layer and the active layer, and
the absorbing layer absorbs light of some wavelengths of a first light generated in the active layer.

2. The semiconductor device of claim 1, wherein the active layer is disposed on a partial region of the first conductive semiconductor layer.

3. The semiconductor device of claim 1, wherein an absorption wavelength band of the absorbing layer is smaller than a wavelength of an emission peak of the first light.

4. The semiconductor device of claim 1, wherein an intersecting point X1 between an absorption spectrum of the absorbing layer and an emission spectrum of the first light satisfies the following relational expression, $$\text{wavelength of emission peak} - \text{full width at half maximum (FWHM)} \leq X1 < \text{emission peak of emission peak} \quad \text{[Relational Expression 1]}$$

wherein the emission peak is the emission peak of the first light, and the FWHM is the FWHM of the first light.

5. The semiconductor device of claim 1, wherein an indium composition of the absorbing layer is 80% to 95% of an indium composition of the well layer.

6. The semiconductor device of claim 1, wherein a thickness of the absorbing layer is 95% to 105% of a thickness of the well layer.

7. The semiconductor device of claim 1, comprising:
a first electrode disposed on the first conductive semiconductor layer;
a second-first electrode disposed on the second conductive semiconductor layer; and
a second-second electrode disposed on the second conductive semiconductor layer,
wherein the second-first electrode and the second-second electrode are disposed to be spaced apart from each other on the second conductive semiconductor layer, and
the active layer absorbs the first light when a reverse bias voltage is applied.

8. The semiconductor device of claim 1, wherein the absorbing layer includes a first layer and a second layer which are repeatedly laminated,
an indium composition of the first layer is 80% to 95% of an indium composition of the well layer, and
a thickness of the second layer closest to the active layer among a plurality of second layers is greater than a thickness of the remaining second layers.

9. The semiconductor device of claim 8, wherein the thickness of the second layer closest to the active layer is in a range of 60 Å to 200 Å.

10. The semiconductor device of claim 8, wherein the second layer includes a dopant, a doping concentration of the second layer is in a range of $1\times10^{17}/cm^3$ to $1\times10^{19}/cm^3$.

11. The semiconductor device of claim 8, wherein the waveguide layer includes a superlattice layer disposed between the absorbing layer and the first clad layer,
the superlattice layer includes a plurality of first lattice layers and a plurality of second lattice layers, and
the first lattice layer includes indium.

12. The semiconductor device of claim 11, wherein a difference in indium composition between the first layer and the first lattice layer is greater than a difference in indium composition between the well layer and the first layer.

13. The semiconductor device of claim 1, further comprising:
a first electrode disposed on the first conductive semiconductor layer;
a second-first electrode disposed on the second conductive semiconductor layer; and
a second-second electrode disposed on the second conductive semiconductor layer to be spaced apart from the second-first electrode,
wherein a thickness of the second conductive semiconductor layer, which is between the second-first electrode and the second-second electrode, is smaller than a thickness of the second conductive semiconductor layer, which vertically overlaps the second-first electrode and the second-second electrode.

14. The semiconductor device of claim 13, wherein the second conductive semiconductor layer includes:
a second conductive type first semiconductor layer on which the second-first electrode is disposed;
a second conductive type second semiconductor layer on which the second-second electrode is disposed;
a second conductive type third semiconductor layer disposed between the second conductive type first semiconductor layer and the second conductive type second semiconductor layer; and
a reflective layer disposed on the second conductive type third semiconductor layer,
wherein the reflective layer is disposed to partially cover the second-first electrode and the second-second electrode.

15. The semiconductor device of claim 13, wherein the second-second electrode includes a first region which is facing the second-first electrode and closest to the second-first electrode,
the second-first electrode includes a second region which is facing the second-second electrode and closest to the second-second electrode,
a width W1 of the first region and a width W2 of the second region have a relationship of W1≥W2, and
the width W2 of the second region is at least 0.1 times the width W1 of the first region.

16. The semiconductor device of claim 15, wherein the second-first electrode further includes a third region disposed at an opposite end of the second region, and
a width W3 of the third region and the width W1 of the first region have a relationship of W3≥W1.

17. The semiconductor device of claim 16, wherein the width W3 of the third region is 2 to 50 times the width W2 of the second region.

18. The semiconductor device of claim 15, wherein the second-first electrode and the second-second electrode are spaced apart from each other in a first direction.

19. The semiconductor device of claim 18, wherein the width W1 and the width W2 are lengths in a second direction perpendicular to the first direction.

20. The semiconductor device of claim 19, wherein the first conductive semiconductor layer, the active layer, and the second conductive semiconductor layer of the semiconductor structure are disposed in a third direction, and
the third direction is perpendicular to the second direction.

* * * * *